United States Patent [19]

Haas et al.

[11] 4,207,687
[45] Jun. 17, 1980

[54] SIMULATOR COMPLEX DATA TRANSMISSION METHOD AND SYSTEM

[75] Inventors: Robert N. Haas, Binghamton; Carl A. Mazzini, Windsor, both of N.Y.

[73] Assignee: The Singer Company, Binghamton, N.Y.

[21] Appl. No.: 795,320

[22] Filed: May 9, 1977

[51] Int. Cl.² .............................................. G09B 9/08
[52] U.S. Cl. .................................. 35/12 R; 35/12 P; 364/200
[58] Field of Search .............. 35/8 R, 10, 11 R, 11 A, 35/12 R, 12 W, 12 P, 12 S, 12 N, 12 F, 12 D, 12 T, 13, 48 R; 163/146.1 C; 364/419, 200 MS File, 808, 900 MS File

[56] References Cited

U.S. PATENT DOCUMENTS

| | | | |
|---|---|---|---|
| 3,456,363 | 7/1969 | Boxley | 35/10 X |
| 3,588,831 | 6/1971 | Figueroa | 364/200 |
| 3,715,725 | 2/1973 | Kievit et al. | 340/163 |
| 3,848,230 | 11/1974 | Rehm et al. | 340/163 |
| 3,886,334 | 5/1975 | Cummings et al. | 35/12 W X |
| 3,997,878 | 12/1976 | Hirvela | 364/200 |
| 4,027,301 | 5/1977 | Mayer | 340/163 X |
| 4,027,403 | 6/1977 | Marsh et al. | 35/12 P X |

FOREIGN PATENT DOCUMENTS 1422697  1/1976  United Kingdom ............ 35/12 R

Primary Examiner—Vance Y. Hum
Attorney, Agent, or Firm—James C. Kesterson; J. Dennis Moore; Jeff Rothenberg

[57] ABSTRACT

In complex systems which involve a large amount of interacting electronic equipment, the amount of interconnecting cabling and the attending cross-talk, electromechanical interference and other types of noise pickup become so significant that great expense and skill is required to design a system with satisfactory performance. The system of this invention includes new techniques for data exchange between components of such a complex system with the result that the cross-talk and interference problems are substantially eliminated, while at the same time, the amount of cabling required is reduced to a single communication path which includes only seven conductor pairs. The new system includes a master controller for converting parallel digital data from a computer to serial digital data which is transmitted to the using device through the communication path where it is then converted to a form suitable for the using device. The system also includes peripheral control devices for converting data received in various forms from the using device into serial digital format for transmission to the master controller where it is then converted to a form suitable for the computer.

18 Claims, 74 Drawing Figures

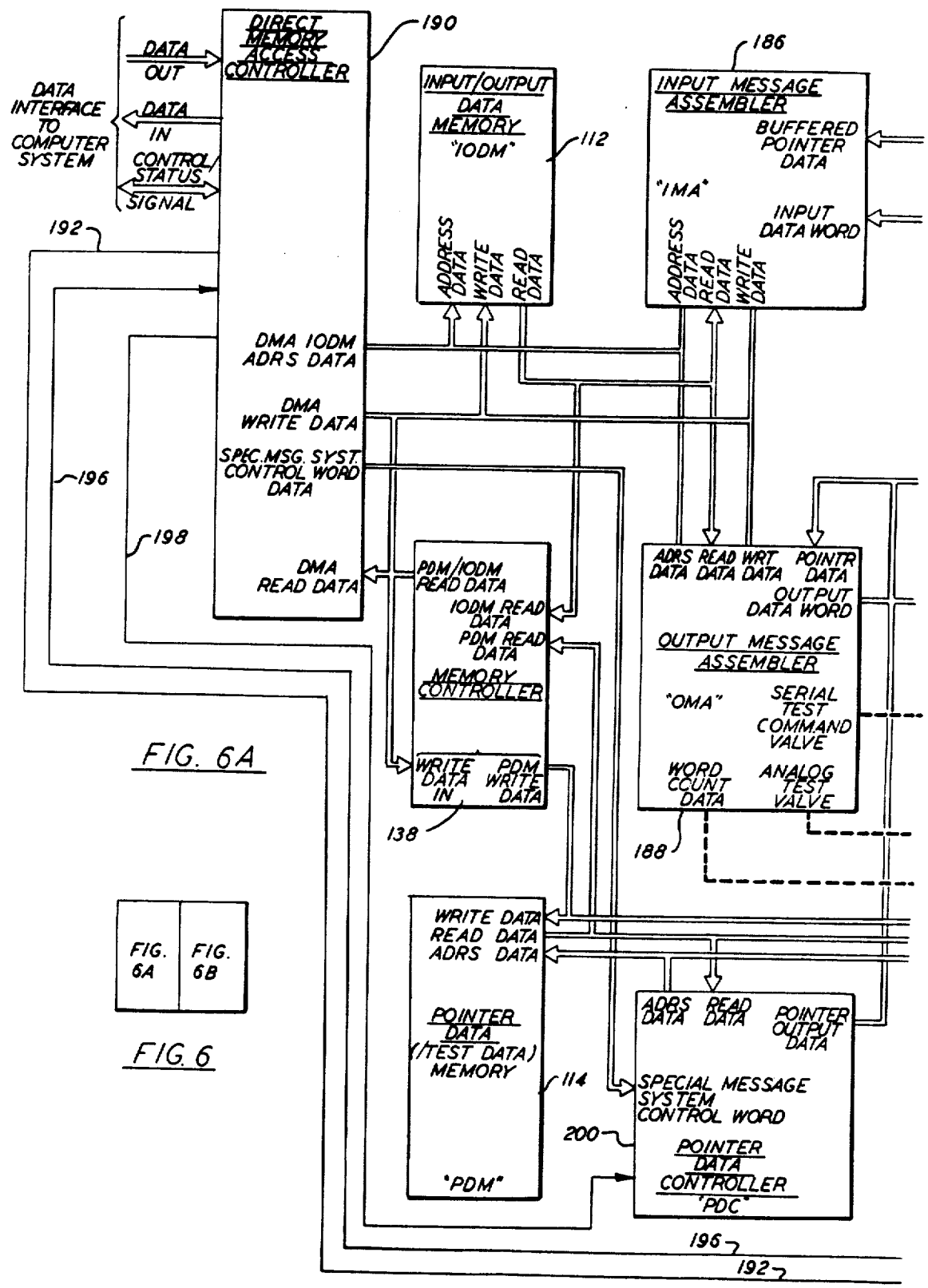

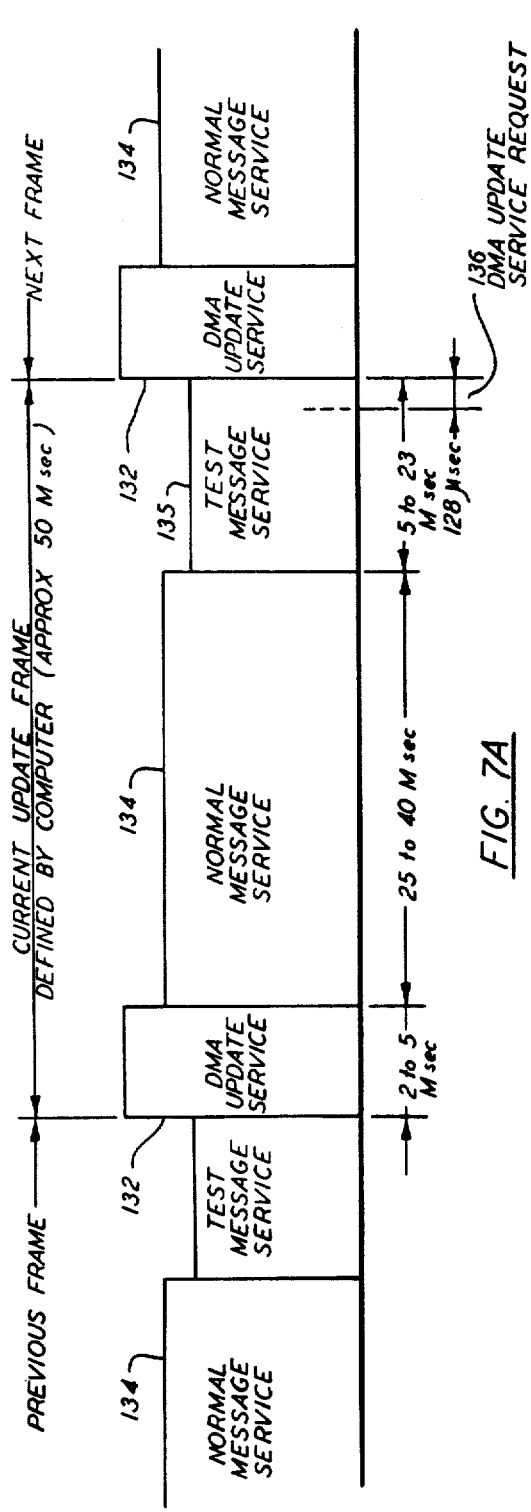
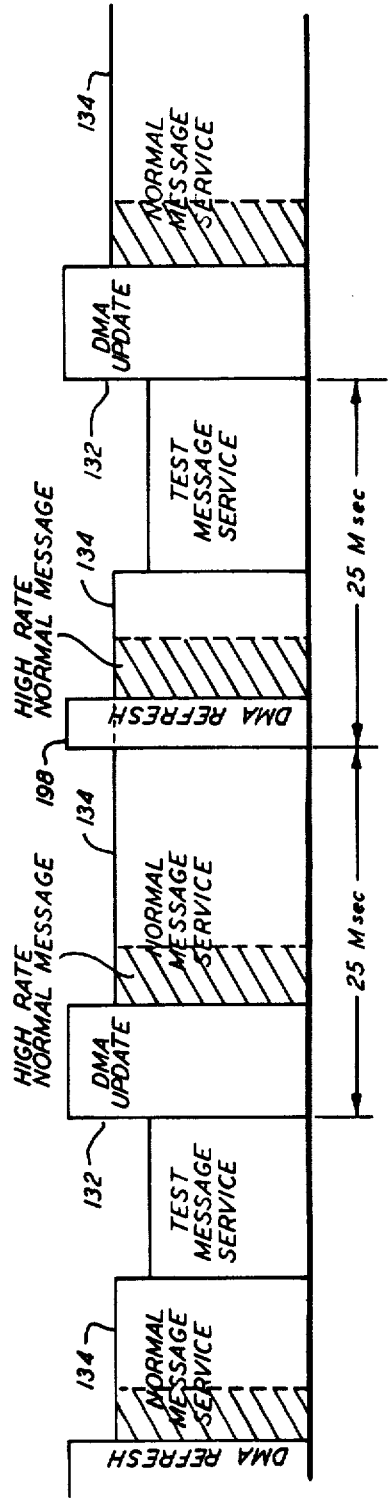
FIG. 7A
FIG. 7B

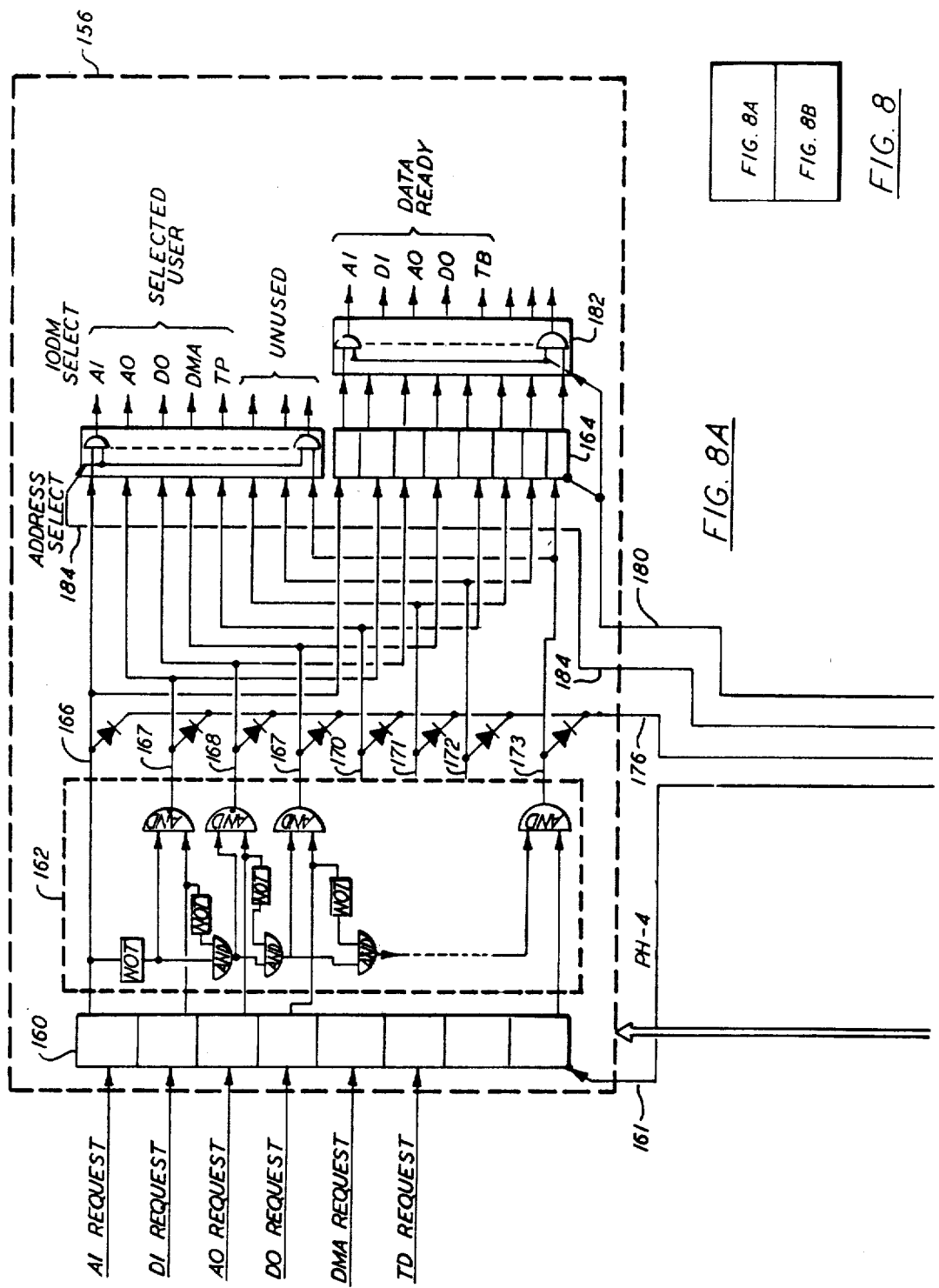

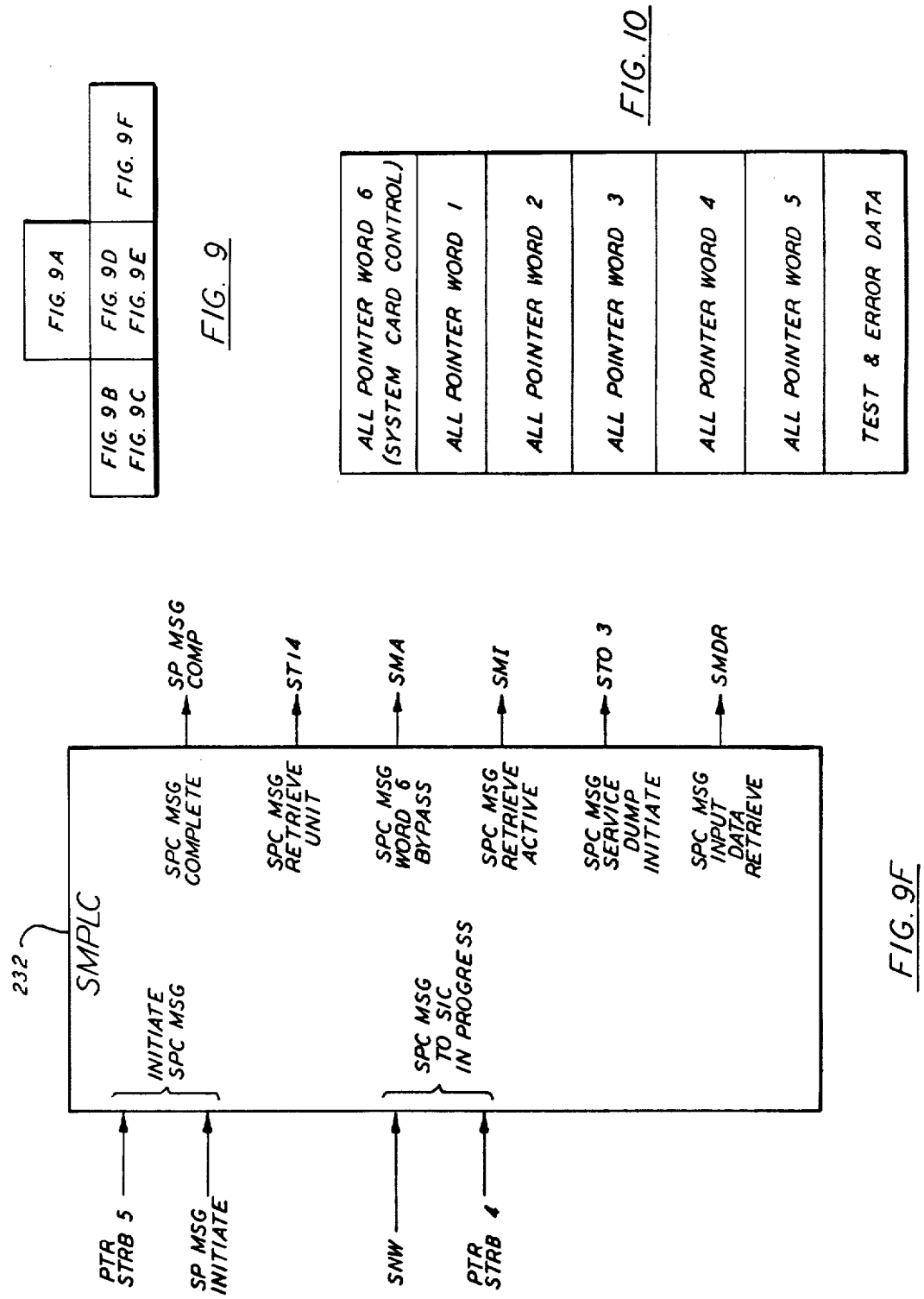

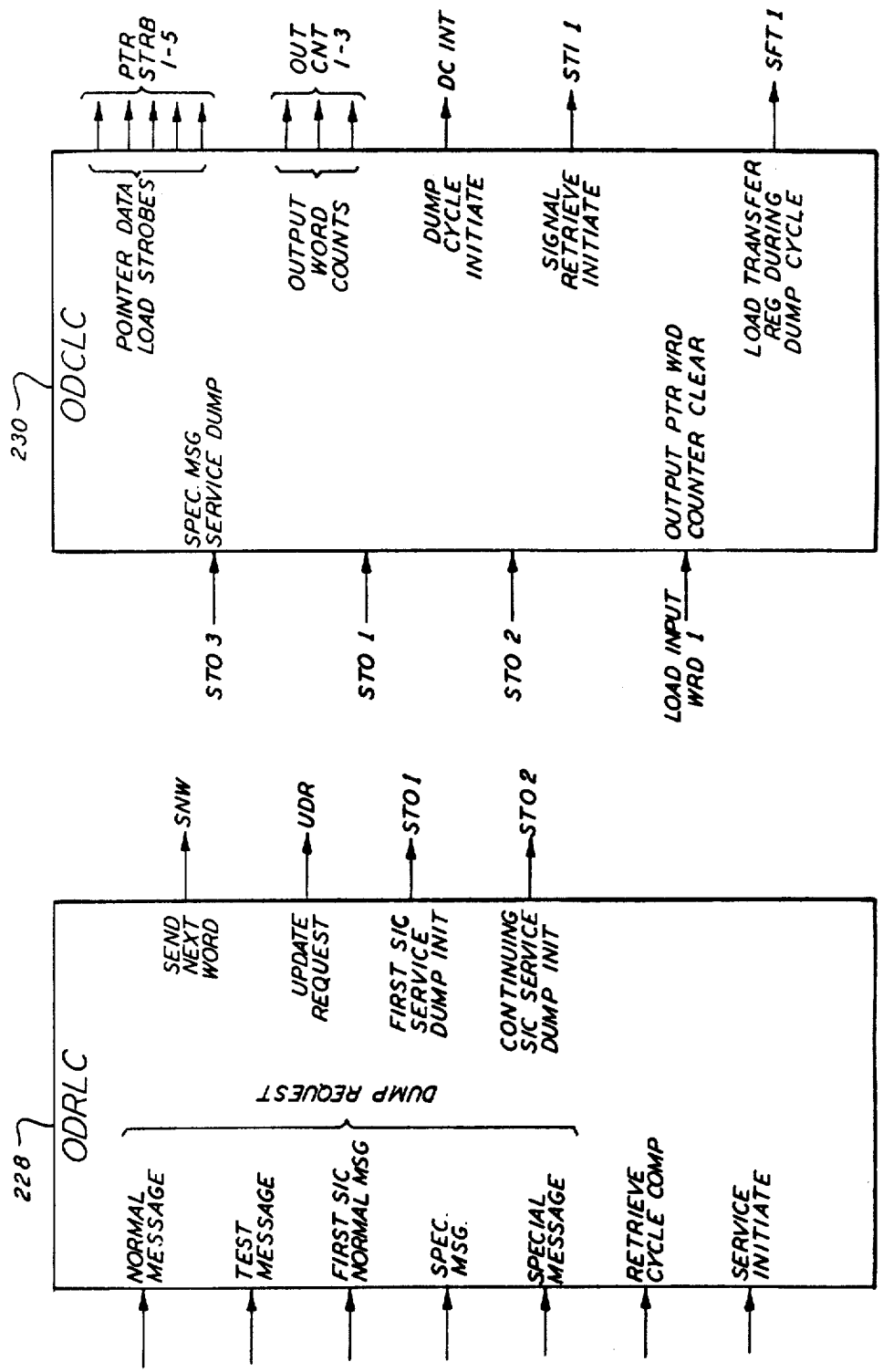

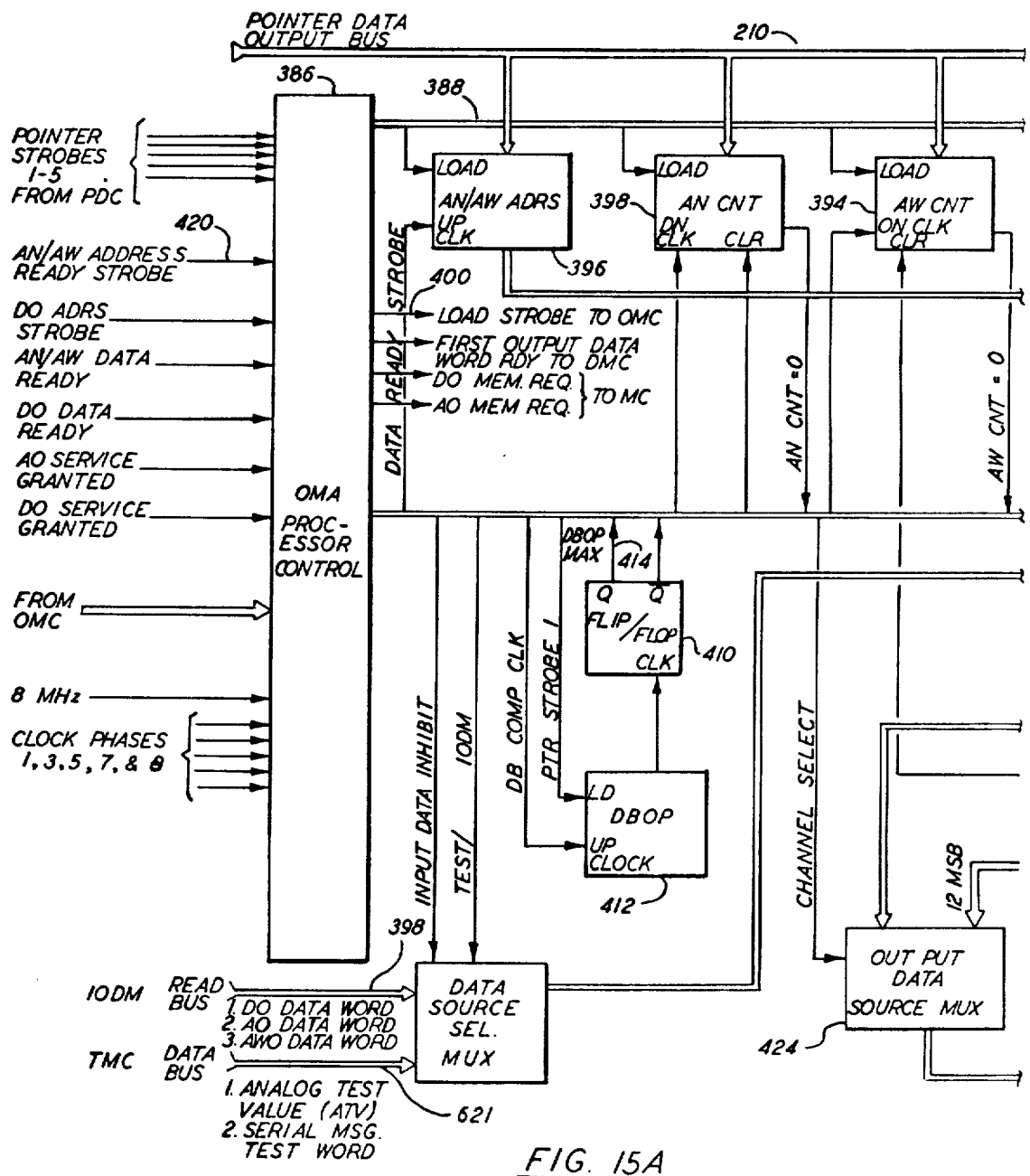

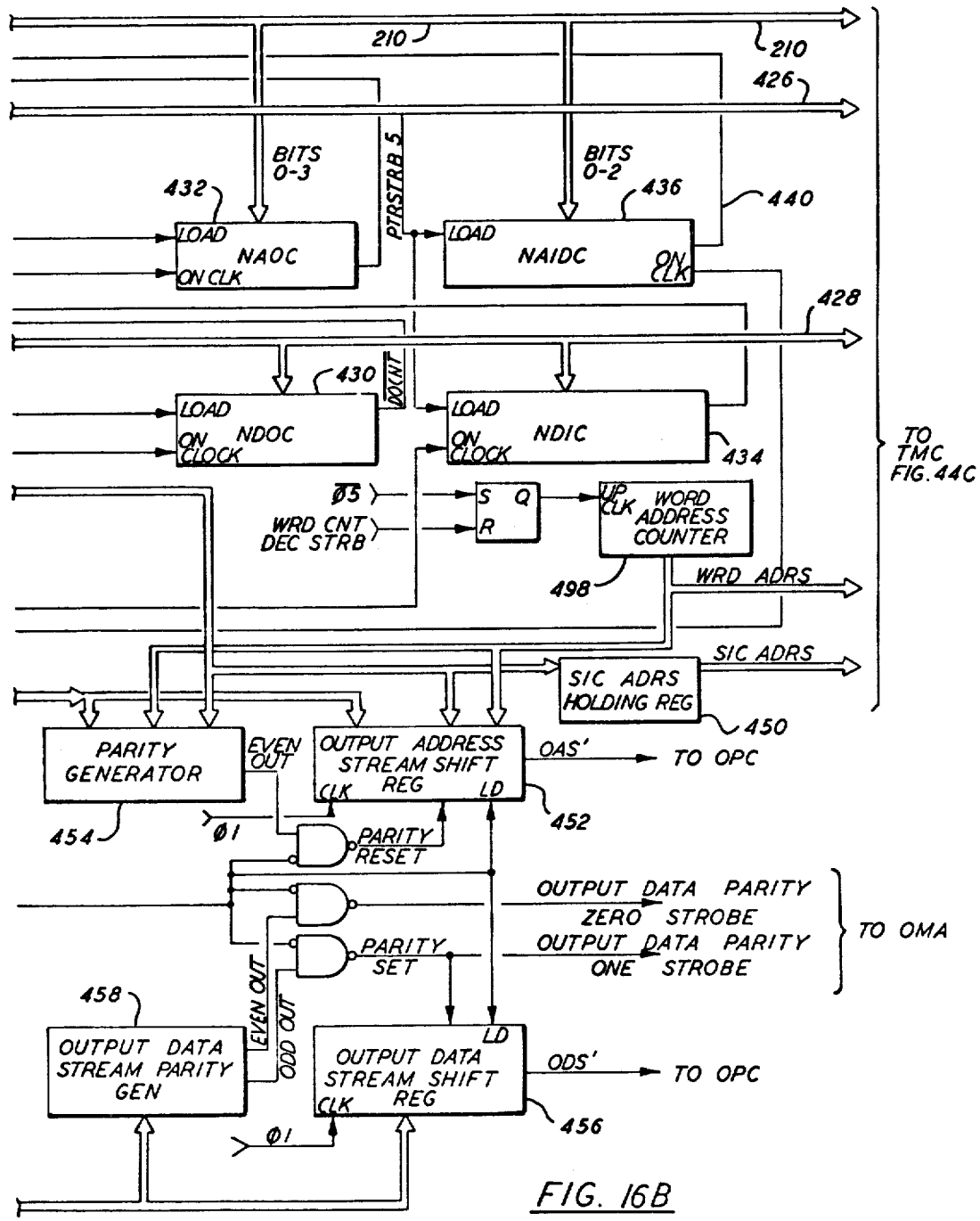

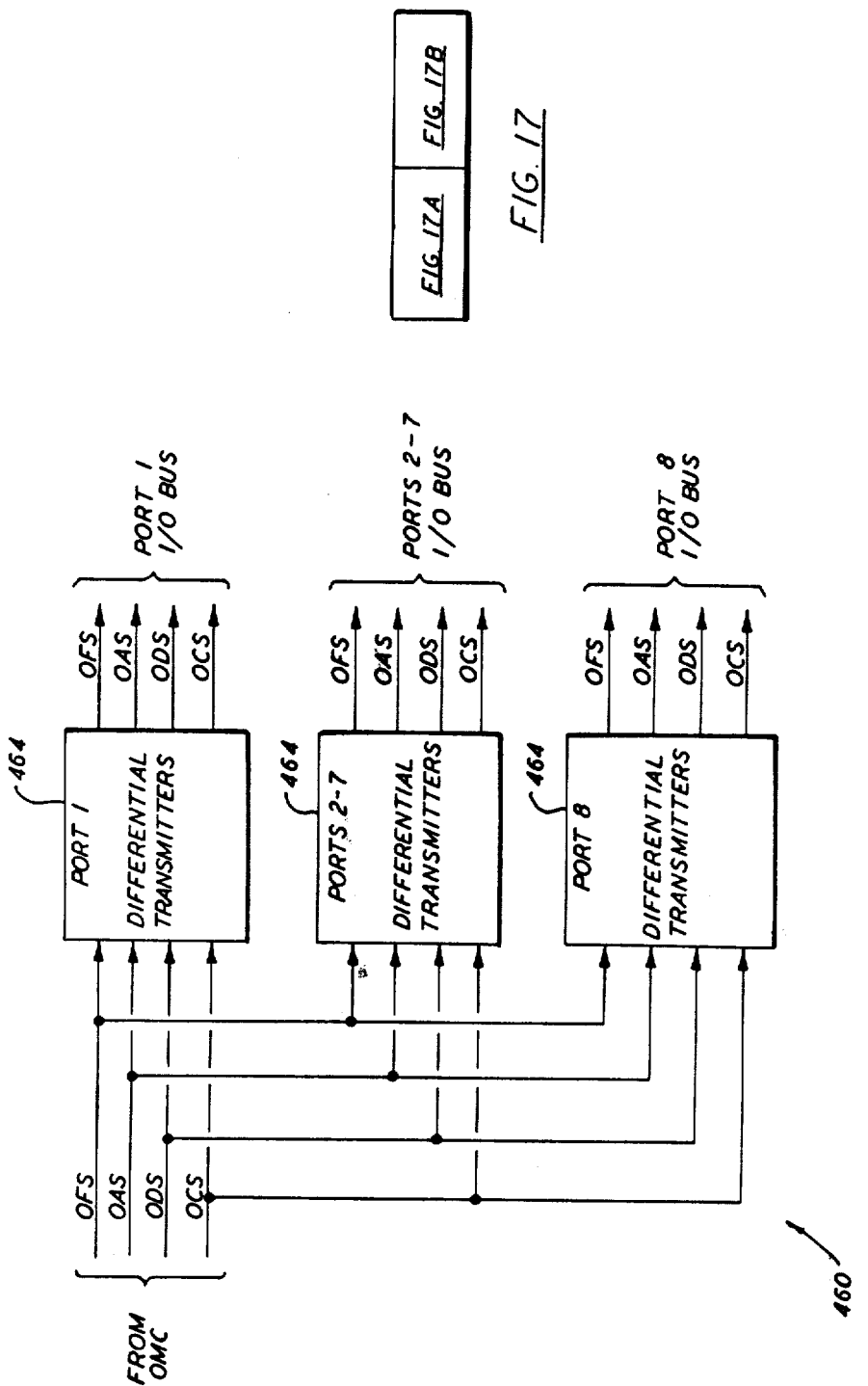

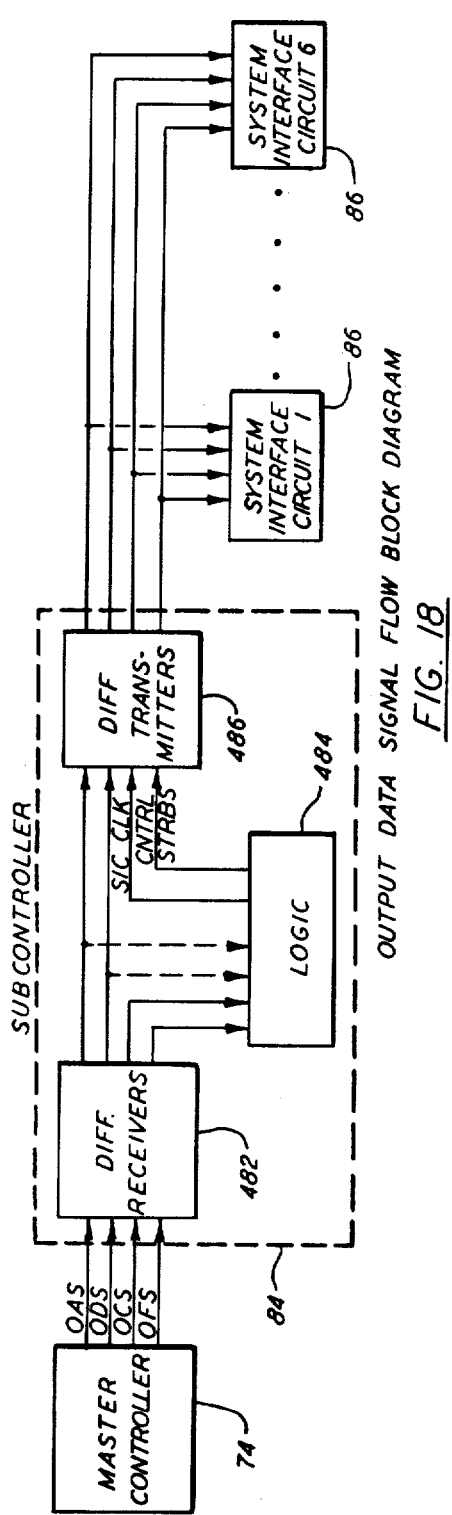
FIG. 18  OUTPUT DATA SIGNAL FLOW BLOCK DIAGRAM
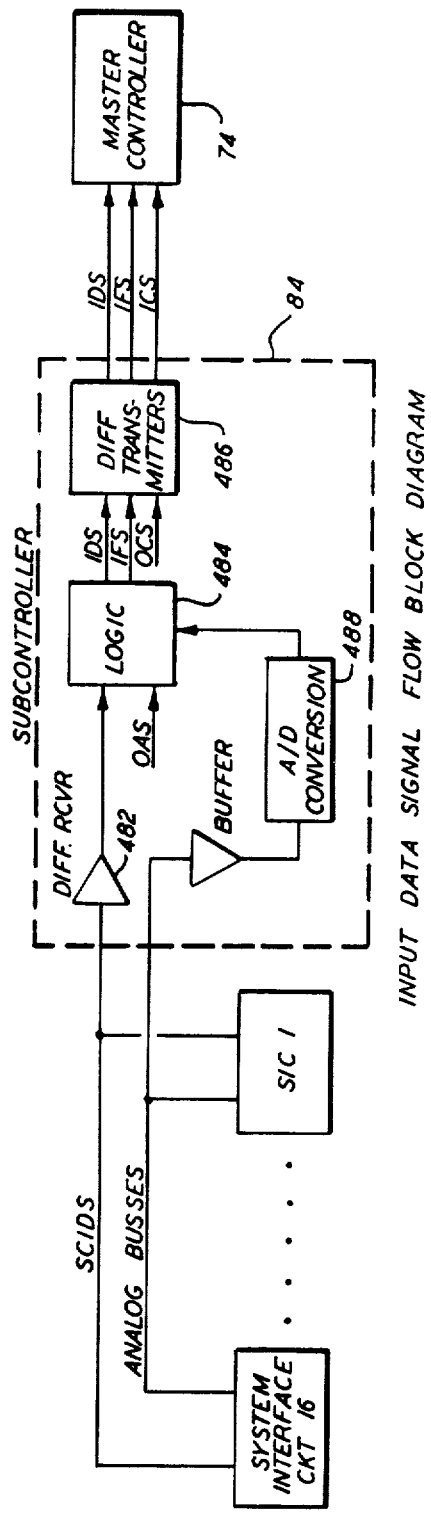
FIG. 19  INPUT DATA SIGNAL FLOW BLOCK DIAGRAM

I/O DATA SIGNAL FLOW DIAGRAM

I/O DATA CONTROL BLOCK DIAGRAM

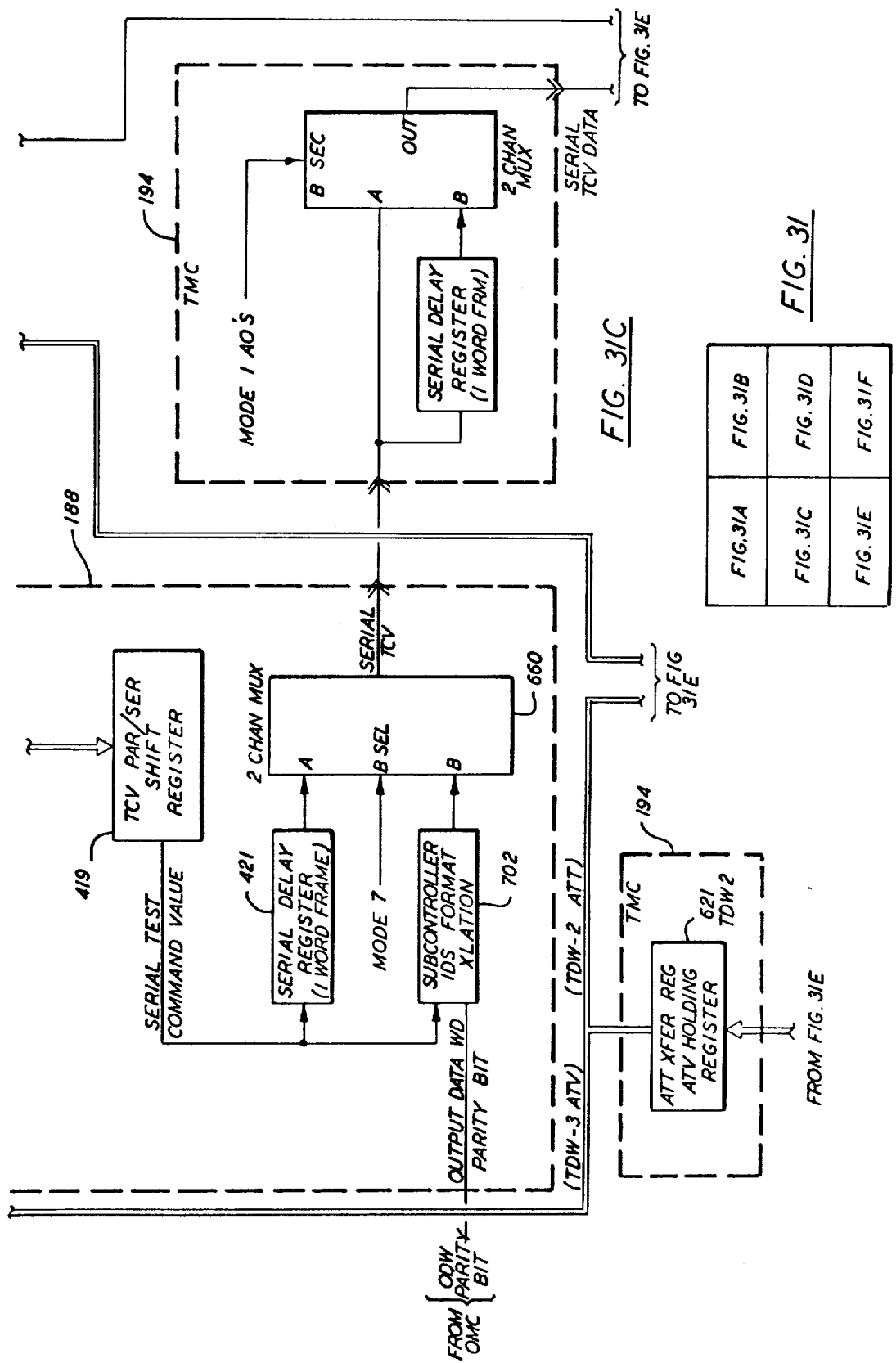

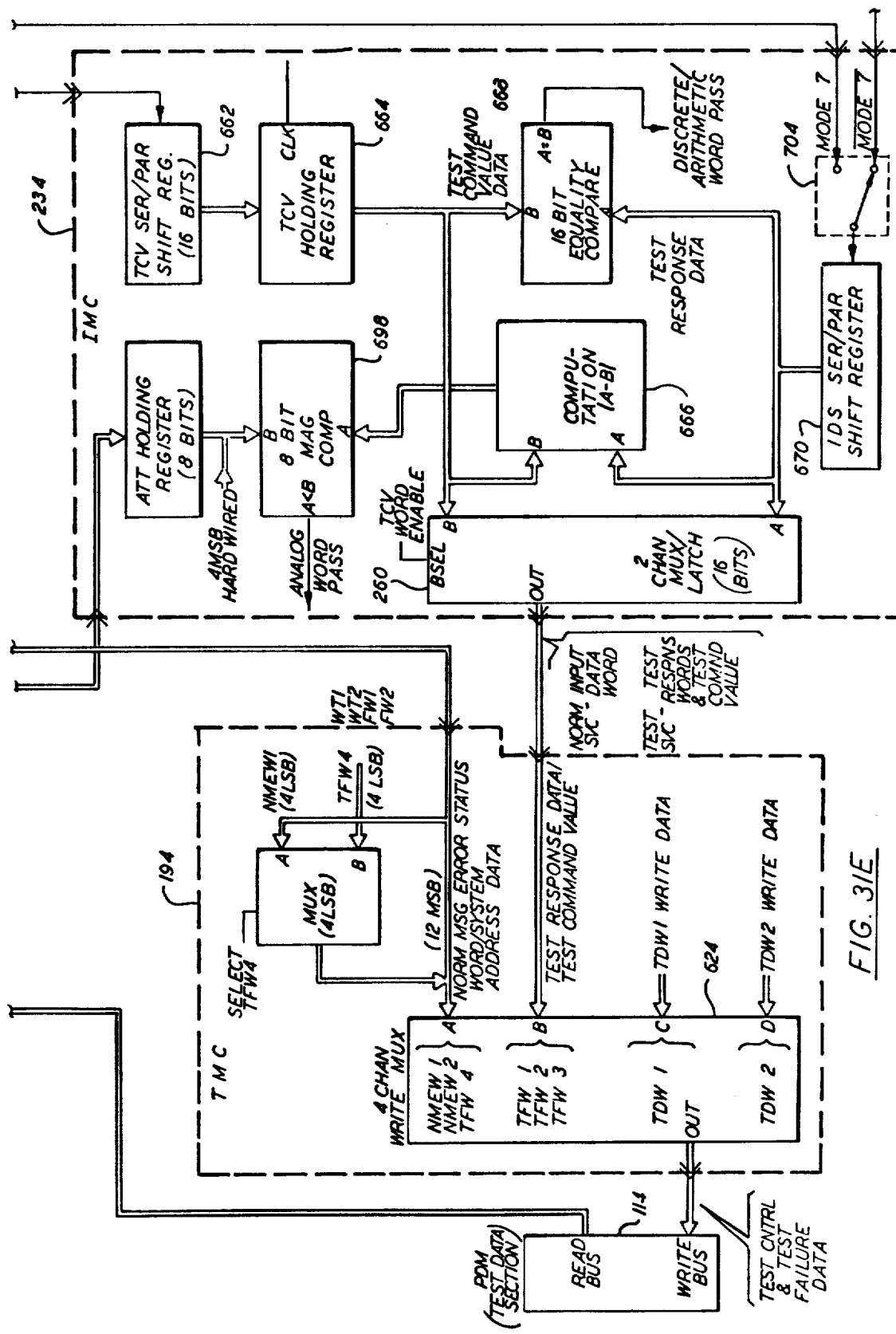
FIG. 3/E

```
                                                                    TDW 3
                                                                    COMP ONLY
┌─────────────────────── ANALOG TEST VALUE ──────────────────────┬─────────────────────┐
│SIGN BIT MSB                                                    │ NOT ACCESSED BY AO's/AI's │
│ 15 │ 14 │ 13 │ 12 │ 11 │ 10 │ 9 │ 8 │ 7 │ 6 │ 5 │ 4 │ 3 │ 2 │ 1 │ 0 │
│ -10  5.0  2.5  1.25 6.25 3.125 156.25 78.12 39.06 19.5 9.8 4.9 │
│       v    v   mv   mv   mv    mv    mv    mv    mv  mv  mv   │
└────────────────────────────────────────────────────────────────┘
                            FIG. 37
```

FIG. 37

```
                                                                    NMEW 2
                                                                    TMC
┌──────────── SIC ADDRESS ────────────┬──────────────────┬──────────┐
│                                     │      SPARE       │   BITS   │
│ 15 │ 14 │ 13 │ 12 │ 11 │ 10 │ 9 │ 8 │ 7  "GARBAGE DATA" │   0 - 6  │
└─────────────────────────────────────┴──────────────────┴──────────┘
                            FIG. 38
```

FIG. 38

```
                                                                    NMEW 1
                                                                    TMC
┌──────────── SIC WORD ADDRESS ────────────┬─ NO. OF OUTPUT WDS ─┬─ NO. OF INPUT WDS ─┐
│ WD7  WD6  WD5  WD4  WD3  WD2  WD1  WD0   │     NOT STORED      │    NOT STORED      │
│ 15 │ 14 │ 13 │ 12 │ 11 │ 10 │ 9  │ 8     │ 7 │ 6 │ 5 │ 4       │ 3 │ 2 │ 1 │ 0      │
└──────────────────────────────────────────┴─────────────────────┴────────────────────┘
                            FIG. 39
```

FIG. 39

```
BIT 15                                                                       BIT 0
┌─────────── SIC ADDRESS ──────────┬── WD.ADDRESS ──┬── WD. TYPE ──┬── FAILURE ──┐
│                                  │                │              │   WORD ID   │
│ 15 │ 14 │ 13 │ 12 │ 11 │ 10 │ 9 │ 8 │ 7 │  6 │ 5 │ 4 │  3 │ 2 │   1 │ 0        │
└──────────────────────────────────┴────────────────┴──────────────┴─────────────┘
        SIC AND WORD ADDRESS AT
     WHICH TEST FAILURE OCCURRED
                            FIG. 40
```

FIG. 40

```
MSB
BIT 15                                                              TFW1
                                                                    BIT 0
┌─────┬──────────────────────────────────────────────────────────────────┐
│ MSB │  TEST RESPONSE DISCRETE BIT ONES OR ARITHMETIC                   │
│     │       WORD ONES (IF DB OR AW WORD)              ──────── LSB     │
└─────┴──────────────────────────────────────────────────────────────────┘
                            FIG. 41
```

FIG. 41

```
MSB
BIT 15                                                          TWF2    LSB
                                                                        BIT 0
┌─────┬───────────────────────────────────────────────────────────────────┐
│ MSB │ { TEST RESPONSE DISCRETE BIT ZEROS OR ARITHMETIC }                │
│     │ {     WORD ZEROS (IF DB WORD OR AW WORD)        }                 │
│     │ { SERIAL MESSAGE RESPONSE WORD (IF SERIAL       }                 │
│     │ {     MESSAGE TEST MODE)                        }                 │
└─────┴───────────────────────────────────────────────────────────────────┘
  ╱── ANALOG RESPONSE WORD (TWO'S COMPLEMENT)(IF ANALOG WORD) ──────────╲
SIGN                                               SIGN  SIGN  SIGN  SIGN
BIT  MSB                                       LSB  BIT   BIT   BIT   BIT
                            FIG. 42
```

FIG. 42

```
MSB
BIT 15                                                              TFW 3    LSB
                                                                             BIT 0
┌─────┬──────────────────────────────────────────────────────────────────────┐
│ MSB │  TEST COMMAND VALUE DURING TEST DISCRETE ZEROS TEST         LSB      │
│     │  IDENTIFIES WHAT TEST FAILURE WORD 3 SHOULD BE FOR NO TEST ERROR     │
└─────┴──────────────────────────────────────────────────────────────────────┘
                            FIG. 43
```

FIG. 43

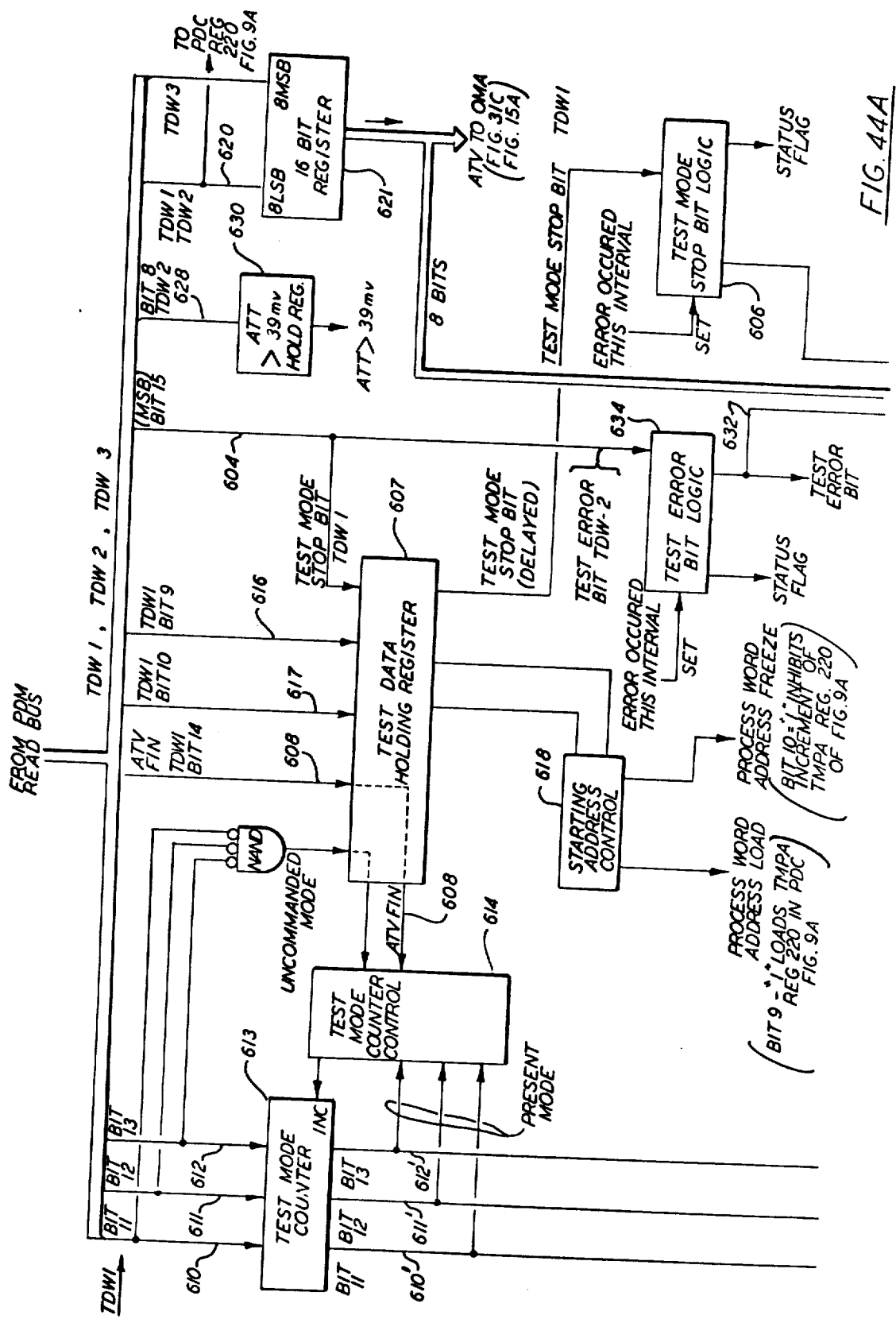

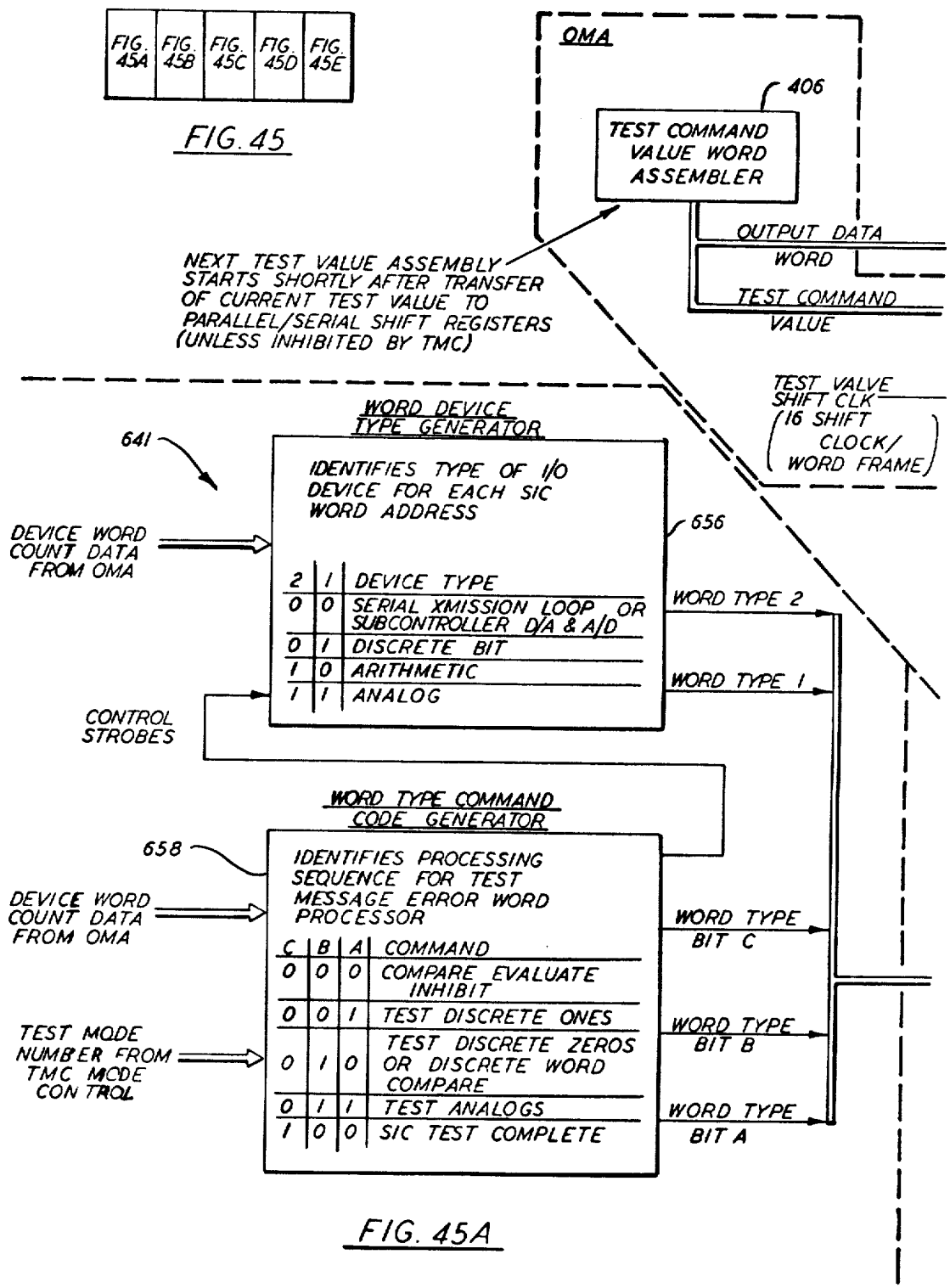

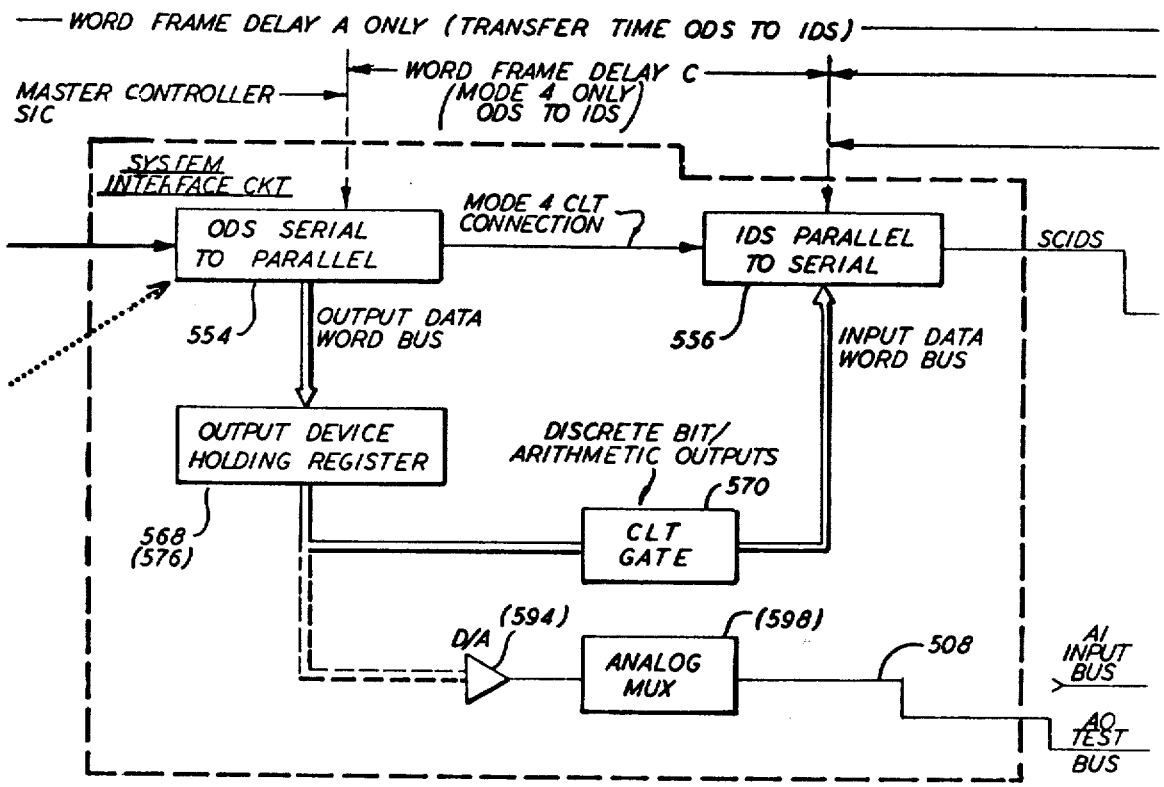
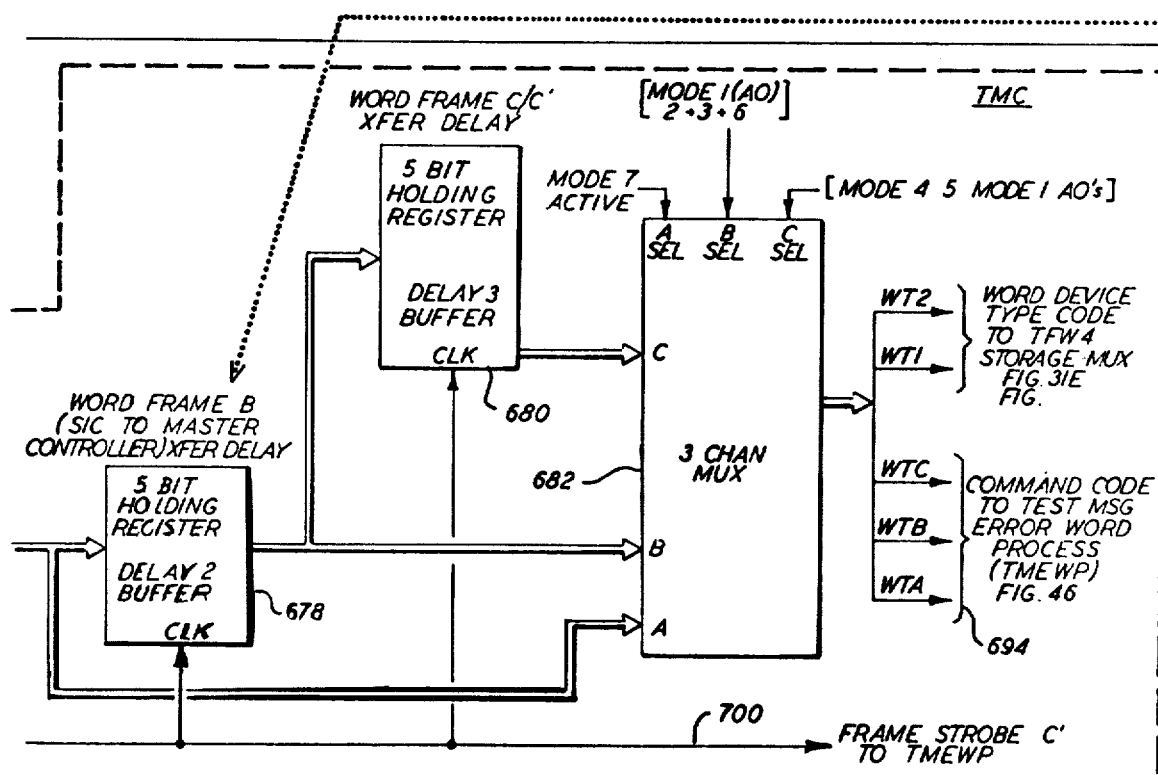
FIG. 45C

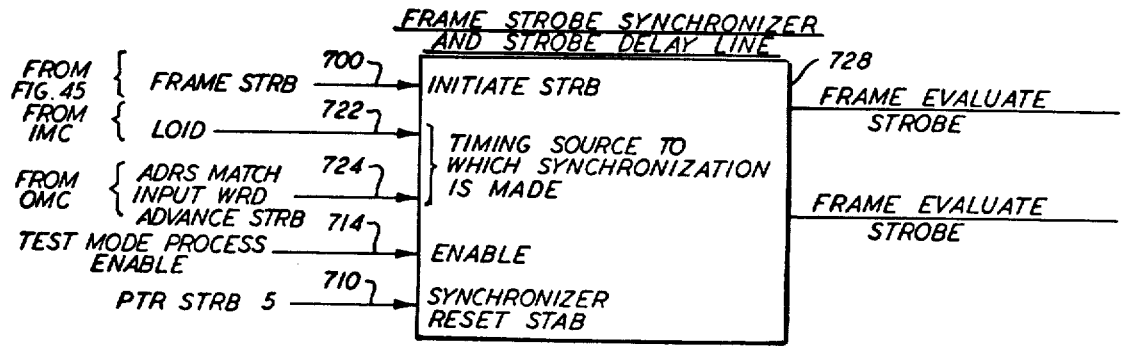
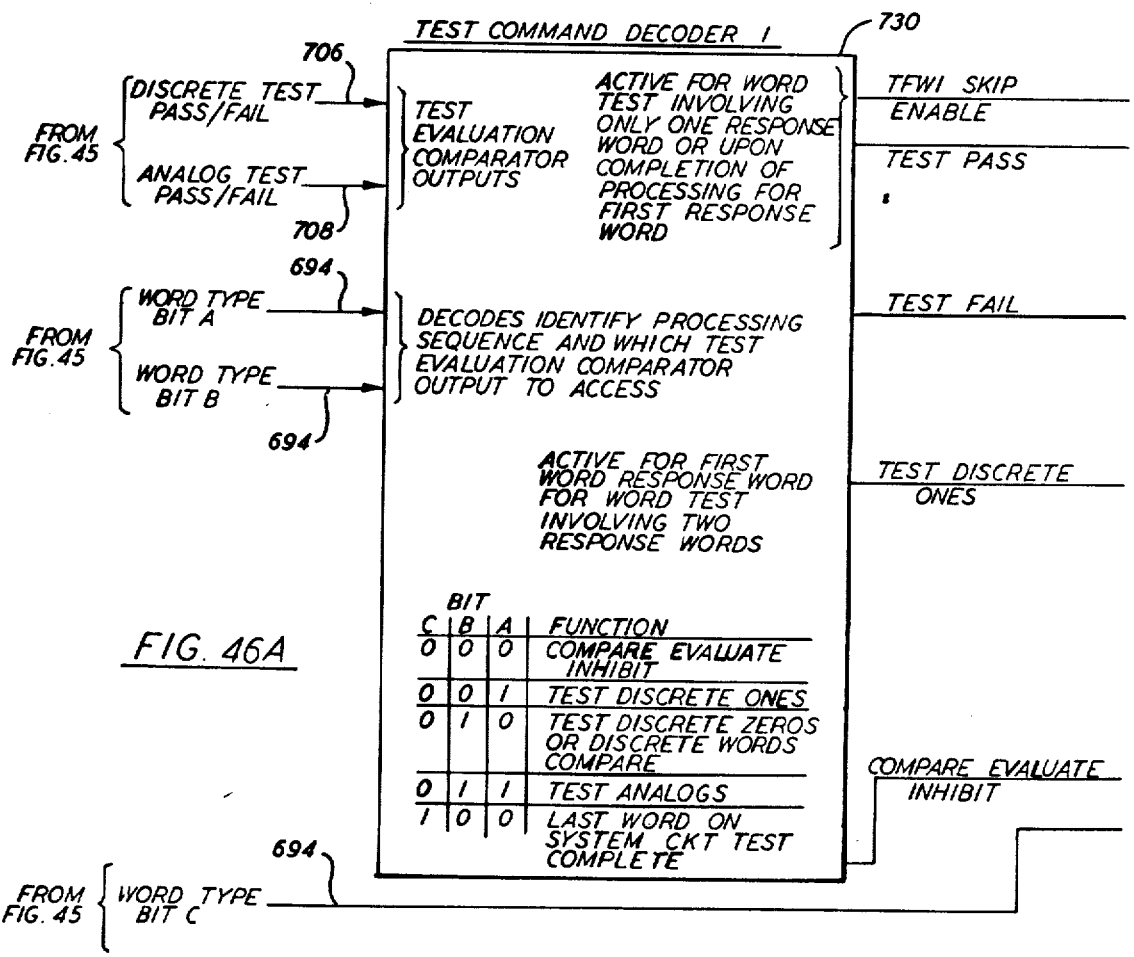
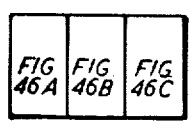
FIG. 46

TABLE I
TYPES OF TEST MODES

| IDENTIFICATION CODE | MODE FUNCTION | LOOP CLOSURE POINT | COMMENTS |
|---|---|---|---|
| N | NORMAL MESSAGE ERROR MONITORING<br>Verifies that system responded to each active word address, all output words were stored by the appropiate system, and all input word were stored by the IMA. | NONE - MONITORING hardware incorporated in Subcontroller, IMC, & OMC | ACTIVE during normal message service or special message service |
| 1 | MONITOR OUTPUTS<br>Verifies that system output devices attained the simulation program commanded value. | System Output device outputs | MDACs cannot be monitored. |
| 2 or 6 | TEST INPUTS<br>Verifies that DI's (whether in discrete bit word format or arithmetic word format) can attain both logic states, active elements in analog input signal chain attain the analog test value | System input device inputs | Mode 6 is identical to Mode 2 |
| 3 | TEST SUBCONTROLLER D/A & A/D<br>Verifies the performance of the subcontroller D/A and A/D converters. Drift of these devices can be measured. | Subcontroller between the D/A output & A/D input | Test not executed if none of the systems associated with subcontroller contain analog I/O devices. |
| 4 | TEST SERIAL MESSAGE TRANSMISSION<br>Verifies that a serial data word can be sent from the Master Controller to the system and back to the Master Controller without error | System between the output data shift register and the input data shift register | Data source is analog test value |
| 5 | FORCE TEST OUTPUTS<br>Verifies that discrete bit output or arithmetic word output devices can attain both logic states, analog output devices can attain the analog test value where the ATV is varied thru the entire conversion range of the AO device | System output device outputs | Requires certain shutdown procedures be executed before start of test since test value may depart significantly from normal simulation program value |

TABLE I
TYPES OF TEST MODES
– CONTINUED –

| | | | |
|---|---|---|---|
| 7 | TEST SERIAL MESSAGE TRANSMISSION  Verifies that Master Controller parallel to serial and serial to parallel converters are operating without malfunction | Master Controller OMC ODS output to IMC IDS input | Data source is 15 MSB of ATV |

SIMULATOR COMPLEX DATA TRANSMISSION METHOD AND SYSTEM

CROSS-REFERENCE TO RELATED APPLICATION

This application contains subject matter in common with co-pending application Ser. No. 795,301 by Robert N. Haas filed on the same date as this application and entitled "Data Transmission System Having Self-Testing Capabilities".

BACKGROUND OF THE INVENTION

1. Field of the Invention

This invention relates to electronic apparatus and method for the transmission and reception of data, control signals and the like between various components comprising a system. More particularly, the invention relates to apparatus and methods for transmitting data between apparatus comprising a complex system, such as an aircraft simulator, in a manner which is inexpensive, easy to maintain and less susceptible to electromagnetic interference than signal transmission techniques found in the prior art.

2. Description of the Prior Art

There are many and varied electronic systems presently in operation which require the transmission of vast amounts of information from a source (such as a computer) to individual load devices. As an example, the interconnection system of present-day aircraft simulators consists of a multitude of cables, patch panels or cabinets, individually wired back plates, and numerous series disconnects, all serving to tie together a complex consisting of widely separated components such as a computer, cockpit instruments and controls, instructor operation station, and several cabinets of signal conditioning and electronic conversion devices. This type of present-day simulator may well include over 2500 independent transmission channels (both analog and digital, but predominantly analog), some of which are separated by distances greater than 100 feet. Some of the problems, such as the large amount of hardware and the interconnecting wiring associated with such a complex simulation system, are apparent by visual inspection. Two of these readily apparent problems which are significant include:

(a) the requirement of extensive use of interconnection cables and associated patch panels or cabinet assemblies; and (b) the frequent and necessary use of very long interconnecting cables, which use results in degradation of signal quality due to the noise picked up by the long cables.

For example, if an aircraft simulator complex using 2500 transmission channels, each requiring two wires which, on an average, cover a distance of fifty feet, then there would be on the average of approximately fifty feet during which each of 5000 wires was subject to outside interference or about fifty miles (80 kilometers) of wire subject to outside interference. Further, the transmission of analog signals through standard twisted pairs subjects the signal to outside influences due to distributed impedance, particularly where the signals change at a rapid rate. Thus, the long distances and the complicated wiring patterns involved introduce very unfavorable signal-to-noise conditions which are responsible for significant degradation of simulator performance.

However, what is not so readily apparent as the above-mentioned problems is the complex, time-consuming bookkeeping and signal documentation which is necessary to accomplish the wiring and to facilitate trouble shooting and maintenance. Additional penalties associated with the presently available interconnection systems are found when one considers the impact on manufacturing processes, inventory control, and maintenance tasks. Each of these tasks is based on (in fact, is hampered by) the prior art techniques used for packaging and interconnection. For example, equipment testing at a systems level cannot be accomplished until simulator fabrication is almost complete and the necessary associated signal conditioning hardware and interconnecting cables have been installed.

In addition to the common interconnecting technique of using a single transmission channel for each control signal or bit of data, some efforts have been made in the past to provide better and more efficient systems. One particularly valuable system that does provide significant improvement over the standard technique of signal and data distribution is described in U.S. Pat. No. 3,848,230 issued to John F. Rehm and Evan E. M. Lloyd on Nov. 12, 1974. However, notwithstanding the advantages and savings in the number of conductors disclosed by the Rehm et al patent over the standard technique, there is still a significant amount of low-use hardware and a large number of conductors necessary.

More specifically, past techniques of interfacing the simulator general purpose digital computer with the end item loads and devices included functionalized equipment modules or components at various different locations. Each particular piece of equipment provided a certain type of signal processing or conditioning. Thus, the interconnection of several equipment modules was often necessary to completely process or condition a single signal which originated from one end item so that it would be compatible and suitable for use by the piece of equipment requiring the data or signal to continue operation. That is, the information or data generated by one simulator end item may not be of suitable form, magnitude, polarity, etc., for use by another end item such as, for example, the computer which requires information or data for proper operation. In such a situation, the information cannot simply be transmitted or routed directly from the source end item to the using end item, but must instead first be routed to the necessary equipment to properly condition and process the information so that it can be used by the end item. Typically, the distribution and conditioning task can be categorized and is handled by the prior art equipment as follows:

(a) The linkage equipment converts the simulator general purpose digital computer signals to analog and discrete output signals which are required by the simulator loads. Similarly, this equipment converts analog and discrete signals generated by the various simulator end items to digital signals in the form required by the general purpose digital computer. Most prior art simulator complexes use one piece of centralized linkage equipment for all such conversions performed. However, in systems of the type taught in the aforementioned Rehm et al patent, linkage equipment was divided in several similar but smaller pieces of equipment which were positioned at selected locations throughout the simulator complex to various simulator load or end use devices.

(b) Signal conditioning equipment or hardware provide further processing or conditioning of the signal converted by the linkage equipment to meet the requirements of the end item or using device. Similarly, conditioning of signal outputs from the end item are often required prior to application to the linkage equipment after which the converted signal is transmitted to the simulator general purpose digital computer.

(c) The interconnection between the components, the signal conditioning equipment, the linkage equipment and the end items involved a massive number of cables, connectors and patch panel assemblies. Most of the prior art simulators utilize a centralized interconnecting scheme or interface cabinet where all connections for simulator loads, linkage and signal conditioning hardware were brought to a common location and then interconnected. The system taught by the Rehm et al patent, however, somewhat reduced the length of cable required and the number of interconnections by distributing the interconnecting panels or cabinets about the simulator complex and closer to the various pieces of equipment.

(d) In the prior art simulators, the power distribution system consists of a central group of cabinets containing power supplies. The power from the various power supplies is distributed to and shared by all of the equipment making up the complex. This technique, of course, requires a large distribution network of massive power lines which requires an equal number of massive return lines. The power distribution system taught by Rehm et al reduces the large power network somewhat by providing many separate power supplies at various equipment locations.

SUMMARY OF THE INVENTION

The system of the present invention provides apparatus for the serial transmission of data between a computer which outputs parallel digital data and various peripheral units which may provide data and/or respond to signals in various forms including parallel, serial, discrete, etc. The computer is programmed with the operational profile of the peripheral units and provides control signals or commands to the peripheral units as a function of the profile and inputs from the peripheral units representative of its operations. For example, in the case of a flight simulator, the computer is programmed with the flight parameters and characteristics of the aircraft being simulated and the inputs from the peripheral units or simulated cockpit would include signals representative of the manipulation of the control surfaces and switches by the pilot trainee.

A control unit interfaces the computer and provides the necessary control for converting the parallel digital data received from the computer to serial form suitable for serial digital transmission to the peripheral units. The control unit also provides the circuitry for converting serial digital data received from the peripheral units into parallel digital data suitable for use by the computer. Two memories are included in the control unit. One provides temporary storage for data travelling between the computer and the peripheral unit and is necessary because of the time period between transmitting data in parallel format and transmitting data in serial format. The other memory contains information relevant to the various circuits used in the peripheral units to assure that the serial data is received by the correct circuit for conversion into form suitable for use by the peripheral unit. The serial digital data is carried between the control unit and the peripheral units by means of a single primary communication path that joins the control unit with each of the peripheral units. The primary communication path typically would consist of seven conductor pairs, each conductor pair being dedicated to carrying a specific stream of information is only one direction. Typical information streams would include input and output data streams, output address streams for directing the data stream to the proper peripheral unit, input and output clock pulse streams and input and output data frame pulses for synchronizing the transmission of the data in both directions. The various streams of information are either received by the peripheral unit or transmitted from the peripheral unit.

BRIEF DESCRIPTION OF THE DRAWINGS

FIGS. 6A and 6B are electrical block diamgrams of the control unit or master controller incorporating the concepts of this invention.

FIGS. 7A and 7B show timing diagrams illustrating the data transmission that occurs during a single data transmission cycle of a flight simulator using the concepts of this invention.

FIGS. 8A, 8B and 9A through 9F represent electrical block diagrams of circuits used in the master controller of FIGS. 6A and 6B.

FIG. 10 represents the order of data information stored in a storage memory of the master controller of FIGS. 6A and 6B.

FIGS. 18 and 19 are electrical block diagrams of output data and input data transmission circuitry between the master controller and the various peripheral units.

FIGS. 31A through 31F are overall electrical block diagrams showing the self-testing capabilities of this transmission system.

FIGS. 33 through 43 show the organization of various 16 bit test words used in the self-test feature of this invention.

FIGS. 44A through 44C are electrical block diagrams of the self-test circuitry of this invention.

FIGS. 45A through 45E are block diagrams illustrating the flow of test data through the self-test circuitry of this invention.

FIGS. 46A through 46C are block diagrams illustrating circuitry for generating and processing test message error words.

DESCRIPTION OF THE INVENTION

OVERVIEW

Figure 1:
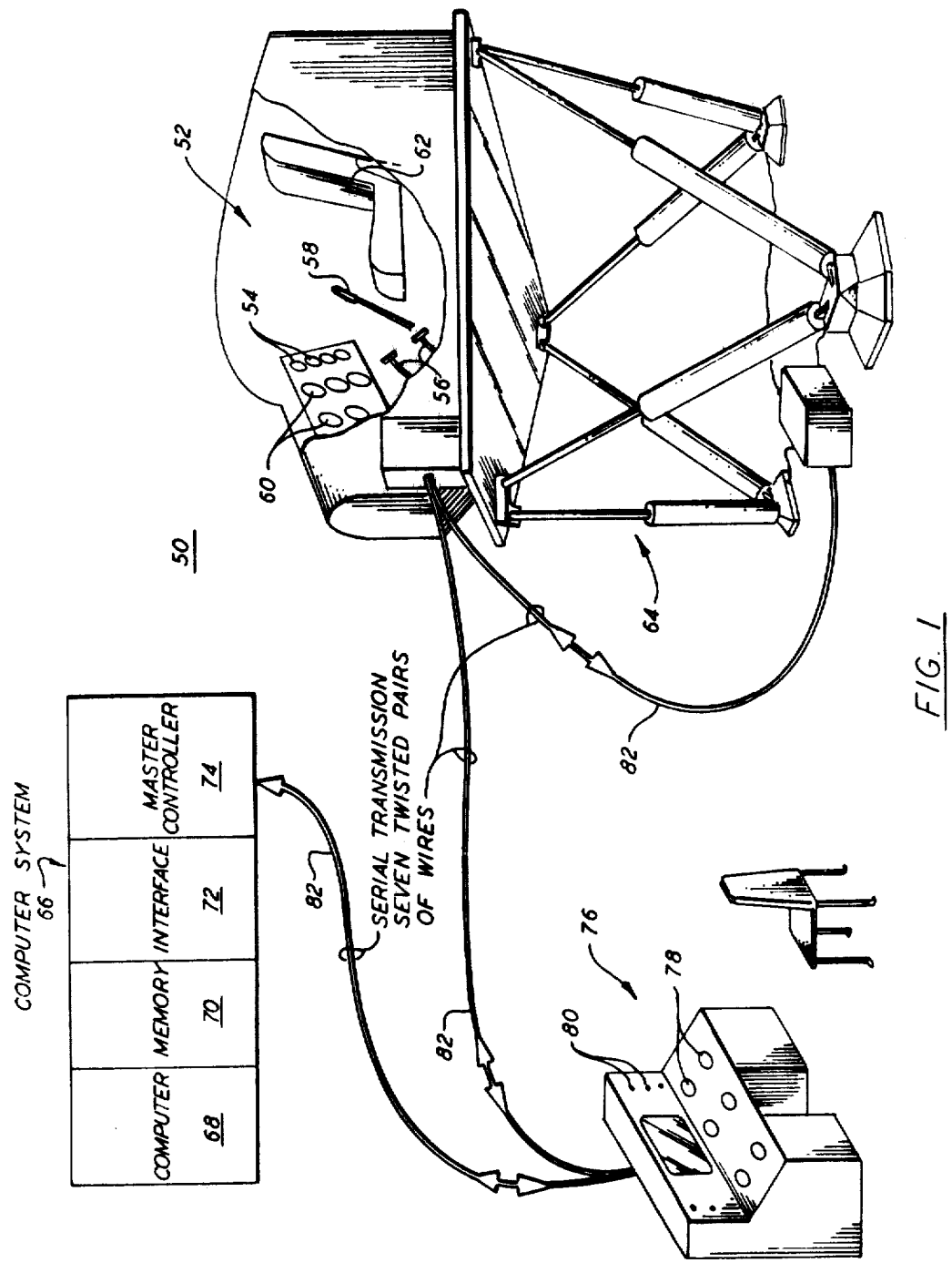
FIG. 1 is a broad schematic diagram of a flight simulator complex incorporating the concepts of this invention.

Referring now to FIG. 1, there is shown an overall pictorial diagram of a modern aircraft simulator complex incorporating the principles of the invention taught by the co-pending Haas application and the present invention. An aircraft simulator 50 includes a cockpit 52 having all of the control switches 54, aircraft surface controls 56 and 58 such as rudder, ailerons, flaps, etc., indicators 60 such as attitude indicator, rate of climb, compasses, etc., seat 62, etc., arranged substantially identical to the arrangement of similar items in the cockpit of the aircraft being simulated. The ideal situation, which is substantially achieved in modern simulators, is that the simulator cockpit be indistinguishable by a veteran pilot from the cockpit of the plane being simulated Aircraft simulator 50 also includes a "six degree of freedom motion system" 64 on which cockpit 52 is mounted. Motion system 64 is of the type described in U.S. Patent RE No. 27,051 issued to K. L. Cappel on Feb. 9, 1971. Other related motion systems also suitable include U.S. Pat. Nos. 2,930,144 issued to L. E. Fogarty on Mar. 29, 1960; 3,281,962 issued to E. G. Pancoe on Nov. 1, 1966; 3,451,146 issued to E. G. Panco on June 24, 1969; and 3,619,811 issued to E. G. Pancoe on November 16, 1971, from which patents further details of motion systems can be obtained and which information is hereby incorporated by reference. Motion system 64 provides onset cues of g forces and movement in all six degrees. These six degrees of motion include pitch, yaw and roll as well as vertical, forward and sideway motions. Movement of cockpit 52 by motion system 64 is controlled by signals from simulator computer system 66. Computer system 66 comprises a general purpose digital real-time computer 68, a mass storage memory 70, interface 72 and master controller 74 which provides an input/output interface with the rest of the simulator complex. Computer system 66 is programmed with a data base and flight equations representative of the operational profile of the aircraft being simulated. In addition, computer system 66 receives a large number of variable signal inputs from cockpit 52 which are representative of the trainee operator's manipulation of the many switches and aircraft controls. Thus, with these control signals, flight equations and data base, computer system 66 computes the necessary signals to control the cockpit flight instruments and the motion system actuators such that the flight instrument indications and motion cues received by the trainee operator are substantially the same as those the trainee would experience if he manipulated the controls in the same manner in the actual aircraft. For additional information concerning aircraft flight simulators, see the U.S. Pat. Nos. heretofore listed with respect to motion systems and 3,504,260 issued to L. A. Staples on Mar. 31, 1970; 3,494,052 issued to P. R. Corlyon on Feb. 10, 1970; 3,517,446 issued to P. R. Corlyon on June 20, 1970; 3,538,624 issued to G. E. Minnich et al on Nov. 10, 1970; and 3,903,614 issued to J. A. Diamond on Sept. 9, 1975, which information is hereby incorporated by reference. Other patents in Patent Office Class 35, Subclass 10, might also be of interest.

In addition to providing realistic instrument indications and motion cues to the trainee operator, more effective training can be provided by including some capability for an instructor to monitor the trainee operator's activities and performance and to alter the flight situation. In the embodiment of FIG. 1, instructor station 76 includes most of the aircraft instruments 78 as well as switches 80 for creating selected malfunctions of the simulated aircraft. The instructor is provided the same indications on his monitor instruments from the computer as are received by the trainee operator. In addition, a signal representative of the aircraft malfunction or emergency selected by the instructor is received by the computer system 66 which then provides motion cues and instrument indications representing operation of the malfunctioning aircraft. The trainee operator or student pilot may then be monitored with respect to his capabilities and responses to controlling a malfunctioning aircraft. Thus, in addition to providing training for routine flight missions, the trainee operator can also be trained in the handling of emergency situations which might occur during a flight. Often these simulated emergencies and malfunction situations are of the type that cannot be realistically simulated in an actual flight of the aircraft due to the attendant dangers to which the trainee and instructor would be exposed. It should also be pointed out at this point that although one cockpit and motion system is discussed, the described data transmission system 76 using the automatic testing techniques of the invention is capable of handling up to eight cockpits and motion systems such as shown at 52 and 64. However, operation is substantially the same for one system as it is for eight systems. Therefore, for the sake of simplicity, the discussion will be limited to one cockpit and motion system.

Figure 2:
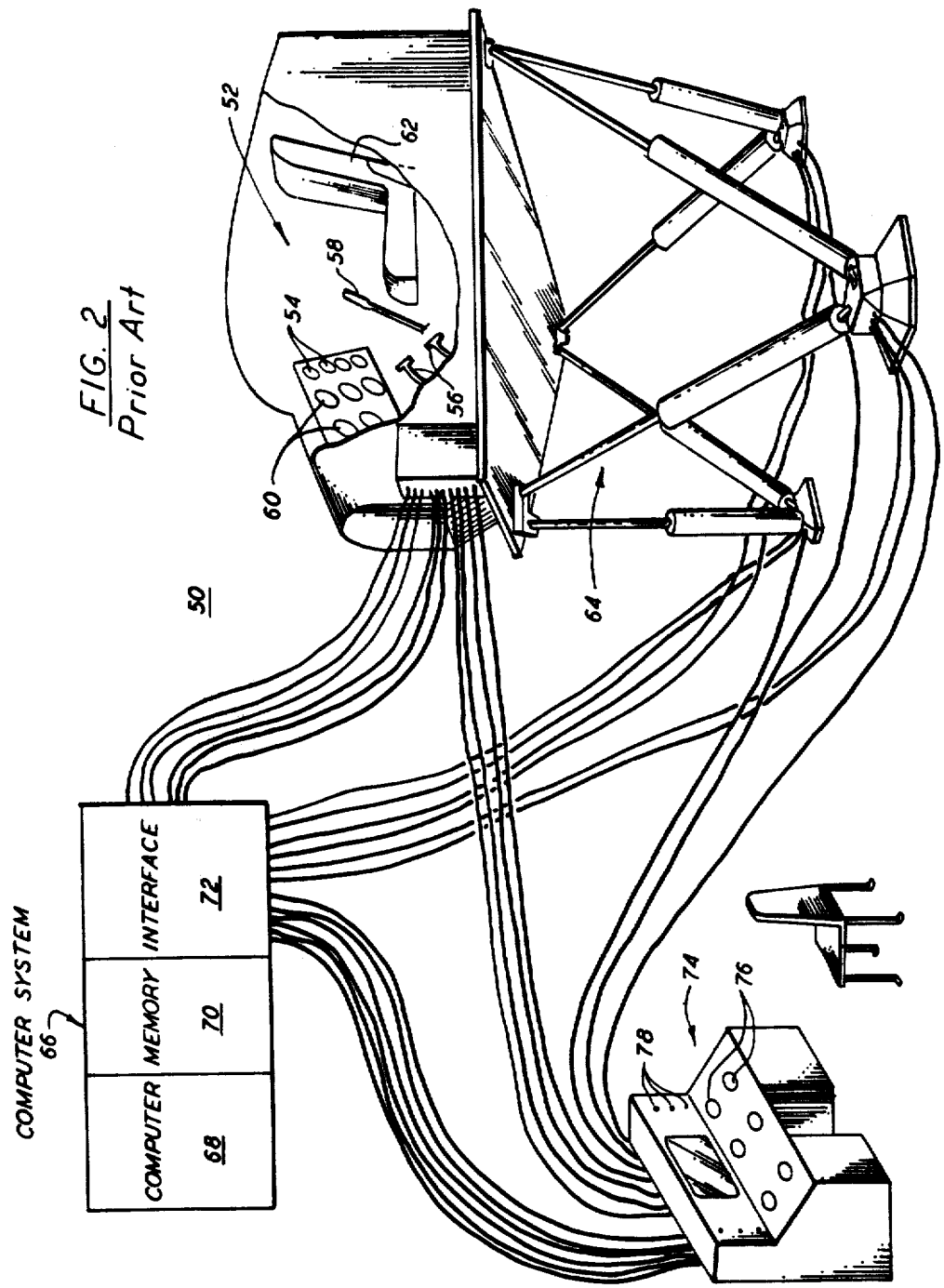
FIG. 2 is a broad schematic diagram of a prior art flight simulator complex showing the extensive amount of cabling required.

As shown in FIG. 1, and in accordance with the present invention, data and signal transmission is accomplished by the serial transmission of digital data rather than parallel transmission. Computer system 66, cockpit 52, motion system 64, and instructor station 76 are all connected by single multiconductor cable 82 which, in the present embodiment, contains only seven twisted pairs of wire. The clean, simple appearance of the simulator complex contrasted with the very cluttered appearance of presently available simulator complexes having similar training capabilities but which must include a vast number of multiconductor cables is shown in FIG. 2 and labelled as prior art.

Figure 3:
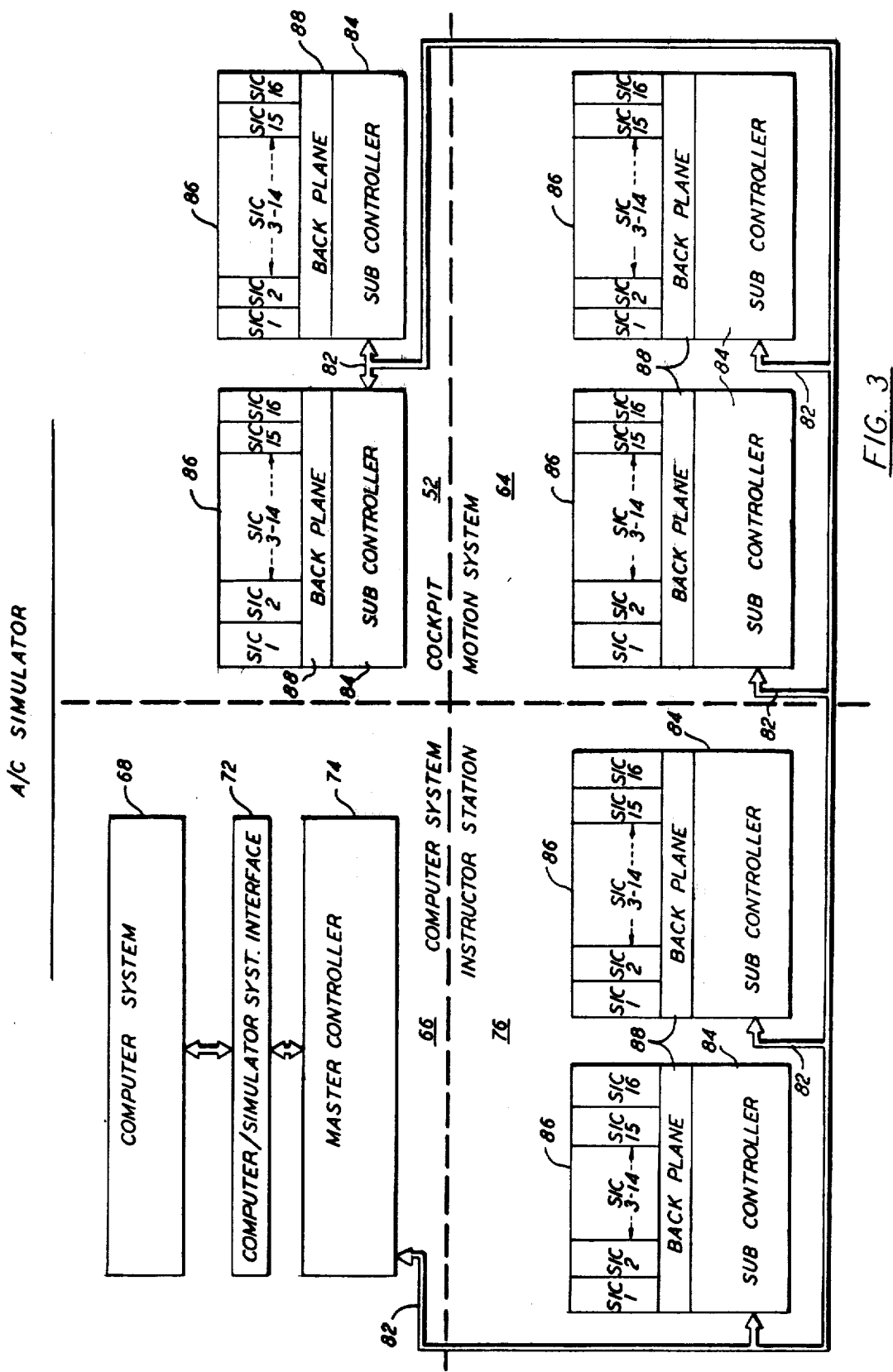
FIG. 3 is an electrical block diagram of the flight simulator complex shown in FIG. 1 incorporating the concepts of this invention.

FIG. 3 shows a block diagram (having somewhat more detail) of the same simulator complex embodying the principles of the present invention as was shown in the pictorial representation of FIG. 1. Wherever possible, FIGS. 1 and 3, as well as all of the other Figures in the application, use the same reference numbers when indicating or referring to the same item or component. As shown in the block diagram of FIG. 3, simulator cockpit 52, motion system 64, and instructor station 76 are connected to computer system 66 by means of cable 82. Master controller 74 provides the interface with Computer system 66 and subcontrollers 84 by means of cable 82 which includes seven twisted conductor pairs. One of the seven twisted conductor pairs is dedicated to each of the following signals which will be discussed in more detail hereinafter. The computer is considered the point of reference for determining input or output. The seven signals are: (1) Output Address Stream, OAS; (2) Output Data Stream, ODS; (3) Output Shift Clock Steam, OCS; (4) Output Frame Strobe, OFS; (5) Input Data Stream, IDS; (6) Input Shift Clock Stream, ICS; and (7) Input Frame Strobe, IFS. The subcontrollers, in turn, along with system interface circuits, SIC, 86, provide an interface with the simulator cockpit, motion system and instructor station. Although a more detailed discussion of the master controller is included hereafter, in general, master controller 74 controls data transfers between the computer and the many external subcontrollers 84 by formatting, packing and accumulating input/output data. Master controller 74 also includes the control circuitry, test message controller (TMC) 85, necessary for achieving the automatic self-testing technique of this system as well as providing parallel to serial conversion for data going from the master controller to a subcontroller and serial to parallel conversion for data coming from the subcontroller to the master controller, and generates the clock signals for use by the subcontrollers.

In the embodiment illustrated in FIG. 3, there are shown six subcontrollers 84, two for each subsystem. In an actual simulator, and depending on the complexity of the simulator and the aircraft being simulated, some of the subsystems may require more than two subcontrollers and other subsystems could possibly require only a single subcontroller. The number of subcontrollers required for a subsystem, of course, will vary with the number of different control and data signals (loads) which exist between the subsystem and the computer. As will be discussed in more detail hereinafter, each of the subcontrollers of the described embodiment can handle up to 16 interface circuits 86. The ability to handle 16 interface circuits is, of course, not critical and is a design choice. All of the subcontrollers 84 are identical in operation and although further details of subcontroller operation is included, the primary functions of the subcontroller are: (1) receiving OAS, ODS, OCS and OFS signals, and using these received signals for various control and strobe generation functions; (2) generating read and store commands and enable signals for use by the system interface circuitry, SIC 86; (3) transmitting IDS, ICS and IFS signals to the master controller; (4) providing analog to digital conversion of signals from the simulator prior to being transmitted to the master controller; (5) providing digital to analog conversion for the purpose of generating analog test command values, and (6) generating the necessary bias voltage for the discrete and arithmetic word inputs on a SIC.

As shown in FIG. 3 subcontrollers 84 are connected to each of the 16 SIC's 86 by means of a backplane 88 which allows any SIC 86 to be inserted into any of the many possible locations and still operate correctly. Thus, it is seen that signal and data transmission from the computer to the various loads is identical up to the point where the signal leaves the backplate. Handling of the unique and different characteristics of each signal (whether data or control signal) occurs at the SIC level. In the detailed discussion which follows, various types of signal transmissions will be discussed. However, for purposes of this overview, it should suffice to note that the SIC processes or conditions the signal whatever its characteristic or magnitude such that is is compatible with the subcontroller and each SIC no matter what type of signal conditioning is required, including self-testing features.

The data transmission system of this invention also represents a preferred system for incorporating the self test feature discussed herein and claimed in the Haas co-pending application. (Ser. No. 795,301). Other improvements of this invention are:

(a) Electromechanical noise is drastically reduced since (1) simulator cabling is substantially eliminated except for one cable having seven twisted wire pairs, and the irreducable cabling associated with bringing wires directly to the terminals of physical electronic packages such as panels, indicators, etc.; (2) assemblies necessary for signal processing and conditioning, etc., are located at their point of use; and (3) the need for special wiring and routing in order to avoid noise on the very sensitive analog leads is substantially eliminated.

(b) Documentation for cabling and interconnection is vastly simplified.

(c) Manufacturing checkout prior to final simulator assembly is possible.

(d) Changes and modifications only affect the systems circuits involved, with no need for any changes to interconnecting wiring.

(e) Energy requirements are reduced and reliability and maintainability are improved.

In addition to the unique technique of data transmission taught by the present invention, the data transmission system discussed herein also includes automatic and continuous testing capabilities which are the subject matter of the co-pending Haas application Ser. No. 795,301 previously mentioned. Although this unique testing system is discussed in further detail herein and is claimed in said co-pending application, a brief discussion of said automatic test system is included in this overview.

The automatic self test capabilities of this data transmission system accomplishes two primary purposes:

1. Monitors normal message transmission between the various system components for communication error. The monitoring is normally operating continuously during normal message transmission and provides a current indication of the data transmission reliability. Errors occurring during the current transmission cycle are identified and this information is transmitted to the computer at the beginning of the next data transmission cycle.

2. Provides a series of diagnostic closed loop tests where the loop closure connection can be established at different points in the system. Appropriate selection of the loop closure and evaluation of the response can identify a malfunction down to the system I/O conversion device. The different types of tests and a code for each are summarized in Table I. The computer can command any of the seven types of tests. When none are commanded, the TMC automatically cycles Modes 1 through 4. When Mode 4 is finished, it will recycle back to Mode 1 (Auto Recycling Test Mode).

Most of the closed loop tests are performed continuously and on-line during a test service interval between the end of one normal data transmission cycle and the start of the next cycle, as shown in FIG. 7, and will be explained in detail hereinafter. Essential elements required for closed loop test service include:

a. Establish a test connection to the device to be tested.

FIGS. 31A through 31F illustrate the elements involved in closed loop test service from the master controller to the individual system interface circuits (SIC's). The actual closed loop testing of the individual SIC's will become clear as those circuits are described hereinafter. The test connection ties the device selected for test back to the input data communication channel (input data stream). The input data communication channel transfers data from the SIC to the master controller during normal message service time. During test service time, it operates in the same manner except it is involved with the transfer of test response data back to the master controller.

Other elements in the input data communication channel are involved if the device tested is an analog device. As will be discussed hereinafter, the connection established transfers the analog signal to the subcontroller for A/D conversion to the digital domain. The resultant response is then transferred back to the master controller via the input data stream.

b. Generate the test value and transfer it to the device under test.

The source of the test value depends on the SIC device being tested:

i. If the device type is discrete bit input or arithmetic input, the test value is generated in the subcontroller upon command from the master controller and transferred to the device on the system. Two test values/device words are generated. An all ones word to verify the device can attain the logic one state—and an all zeros word to verify the device can attain the logic zero state.

ii. If the device type is analog input, the test value is the analog test value (ATV), which is generated by the computer, transferred to a D/A in the subcontroller via the output data stream, and forwarded as an analog signal to the test input of the AI Mux on the appropriate SIC.

iii. If the device type is analog output, the test value is either the ATV (Mode 5—Force Test Outputs) or the simulation program value (Mode 1—Monitor Outputs) where it is sent to the analog output device via the output data stream.

iv. If the device type is discrete output or arithmetic output, the test value is either generated by the OMA involving two test values/device word, discrete ones word and discrete zeros word (Mode 5—Force Test Outputs), or the simulation program value (Mode 1—Monitor Outputs). The test value is sent to the output device via the output data stream.

v. If the device being tested involves checking the integrity of the serial message transmission path (Mode 4 or 7), the test value is the ATV. In this situation, it is desirable to have a non-zero bit pattern in the 4 LSB of the 16-bit ATV word to exercise and verify performance of this segment of the serial words.

c. Evaluate the test response to determine if within acceptable limits.

Discrete bit words, arithmetic words and serial message transmission test words involve a bit-for-bit comparison of the response word against the test command value word (Test Value). If the comparison matches, the device is within acceptable limits. Analog response evaluation involves computing the absolute value of the difference between the test command value and the response value and comparing the result against a computer-furnished analog test tolerance (ATT). If the difference is less than or equal to the tolerance, the device is considered within acceptable limits.

d. Store test failure information for later access by the computer.

The failure information identifies the type of failure, exactly what failed and in what state, the SIC address and device word address in which the failure occurred. Identification of the above information for the computer requires storage of 4 test failure words/SIC device word.

e. Test service control.

Control for performing the four sequences described above. Control for continuing test service to the next device word on the system or with the next system. Control for resuming test service with the next SIC (or previous SIC if test service is not completed in the last update interval) in the next update interval at the start of test service. Also control for interrupting (inhibiting) test service until the computer is ready to accept new test failure data.

A test failure or normal message communication error can be detected in a very short time. Printout or display of the error via some machine/human interface is a much slower process and for this reason, normal message monitoring and test service processing must be held up after errors occur until the printout media (computer processing and resultant display) catch up with the error processors in the master controller. This inhibit function is accomplished through the use of designated bits in control words, test data word 1 (TDW 1) and test data word 2 (TDW 2), which are read and written by both the computer (DMA) and TMC.

Through use of these words, the computer can inhibit both normal message error monitoring and test service processing or enable normal message error monitoring and inhibit test service processing. By making the words interactive, the processors can be inhibited for successive update intervals, once errors in a particular update interval occurred, without further intervention by the computer.

Some analog devices may perform satisfactorily at some values but be unsatisfactory at other values. Performance must be verified through a range of values before the unit is considered acceptable. The computer must generate a range of analog test values. The TMC is organized such that the entire system is checked at one analog value and then rechecked at another analog test value. The sequence repeats until the computer informs the TMC that the system was checked with the final test value. Information pertaining to the analog test status is passed between the computer and the TMC via TDW 1 and TDW 2.

Since there is some drift and inaccuracy associated with an analog device, it will depart from the commanded value by these error factors. Consequently, performance must be based on the device attaining the test value±a given tolerance band. The analog test tolerance defines this error band and is transferred from the computer to the TMC.

The TMC stores test failure and normal message error data in a test data section of the PDM. This information is retrieved by the computer during the next DMA update interval, processed for different format, and sent to the readout device.

PREFERRED EMBODIMENT

SYSTEM APPARATUS

Computer System

The system of this invention, including all of the subsystems previously discussed, is controlled by a general purpose digital real-time computer which, although usually operating according to a particular program, may be responsive to an asynchronous event even when the computer is in the middle of processing the particular program. Digital Equipment Corporation (DEC) of Maynard, Massachusetts has a commercially available computer called the PDP-11/45 which has been found to be highly satisfactory for use with the system. Therefore, to aid in understanding of the interaction between the subsystems hardware previously mentioned (and to be described in detail hereinafter) and the PDP-11/45 computer system, the following discussion is set out. A more complete discussion concerning the operation of the PDP-11/45 system may be found in the manual entitled "PDP-11/45 Handbook", published by DEC. However, it should be clearly understood that the system of the present invention is not limited to the use of this particular computer. If a computer other than the DEC PDP-11/45 is used, the basic operational theory of the invention would remain the same although some of the interfacing details might change.

Since the present invention is not limited to use with any particular computer, it should be understood that the following discussion of the operation of the DEC PDP-11/45 is only to provide help in understanding the invention and does not constitute part of the invention except insofar as may be specifically claimed in one or more of the attached claims.

Figure 4:
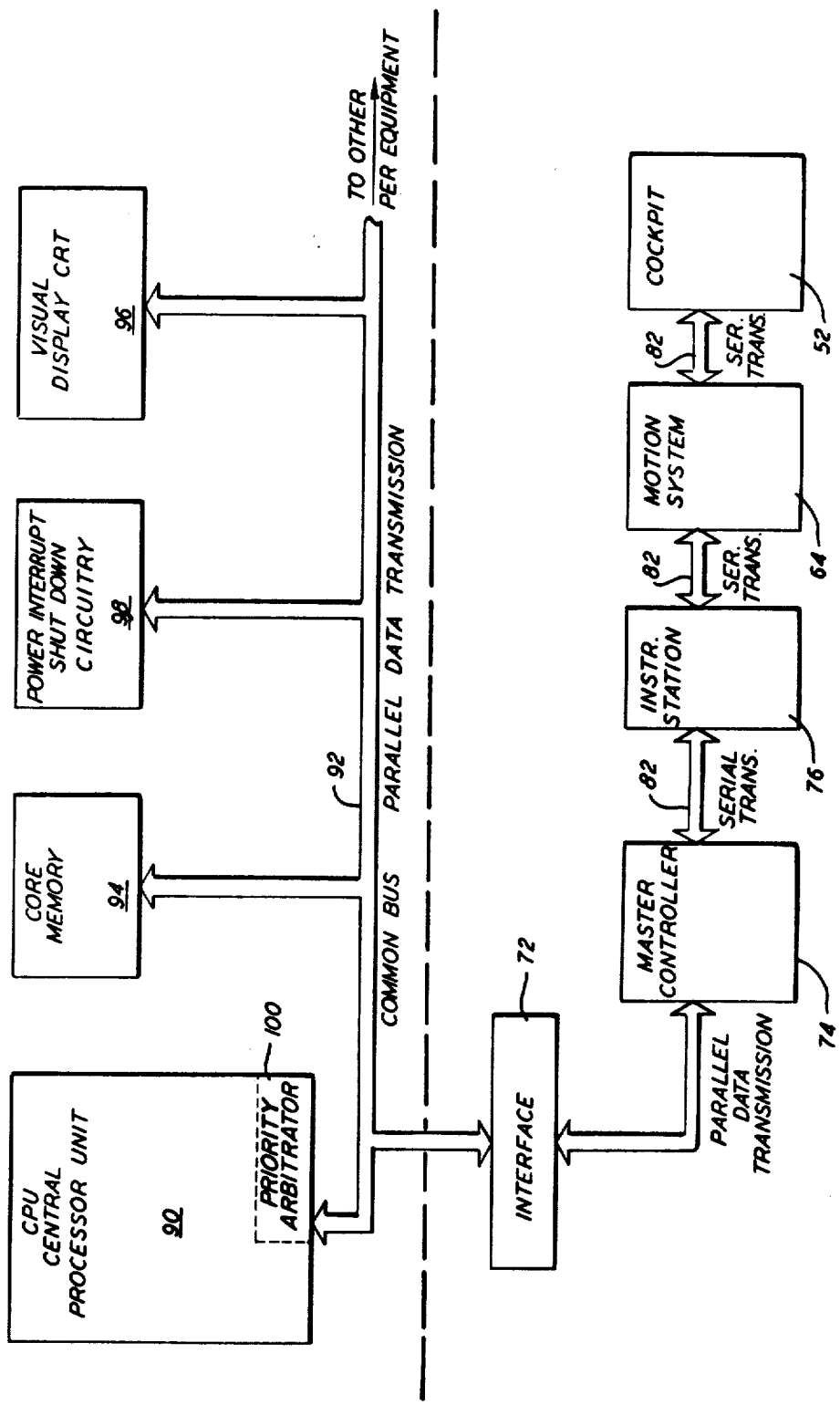
FIG. 4 is an electrical block diagram showing a typical computer arrangement suitable for use with this invention.

As illustrated in FIG. 4, CPU 90 of computer 68 utilizes common bus 92 to communicate with the interface 72 associated with master controller 74. The common bus 92 is also used to communicate directly with core memory 94 and other peripheral devices.

As with most digital computer systems, each storage location in core memory 94 has an address. In addition, each of the peripheral devices, such as master controller 74, visual display CRT 96, and power interrupt shutdown circuitry 98 also has a block of addressable registers. Therefore, CPU 90 can manipulate each of the addressable registers in interface 72 which are associated with master controller 74 as flexibly as though the registers were in core memory 94. The addressable registers associated with master controller 74 or any other peripheral device will typically include one or more 16-bit data registers and one or more 16-bit CSR's (control and status registers). Other registers often included are used for addresses and word counting. The data registers are typically used to temporarily store data transferred to or from the device; whereas the CSR's are primarily used by CPU 90 to determine the status of master controller 74 or to direct it to perform some act. Addresses, data and control information may be sent along common bus 92 between CPU 90 to master controller 74 or any one of the other peripheral devices or between master controller 74 to any other peripheral device. Thus, common bus 92 connects each one of the peripheral devices, including master controller 72 and CPU 90, in parallel.

Because CPU 90 and the peripheral devices including master controller 74 are all connected in parallel by way of common bus 92, there must be some control as to which devices are to send information and which devices are to receive information at any specific instant in time. Accordingly to the preferred embodiment, data exchanges between the computer and the master controller 74 are performed when directed by the CPU which operates under program control. However, in many instances, this exchange of data occurs after the master controller or other peripheral gains control of the common bus. In addition, the DEC PDP-11/45 has the capacity to allow the processing of a program by the CPU to be interrupted by a peripheral device and then by vector addressing to redirect the CPU to start running another set of instructions. The capacity to redirect the CPU to a new program is used when the new program to be run is so important that delay cannot be tolerated. In the present invention, the capability is used only for a few emergency-type situations. For example, if power is interrupted, this fact is sensed and control of the common bus is requested or given to power interrupt shut down circuitry 98 which redirects the CPU 90 to start processing a shutdown program. This shutdown program immediately directs the CPU 90 to store critical information contained in its volatile registers in magnetic storage so the information will not be lost. In addition to such storage, the CPU, at the direction of the shutdown program, continues to provide instructions for an orderly system shutdown. Since this shutdown is likely to be accomplished on auxiliary battery power, it must be accomplished as soon as possible.

Therefore, if control of the common bus by a peripheral is necessary for data exchange or to interrupt the CPU, the peripheral device must first request and gain access to or control of common bus 92. Whenever any device connected to common bus 92 gains control of the bus through priority arbitrator 100 contained in CPu 90, it becomes "bus master" and may then communicate with any selected device on the bus which becomes its "slave". Such communication is carried on without interruption from any other peripheral device. Therefore, communication between any two devices connected to common bus 92 is in the form of a master-slave relationship, and it is interlocked so that for each control signal issued by the master device, there must be a response from the slave in order to complete a transfer of data. Consequently, communication is independent of the physical bus length and the response time of the master and slave devices. Any peripheral device may become bus master when no other device is using the bus and if its priority is of a higher level than the priority level set for CPU 90 or the priority level of any other requesting device. However, at all other times, including all data transfers involved in normal instruction processing, CPU 90 is bus master.

As mentioned above, once a device other than CPU 90 has control of the common bus 92, it may do one of two types of operations. These operations are: nonprocessor request (NPR) data transfers which do not require the supervision of CPU 90; and interrupt operations. Normally, these NPR data transfers will be made between a mass storage device, such as a magnetic tape system, and core memory 94 or between storage buffers in master controller 74 and core memory 94. However, NPR data transfers may also take place between any of the other peripheral devices. It should be noted that the state of CPU 90 is not affected by an NPR data transfer and this is why the CPU can relinquish bus control for an NPR data transfer while an instruction is in the process of being executed. The other type of operation for which a peripheral device may make a bus request is the interrupt operation. Once a device has been granted control of common bus 92, it can request an interrupt which has the effect of interrupting the program or task that CPU 90 is presently processing. This is so that CPU 90 may then start processing another and more important program. Thus, when a peripheral device is granted bus control and then initiates an interrupt, that device having gained bus control places a "vector address" on common bus 92 which eventually operates to direct CPU 90 to the appropriate location in core memory 94 containing the new and higher priority program or service routine to be run. The essential data of the interrupt job is stored at specified locations of core 94 called "stack" and the called program is then processed by CPU 90. When the new job is completed, CPu 90 recalls the essential data of the interrupted program stored in stack and continues processing the interrupted job. It should be noted at this time, however, that a program being run in response to an interrupt may be interrupted itself by a bus request and subsequent interrupt having a still higher priority level. Thus, this still higher priority bus request may result in a third program being processed, which program has a higher priority than either of the previous two programs. If this occurs, CPU 90 will simply store the essential data of the second interrupted program in stack along with the essential data of the first interrupted program, and the third program will then be processed. Finally, of course, the originally interrupted program will be returned to in the reverse order it was stored and completed.

Figure 5:
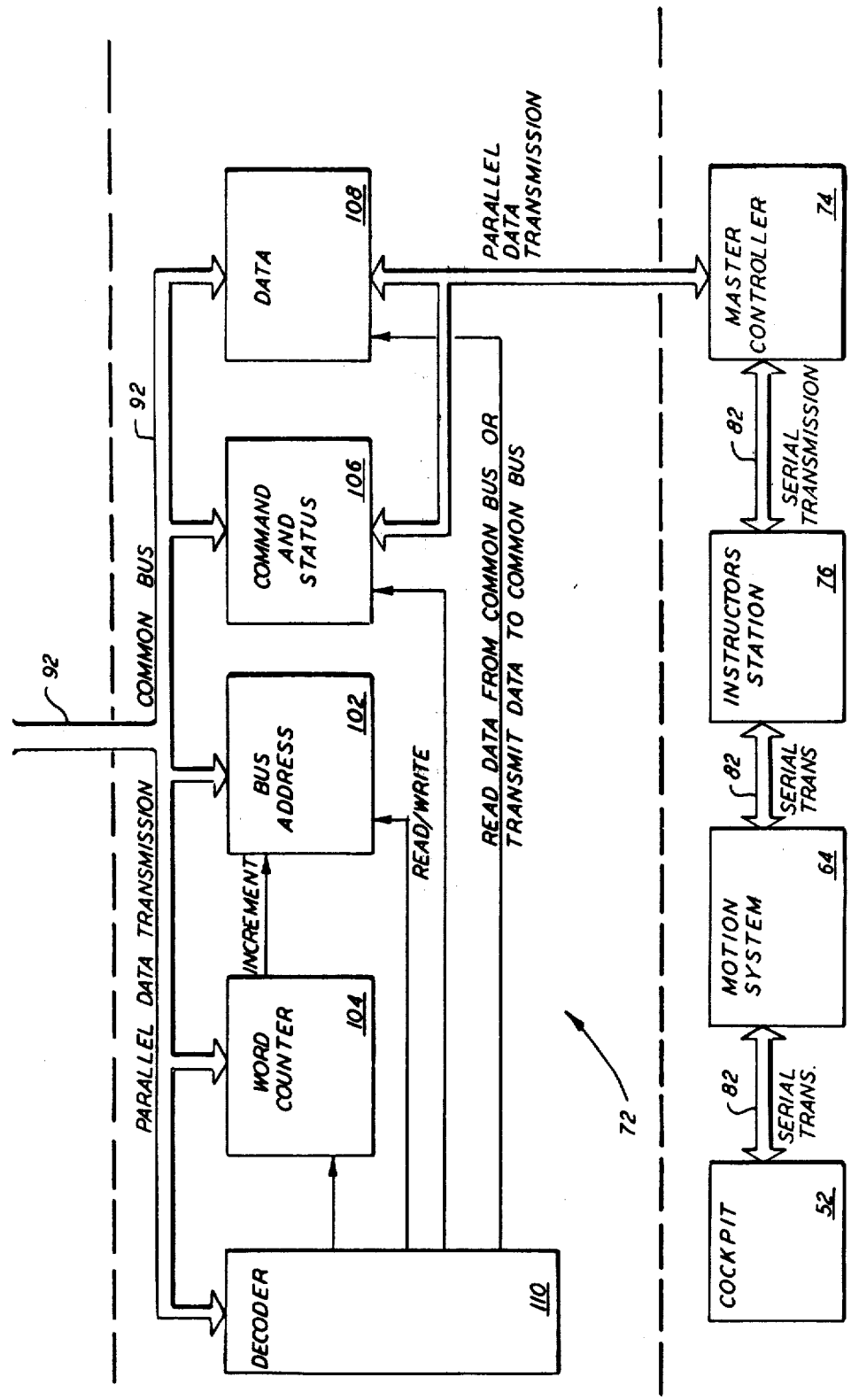
FIG. 5 is an electrical block diagram showing a typical interface circuit suitable for use with the computer arrangement of FIG. 4 and the flight simulator complex of FIG. 3.

In the present invention, a DEC general purpose interface device 72, designated as the DR-11-B, is utilized to interface the simulator system's master controller 74 with the common bus of the DEC computing system. Similarly, other DR-11-B devices are used to interface other peripheral devices with the computer common bus. Interface 72 contains all of the circuitry for requesting bus control, initiating data transfers (both to and from the master controller) and if desired, for interrupting program flow of the CPU. As shown in FIG. 5, interface 72 has four dedicated registers: bus address register 102, word counter register 104, command and status register 106 and data register 108. If the simulator needs data from core memory 94 or some other peripheral device, interface 72 performs a data transfer and loads data register 108 with the desired information from the desire core location. This information is then available at data register 108 for transfer to the input/output data memory (IODM) and pointer data memory (PDM) located in master controller 74, which memories will be described in detail hereinafter. On the other hand, if data is to be provided to core memory 94, data is transferred through data register 108 from the appropriate IODM or PDM location in master controller 74 to the appropriate core memory address. Since more than one word of data is usually transferred, the transfers continue until the specified number of words has been exchanged. Thus, address register 102 is a read-write register and, as the name implies, is used to specify the common bus address of core memory 94 or any other peripheral device which is to transmit or receive data from master controller 74. Address register 102 is normally incremented after each bus cycle and changes the address to the next sequential addressable word location. Word counter register 104 is initially loaded with the number of data transfers to be made and normally decrements towards zero after each bus cycle. The status and command register 106 is used to give commands to the master controller and to provide status indications of interface 72 and master controller 74. Data register 108 provides data from core memory (or other source) and is loaded under program control or during data transfer. All four of these registers may be loaded under program control by proper addressing, which address is decoded by decoder 110. These registers receive the data from the data lines of the common bus as shown at 92. However, it will be recalled that before any data transfer involving the master controller (or any other peripheral device) can take place, the device must obtain control of the common bus.

As mentioned above, the previous discussion concerning operations of the DEC PDP-11/45 real-time computer and associated equipment, although lengthy, is provided to help explain the operation of the overall system and does not constitute a part of this invention except insofar as this computer or any other suitable computer represents an element of this unique data transmission system.

MASTER CONTROLLER

General

Figure 6B:
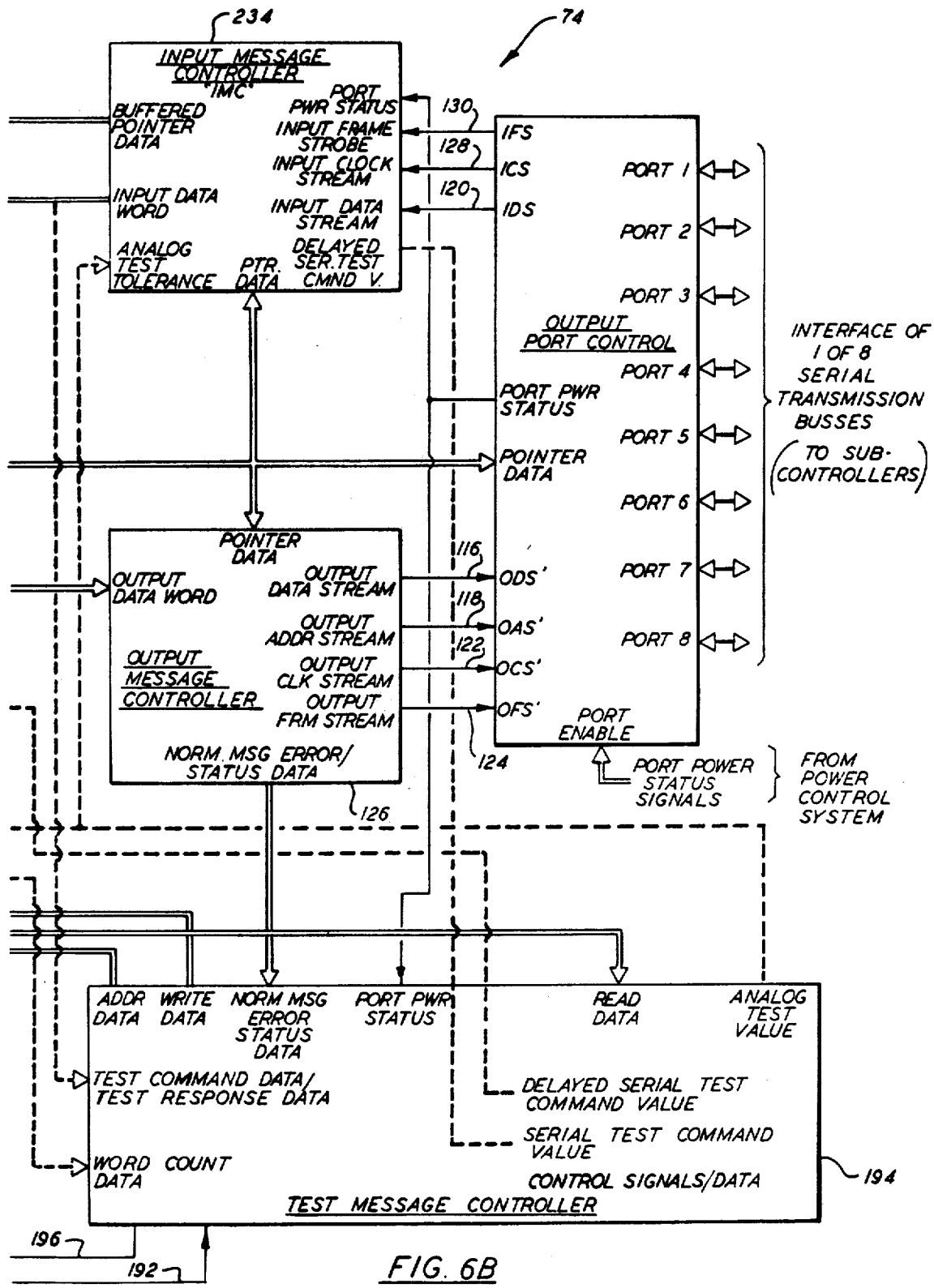

Referring now to FIG. 6, there is shown a block diagram of the master controller which is the control center for the transmission system of this invention. Also shown are the major data signal paths. The master controller is, in essence, a group of processors oriented about two memory systems, the input/output data memory (IODM) 112 and the pointer data memory (PDM) 114. IODM 112 provides temporary storage for the input/output data to the computer and is required because of the time differences in the execution and transfer of input/output data by the computer and the transfer and use of input/output data by the SIC's. PDM 114 is required because of data word format and sequence differences between the input/output data acceptable to the computer and serial message input/output data used and provided by the SIC's. PDM 114 is a control word memory that provides instructions for the translation of word format and word communication order between the computer input/output data words and the serially formatted messages transferred to and from the SIC. For example, data originating at the computer in parallel format is transferred from IODM 112 to the appropriate SIC via a serial output data stream on line 116 after the appropriate SIC has been identified via a serial output address stream on line 118. The master controller also accepts any input information that might be present from the SIC by means of an input serial data stream on line 120 and after being translated to parallel format; stores this information in an appropriate section of IODM 112. The parallel formatted data is subsequently transferred to the computer upon request.

Reliable transfer of information on the serial output data stream on line 116 and address stream on line 118 requires generation of a synchronizing signal on line 122 and a message framing signal on line 124, both of which are generated in output message controller 126, as will be discussed hereinafter. Reception of input serial data stream information by the master controller likewise requires an accompanying synchronizing signal on line 128 from the subcontroller, and a word framing signal from the subcontroller on line 130.

In addition to the two tasks of (1) transferring data between the computer and the master controller and (2) transferring data between the master controller and the SIC's, the master controller also performs the very important task of providing test service to each of the SIC's and subcontrollers at a predetermined time. The necessary test messages are internally generated and sent to the SIC's via the output data stream and output address stream. A test response is sent back by means of the input data stream where the response is evaluated by the master controller. Should the response be out of tolerance, test failure words are generated and stored in a buffer memory for transfer back to the computer at the end of the test cycle.

Referring now to FIG. 7A, there is illustrated a timing sequence of the three major events as they occur in this system. The operation begins at the computer during a first period of time referred to as the DMA (Direct Memory Access) update interval. During this interval, the computer performs one or more block input/output data transfers to the master controller, such that the contents of the computer memory and the IODM are interchanged. There are no serial transmissions between the master controller and the subcontrollers during this interval. For example, such a block transfer of data could take place in a manner similar to that described heretofore in the discussion of the DEC PDP-11/45 computer. This block data transfer may be by either reading from or writing into the IODM 112 located in the master controller (see FIG. 6). Block 132 in FIG. 7 illustrates the time used during a standard update frame by the DMA update service. The second major event, as shown in block 134, is the normal message service update which occurs upon completion of the computer input/output transfers. This time period represents the period of time that the master controller will be used to service the SIC's. Service of the SIC's by the master controller is accomplished by first accessing the PDM 114 for the identification of the SIC to be serviced, and the particular control information necessary for servicing that SIC. Further details of the contents of the data contained in PDM 114 and its operation will be described hereinafter. After obtaining the appropriate instructions from PDM 114, the memory controller then accesses IODM 112, assembles the output data according to the instructions and transfers the assembled data to the designated SIC by a serial data stream. Similarly, if there is any data from the SIC, it is translated, assembled and then placed in IODM 112 for subsequent transfer to the computer. The SIC, in turn, accepts this output data and simultaneously reads or accepts an input word from the system, if any, for transmission to master controller 74. This input data will then be sent back to master controller 74 during the next message frame via a serial data stream. The number of messages required to service the different SIC's will vary depending upon the configuration of the various SIC's. Master controller 74, after completing the service for a particular SIC, proceeds to service a new SIC as identified by a list contained in PDM 114.

When all SIC's have been serviced, master controller 74 enters the test service mode designated on the test message service period 135 which continues until a command for start of DMA update service occurs and a new cycle begins. Serial test messages to some SIC's are executed during each cycle. Testing begins with the last SIC under test in the previous update cycle if the SIC was not completely tested or with the next SIC if testing to the SIC in the previous update frame was finished, and continues until the computer requests the start of DMA update service for the NEXT UPDATE cycle. Start of the test service is identified by completion of normal message to the last SIC, and is stopped approximately 100 microseconds after receipt of the DMA update service request signal 136.

FIG. 7B illustrates a technique for providing higher update rates to critical circuits and will be discussed later.

Input/Output Data Memory

Referring again to FIG. 6, the input/output data memory (IODM) 112 is a semiconductor memory that provides buffer storage of computer output data. This computer output data may occur in any of the following formats: DBO's (discrete bit output); AWO's (arithmetic word output); and AO's (analog output). IODM 112 also provides buffer storage for the SIC input data which will be either DBI's (discrete bit input); AWI's (arithmetic word input); or AI's (analog input). The memory in this described embodiment allows the exchange of blocks of input/output data which are organized by the type of receiving or transmitting SIC. The following chart illustrates the IODM data formats and the corresponding SIC device. Further discussion of the operation of these SIC's is included hereinafter.

| IODM Data Format | SIC Type |
| --- | --- |
| AWO, DBI | DO, LO |
| AWI, DBI | DI |
| AO | AO |
| AI | AI |

The exchange of data between IODM 112 and the computer occurs at the high rate of 500,000 words per second. The exchange of input/output data between the SIC's and IODM 112 occurs at the lower rate of 55,000 words per second. A particular system could require a mixture of all device types, AO's, AI's, AWO's, AWI's, DO's and DI's. As already discussed, normal operation of the memory involves exchanging the contents of IODM 112 with computer input/output memory during the DMA update service time. The inputs, AI's, AWI's and DI's, from all SIC's transferred to the IODM in the previous normal message update service frame and stored in the IODM, are read by the computer. The outputs, AO', AWO's, DO's and LDO's, for the next normal message update frame are stored in appropriate data sections of the IODM. Serial message communication to the SIC's is normally inhibited during the DMA update interval to allow maximum access to the IODM by the computer and to prevent data synchronization conflicts such that one SIC does not transfer new data while another SIC receives old data.

However, it is possible to exchange data between the computer input/output memory and IODM 112 at lower rates during normal message service time as long as precautions are taken to avoid data synchronization conflicts.

Pointer Data Memory

The Pointer Data Memory (PDM) 114 is a semiconductor memory which provides storage for: (1) pointer data information for servicing the SIC's; (2) test control data words; (3) normal message error data words; and (4) test message failure words. The pointer data section of the memory is normally a one-time write by the computer during power turn-on sequency. Data contained in the test data/test error section, however, may be transferred to and from computer memory during the DMA update interval.

Memory Controller

Figure 8B:
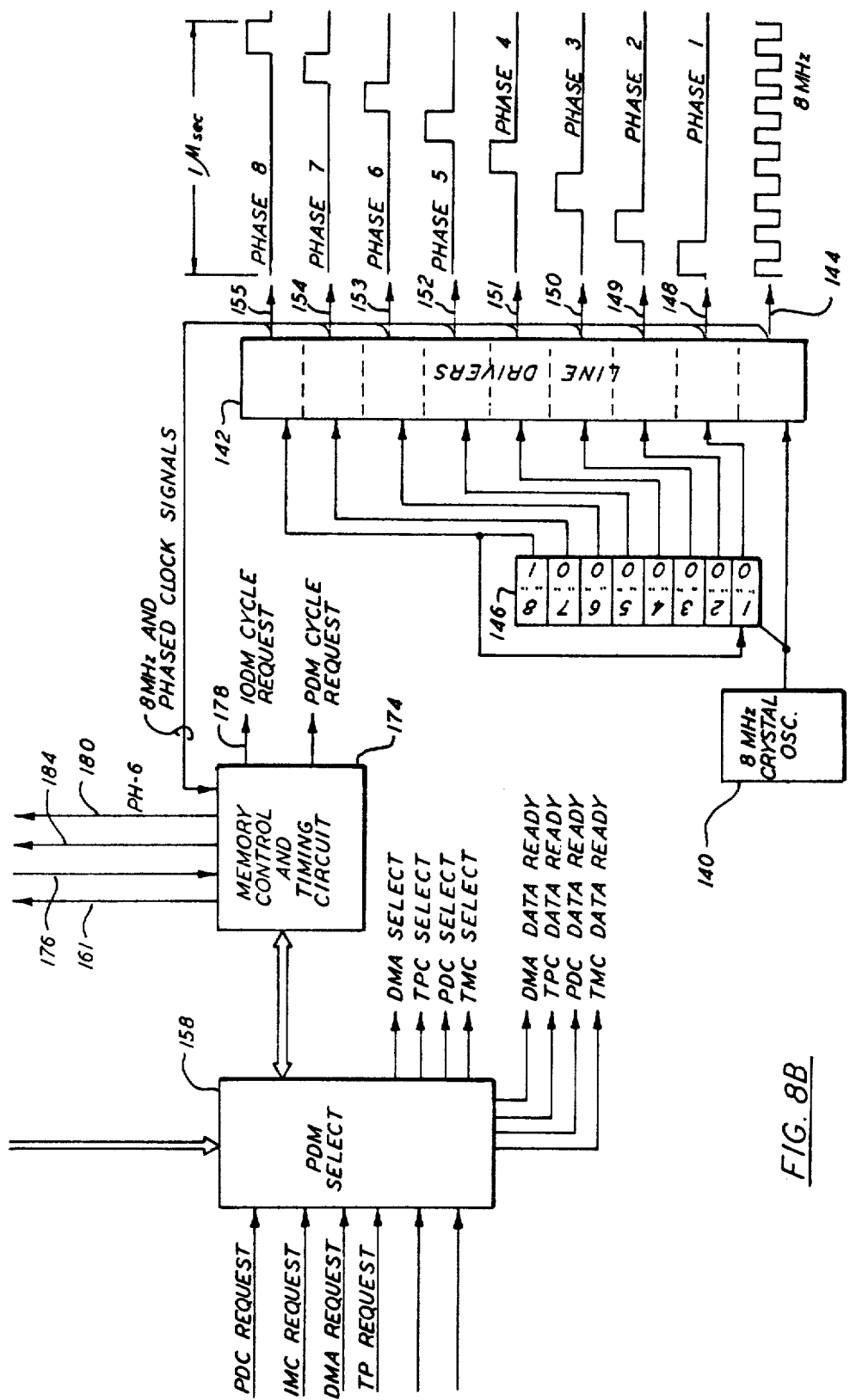

The primary purpose of the Memory Controller 138 is to control the access of both memories, PDM 114 and IODM 112, by means of priority logic (some memory users have higher priority access than others). Consequently, memory controller 138 has three major functions to perform. These include: (1) providing the 8 MHz system clock pulses and the 8 phased 1-MHz clock pulses used for timing all master controller functions; (2) generating the memory timing signals for accessing on a priority basis IODM 112 and PDM 114 by other subsystems making up the master controller; and (3) multiplexing the read and write data bases available by generating the interconnecting control signals for the users of IODM 112 and PDM 114 to allow the memory user to connect to the correct memory address bus and memory data write bus at the time memory service is generated for the requesting user. The block diagram of memory controller 138 is shown in FIG. 8. In the present embodiment and as will be discussed hereinafter, the TPC (test panel controller) and the DMA (direct memory access) are the only users having the capability of accessing both IODM 112 and PDM 114.

The basic clock rate for master controller 74 is an 8 MHz square wave. This is generated by crystal oscillator 140, the output of which is buffered by a line driver 142 which provides the 8 MHz signal on line 144 for distribution to other systems in master controller 74. The 8 MHz output from crystal oscillator 140 is also fed to the clock input of an 8-bit shift register 146. The input to shift register 146 is such that whenever the first seven stages are in the "0" state and the last stage is in the "1" state, a "1" is introduced into stage one in the next time period. Register 146, therefore, continuously recirculates a logic "1" through its eight stages. The resulting outputs are, therefore, each in succession in the "ON" or "1" state for one clock period and then in the "OFF" or "0" state for seven clock periods. These 8 phased clock streams are buffered by the line drivers 142 to provide the eight phases (PH-1 through PH-8) on lines 148–155 for distribution to master controller 74. The timing diagram at the output of the line driver 142 illustrates the timing of the 8 MHz phase signal and the 8 phased 1-MHz signals.

The memory logic control consists of two sections. The IODM select section 156 controls the interface of IODM 112 and the PDM select section 158 controls the PDM 114 interfacing. Since the operation of both logic circuits is the same, the operation of IODM select section 156 will be described first and this description followed by a very brief description of PDM select section 158.

IODM select section 156 consists of an input request register 160 followed by a priority network 162 which, in turn, is followed by a request in process register 164. All pending requests for IODM service are loaded into input register 160 at the trailing edge of the PH-4 clock pulse received on line 161.

When the requests have been loaded into input register 160, the priority is evaluated by priority network 162. The highest priority line 166 goes through directly, the next line goes through unless the higher one is requesting service, in which case it is held up, and so on for the remaining lines. Therefore, there are outputs 166 through 173 from priority network 162 corresponding to each of the inputs but only one of these outputs can request service at any one time. All of the outputs are monitored by memory control and timing circuit 174, as shown on line 176, and if any of them is requesting service, the IODM cycle request signal is sent to the memory via line 178 coincident with the PH-8 clock stream to initiate the next cycle.

The information on appropriate service request lines is loaded into the request in process register 164 at the trailing edge of the data ready signal which is coincident with the PH-6 clock stream and is received on line 180. Since the output of request in process register 164 is service granted signals to the user, this signal should go to "ON" for the selected subsystem at that time. Following this, the user will remove the request signal unless access is again required. The data ready signal is gated with the output of this register by means of gate 182 so that a data ready pulse is sent to the selected subsystem at the end of the memory cycle. An address signal on line 184 is gated with the outputs of priority network 162 beginning at the leading edge of the PH-7 clock stream and ending at the leading edge of the PH-3 clock stream. This signal is used by the selected subsystem to place a memory address on the address bus.

There are six users of IODM 112. They are, in order of decreasing priority, AI circuits and DI circuits which are located in the input message assembler (IMA) 186; AO circuits and DO circuits which are located in the output message assembler (OMA) 188; and direct memory access (DMA) circuits and test panel controller (TPC) circuits. The DMA circuit is discussed hereinafter; however, the TPC circuits which allow for limited operation and checkout of the system without the computer are not necessary elements of this invention and will not be discussed further. The DMA and TPC select outputs are gated with the corresponding PDM select outputs in order to prevent the issuance of a cycle request to the IODM if a PDM request is presently being honored. For the PDM 114, there are four users. In order of decreasing priority, these are: DMA, PDC, TMC and TPC. The operation of the PDM select circuitry 158 is the same as for the IODM select circuitry except that the requests are loaded into the register at the trailing edge of the PH-4 clock pulse.

Direct Memory Access

As shown in FIG. 6, direct memory access (DMA) interface 190 provides the communication link between the computer and master controller, handles all computer interface timing and control, and accomplishes any necessary data reformatting between the systems.

A normal DMA update begins upon receiving the command from the computer for the first block transfer of data between the computer and master controller 74. In response to the receipt of this update command, DMA 190 sends a service signal on line 192 to the test message controller (TMC) 194 to terminate the test mode (time period 135 as shown in FIG. 7A). When processing of the current test message has been completed, TMC 194 will then provide a current test message complete signal on line 196. After the current test message complete signal has been received, the computer will then make the required number of block transfers between computer memory and IODM 112 for the normal update. The computer will then issue a command to DMA 190 indicating that the last data block has been transferred. DMA 190 will then issue a service initiate signal to the service identification control logic in PDC 200 which initiates the normal serial message service.

In addition to normal message service to a system, the computer may also command "special message" data transfers to update SIC's at any time from 200 microseconds after DMA update service is completed to 2 milliseconds before the start of the next DMA update service request. Such "special message" update service to the SIC's is typically associated with an update of data between the DMA and the computer, referred to hereinafter as "DMA Refresh". The timing for a typical "special message" update and the corresponding "DMA Refresh" is illustrated in FIG. 7B and will be discussed hereinafter.

In general, the interface between DMA 190 and the computer must provide for the following: (1) input data from the master controller to the computer, (2) output data from the computer to the master controller, (3) commands from the computer to the DMA to define the nature of the transfers, (4) status from the DMA to the computer where required, and (5) control signals for controlling the transfer of all the above information.

The above requirements do not always require separate sets of transmission lines between the computer and the DMA. Data may travel in both directions, and commands and status may also share one set of bidirectional lines defining the nature and direction of each transfer. The exact means of providing these functions will generally depend on the computer.

The information in IODM 112 and PDM 114 memories is stored in 16-bit words. Depending upon the computer again, this may correspond to two 8-bit words or one-half 32-bit words, etc.

While the exact nature of the interface will change from one computer to another, the control signals must provide for at least the following:

1. Data word/command word—to tell DMA 190 whether the data being transferred is an instruction transfer to define the subsequent data transfer or is an actual data transfer.

2. Input/output—to define whether the subsequent transfer will be an input transfer or an output transfer.

3. Normal input/output transfer—the subsequent transfer is a normal DMA update and is not a DMA Refresh.

4. DMA Refresh transfer—the subsequent transfer will be a DMA Refresh data transfer.

5. Special message SIC address—to identify the SIC address for which a special message is to be executed shortly after receipt of the special message command by the DMA.

A special message transfer and the corresponding DMA Refresh update cycle is as follows. Referring now to FIG. 7B, it can be seen that the computer will first make the required block transfers to update the desired data as is shown at time period 134. It will then send a special message SIC address word to DMA 190. This word contains a SIC address output port identification and a word bit indicating a special message transfer is required. As will be discussed hereinafter, this data will be used by the pointer data memory (PDM) 114 as word 6 to set up a serial message transfer between master controller 74 and the appropriate SIC. During the normal message service time block 134, messages to high update rate SIC's are executed first. IODM start address for these SIC's are organized such that data is stored and retrieved from the top of the data block list, e.g., AO data occurs at top of AO block in IODM, DO data at top of DO block in IODM, etc., to allow for minimal block transfers during DMA Refresh interval 198 which occurs at a selected period during the normal message service period 134. Messages to high update rate SIC's are then repeated upon completion of DMA Refresh interval 198. Upon completion of this repeat message service, normal messages to standard rate SIC's are continued.

6. Last block—terminated normal update service and initiates serial update.

Pointer Data Controller

The primary purpose of the pointer data controller (PDC) 200 is to control the processing of that pointer data required for establishing serial message service to each SIC. For normal service, the process involves retrieving a small segment of the pointer data for a particular SIC and evaluating this data to determine whether serial message service to this circuit should occur in the current update frame. In the present embodiment, the small segment of data for such evaluation is "Pointer Word 6". This preliminary evaluation allows the time period between updates to be controlled according to the needs of each SIC. If update is not required, the system then retrieves a similar segment of pointer data for the next SIC and repeats the evaluation. When a circuit does require service, PDC 200 retrieves the remaining pointer data for that SIC and holds it in buffer storage. The controlled data is then provided to the appropriate master controller circuits upon completion of serial message service to the previous SIC. Similarly, PDC 200 provides pointer data for test service to each SIC. However, for test service, each SIC is serviced in sequence and no preliminary evaluation need be made. If testing of all SIC's has not been completed when a new DMA update cycle begins, the address of the last SIC tested is stored so that testing will begin on the next SIC in sequence when the test phase of the next cycle is initiated. Pointer data is also available in PDM 114 for "special message service" to SIC's when specifically requested by the computer. Therefore, PDC 200 also contains pointer data for those specific computer requests. As was mentioned heretofore, "special message service" can be executed during the test service interval by interrupting the "test service". The serial service to the SIC commanded by the special message address after completion of the test service message of the SIC being tested, but before a new SIC is tested.

Therefore, PDC 200 is a key element in the master controller processing chain in that it:

(1) retrieves pointer data for normal message service, test message service or special message service, whichever is appropriate;

(2) closes the loop for continuing service by initiating serial message service for the next SIC; and (3) provides identification of the last SIC tested in the previous update frame and, consequently, the next SIC to be tested in the current update frame at the start of the test message service.

Figure 9A:
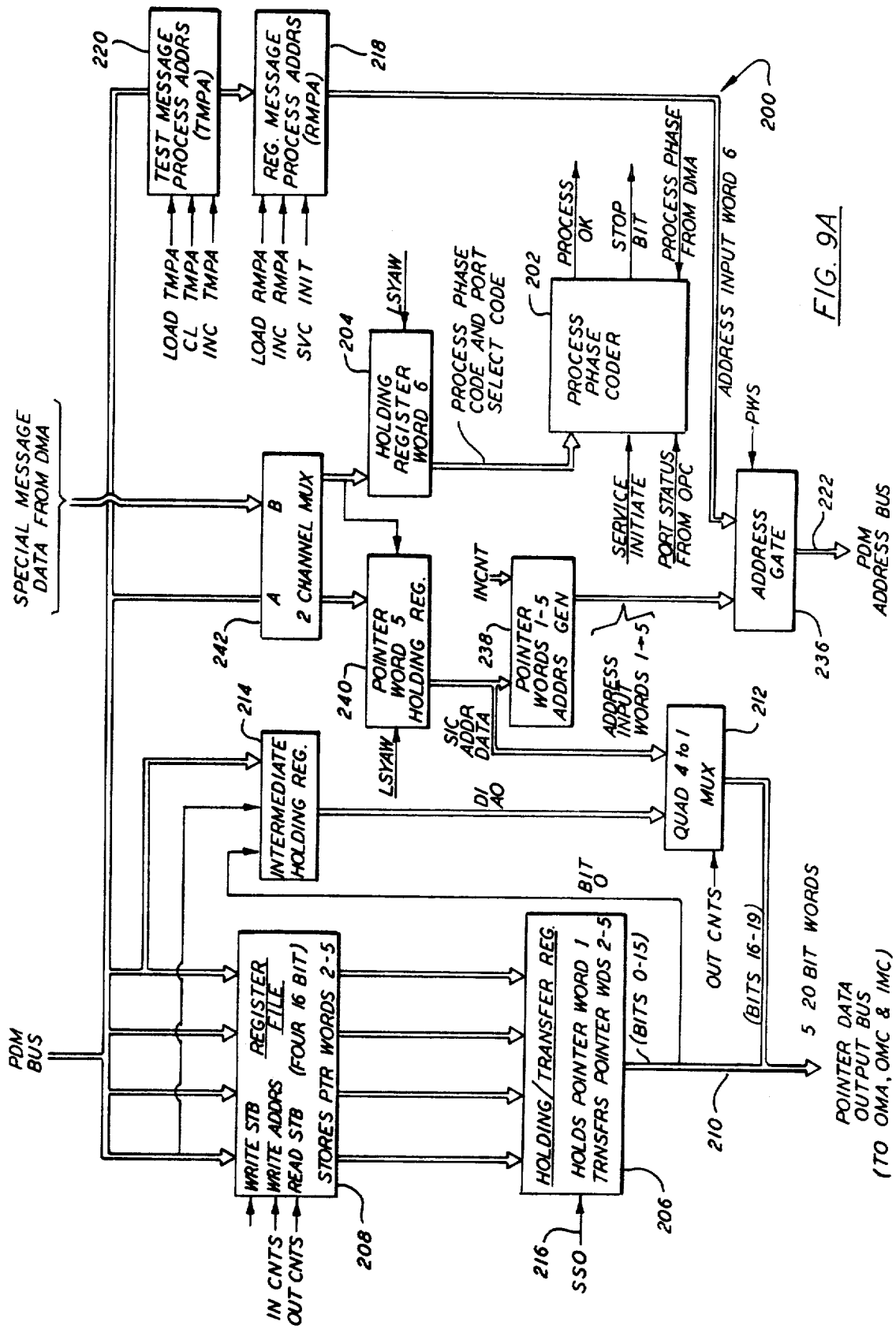
Figures 9B, 9C:
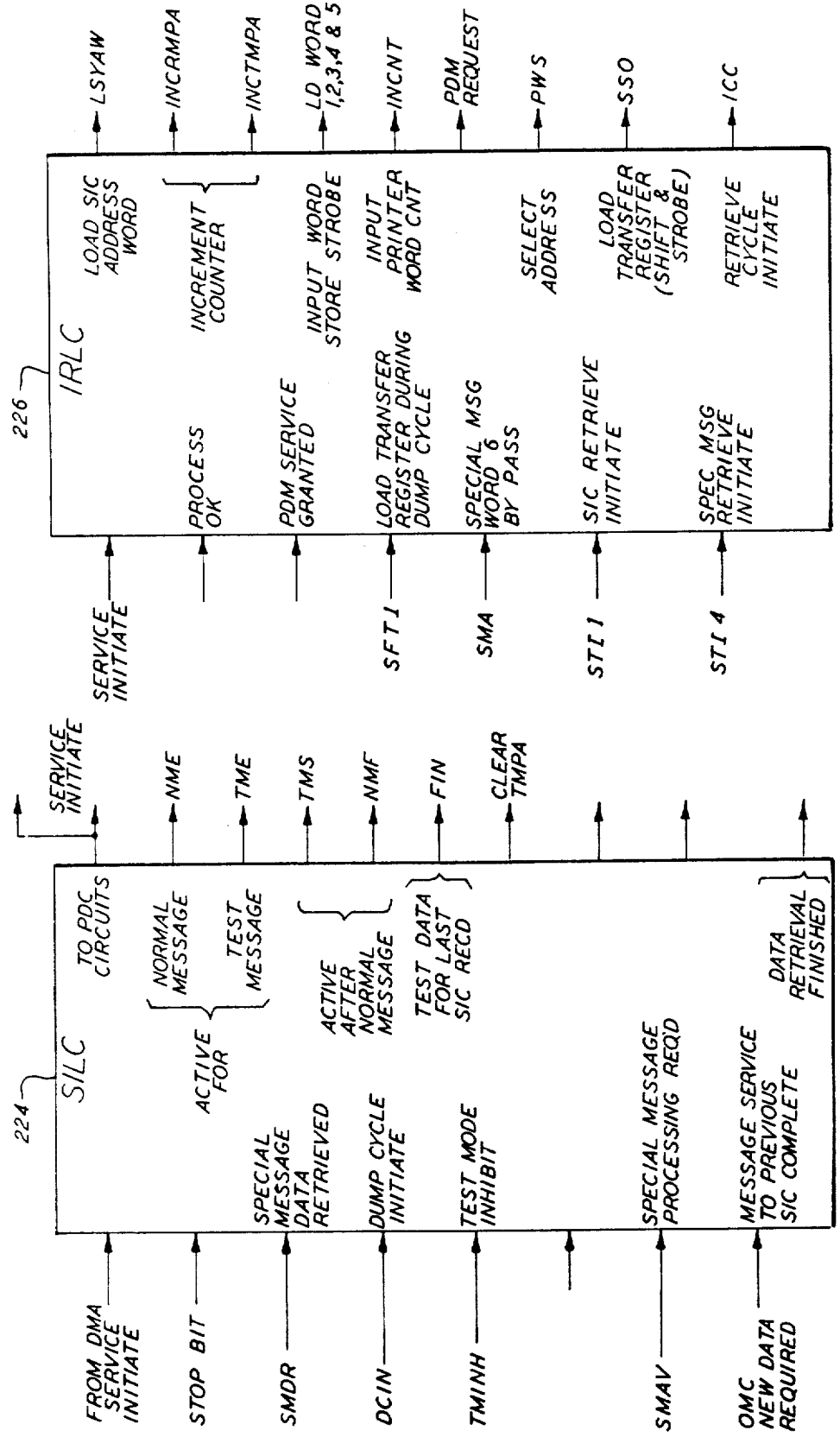

Referring now to FIG. 9, there is shown a block diagram of the major elements on the pointer data controller. Briefly, PDC 200 operates as follows: Pointer data for each SIC is stored in PDM 114 as six 16-bit words. As shown in FIG. 10, all pointer words 1, pointer words 2, etc., are stored in separate blocks of the PDM and are called input pointer words. Retrieval of data from PDM 114 for normal service starts with pointer word 6, where the SIC process evaluation is performed by process phase decoder 202. If the SIC is a processing candidate, that is, the SIC is to be serviced, a Process OK signal is generated by decoder 202 and the retrieval continues, commencing with pointer word 1 and terminating with pointer word 5. For "test service" or "special message service", this preliminary evaluation does not occur and retrieval takes place without waiting for the evaluation. Pointer word 6 is stored in a 16-bit holding register 204. Pointer word 1 is stored in a 16-bit holding register 206 after first being transferred through the 4×16 register file 208. Pointer words 2-5 are then stored in addresses O-3 respectively, of the 4×16 register file 208.

Figure 11:
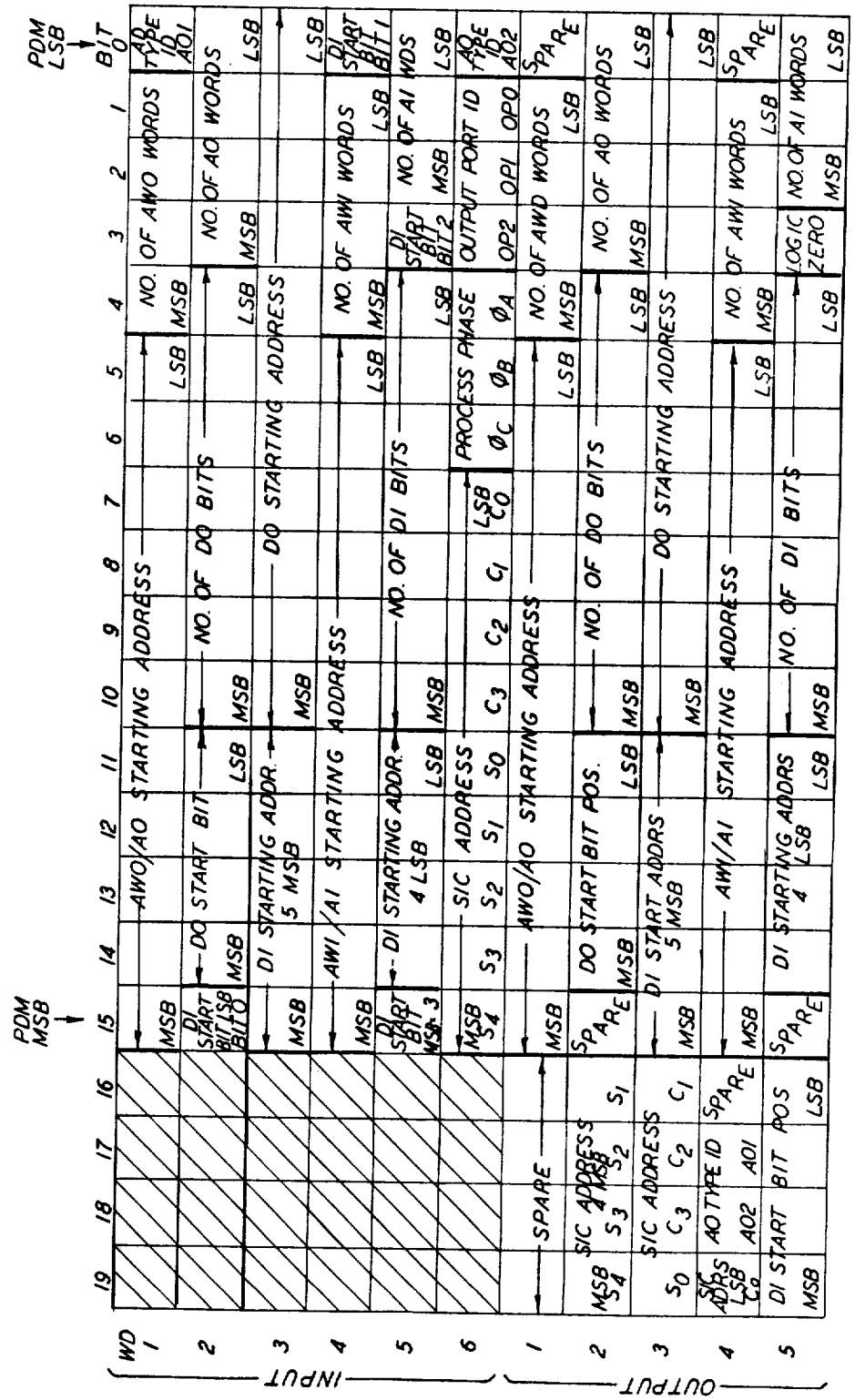
FIG. 11 represents the reorganization of parallel control data received from the storage memory shown in FIG. 10 into a form suitable for use by the various circuits of the master controller.

The pointer data will subsequently be output to the rest of the master controller on line 210 as five 20-bit words during the pointer data dump cycle. The 20 bits forming the output words include bits 0 through 15 from register 206 plus the four most significant bits which are generated by quad 4:1 multiplexer 212. Information to multiplexer 212 includes the SIC address data, DI starting bit position and AO type bits. These latter two parameters represent values stored in an intermediate holding register 214 during the retrieval cycle. FIG. 11 contains a description of the resulting 20-bit pointer data word formats. In the format shown in FIG. 11, the four most significant bits of output word 1 are spare, and the four most significant bits of the remaining four words contain the addresses and DI and AO starting bit information.

Output of the pointer data during the dump cycle involves: (a) reading output pointer word 1 from register 206 by the master controller subsystem (OMA, IMA and OMC as discussed hereinafter) which is connected to output pointer data bus 210 in response to a load word 1 (LDWRD 1) command, (b) commanding register file 208 to reach address 2, and (c) transferring this data to output register 206, upon receiving shift and strobe (SSO) signal on line 216, and (d) generating the appropriate signal, load word 2 (LDWRD 2), to command the other master controller subsystem to again read register 206 for pointer output word 2 by another SSO signal, and then repeating the operation for addresses 3, 4 and 5 by generating load word 3 (LDWRD 3), load word 4 (LDWRD 4) and load word 5 (LDWRD 5), after which the dump cycle terminates.

Therefore, it is seen that retrieval of pointer data for a SIC first involves retrieval of the SIC control word 6 or data as furnished by the computer during a special message request which contains the SIC address. The SIC address is then used as an address index to which five address constants are added to yield the PDM address for pointer input words 1-5. The pointer word 6 PDM address is obtained from one of two sources. These are: regular message process word address counter 218 or the test message process word address counter 220. Retrieval of pointer data for special message service does not involve retrieval of the SIC control word 6 since the special message control data word from the computer represents the SIC control word 6.

The regular message process word address (RMPA) counter 218 functions as an upcounter, starting from count zero and going to the STOP BIT count which represents the last address for pointer word 6. This occurs during the normal message service time period. During test service time, couner 218 functions as a transfer register, coupling the test message process word address (TMPA) counter 220 to the PDM address bus 222.

Before pointer word 1 is retrieved, the process phase code and port code data in pointer word 6 are evaluated. If the SIC is associated with an output port not being used as indicated by the port status signal, or the process phase code does not match the process phase counter count, the SIC will be rejected as a candidate for serial message update service in the current update frame. In this case, the RMPA counter 218 will be incremented and pointer word 6 at the next higher PDM address will be retrieved for a similar evaluation. No determination that update service will not take place will occur for test message service and special message service. Update always occurs and pointer words 1-5 are always read for test memory service or special message service. It should be noted, however, that process phase decoder 202 always monitors the phase code for zero in response to which it provides a STOP BIT output.

When the process phase and the port select conditions are met, a Process OK status is granted and the retrieval of pointer words 1-5 begins. The address source for pointer words 1-5 is a SIC address segment of pointer word 6 and five address constants derive from the input word counter. Note that during test service, the process phase evaluation is bypassed. The SIC during test time is treated as a process everytime candidate.

As illustrated in FIG. 9, there are several logic control circuits included with the PDC 200 which generate command signals on an event sequence basis. That is, command signals are generated immediately, or after a specific time delay, in response to receiving one or a combination of signals, and operate substantially as a read only memory. These logic circuits include service identification logic control (SILC) 224, input data retrieval logic control (IRLC) 226, output data dump request logic control (ODRLC) 228, output data dump cycle logic control (ODCLC) 230, and special message process logic control (SMPLC) 232. As shown in logic control circuit 224, a process code of zero which results in a STOP BIT output from process phase decoder 202 identifies that the previous set of pointer data retrieved was for service to the last SIC. If the STOP BIT occurs while the normal message service is active, as indicated by a normal message enable (NME) signal from SILC 224, then retrieval of pointer data for test service to SIC's will be initiated. This results in a test mode select (TMS) signal, and TMPA counter 220 will be connected to the PDM 114 address bus. The retrieval of pointer data for test message service will then begin. If the STOP BIT occurs after the normal message service is finished or test service is in progress, as represented by signal NME, then the signal FIN will be generated, signifying pointer data for test service to the last SIC was retrieved in the previous retrieval cycle. The pointer data retrieval cycle will then shut down for the remainder of the update frames except for further special message services, if such a request occurs.

Service type identification control 224 of the PDC 200 controls the service mode for the master controller and consequently the type of information on the serial message streams. The service modes are: Normal Message Service, Test Message Service and Special Message Service. They are identified to the rest of the master controller SIC's via two primary signal lines, Normal Mode Enable (NME) and Test Mode Enable (TME), and via two secondary control lines, FIN (Last SIC Tested) and Normal Mode Fin (NMF). When NME is active, TME will be inactive and vice versa.

External to PDC 200 (except for the DMA 190 and the test memory controller (TMC) 194), there is no distinction between normal message service and special message service. The external serial message processors (OMA 188, OMC 126 and IMC 234) perform the same type of processing for either service. IMA 186, however, is shut down during test message service. TMC 194 identifies special message service from the sequencing of NME and TME signals. It is required to do so in order to reinitiate test message service after a special message is completed if the special message interrupted test message service.

There are three types of information on the serial data streams. These are: normal message data, test message data and inactive message data. These are inserted on the streams by OMC 126 through the control of the PDC. Dump of pointer data when NME is active results in normal message data communications. Dump of pointer data when TME is active involves test message data communication.

The normal mode is activated first in each update interval, followed by activation of the test mode. The sequence of operations is as discussed heretofore. The NME does not become deactivated until completion of the serial message to the current SIC. NMF, however, becomes active shortly after dump of pointer data for normal message service to the last SIC, i.e., when the STOP BIT is retrieved while NME is active.

Other pertinent operating details of the service type identification control signals are indicated on logic circuit 224. FIN identifies that either pointer data for the last SIC to be tested has been retrieved (STOP BIT occurrence during TME active).

TME being active does not necessarily means there will be test message data on the serial streams. FIN being active will prevent further dump of pointer data. The dump cycle is inhibited as soon as either of these becomes active. When this occurs, inactive message data will be on the serial message streams upon completion of the last active serial message.

As shown by the IRLC 226, after a PDM service request signal has been granted to PDC 200 in response to service initiate signal, and the PDM address received from address gate 236 via bus 222, the LSYAW (Load SIC Address Word) signal is generated and sent to holding register 204 and PDM 114 for the retrieval of pointer word 6. Logic control 226 holds off making further requests until the pointer word 6 is evaluated. If the SIC is to be skipped, as determined by process phase decoder 202, the selected process word address counter is incremented by the appropriate signal (INC RMPA or INC TMPA) and then another request for the next pointer word 6 is made. This sequence continues until a Process OK status occurs, after which five successive accesses to PDM 114 are executed retrieving pointer words 1-5. The addresses to these words are generated from the address portion of pointer word 6 and generator 238. Upon retrieval of pointer word 5, the retrieval cycle is shut down.

Figure 12:
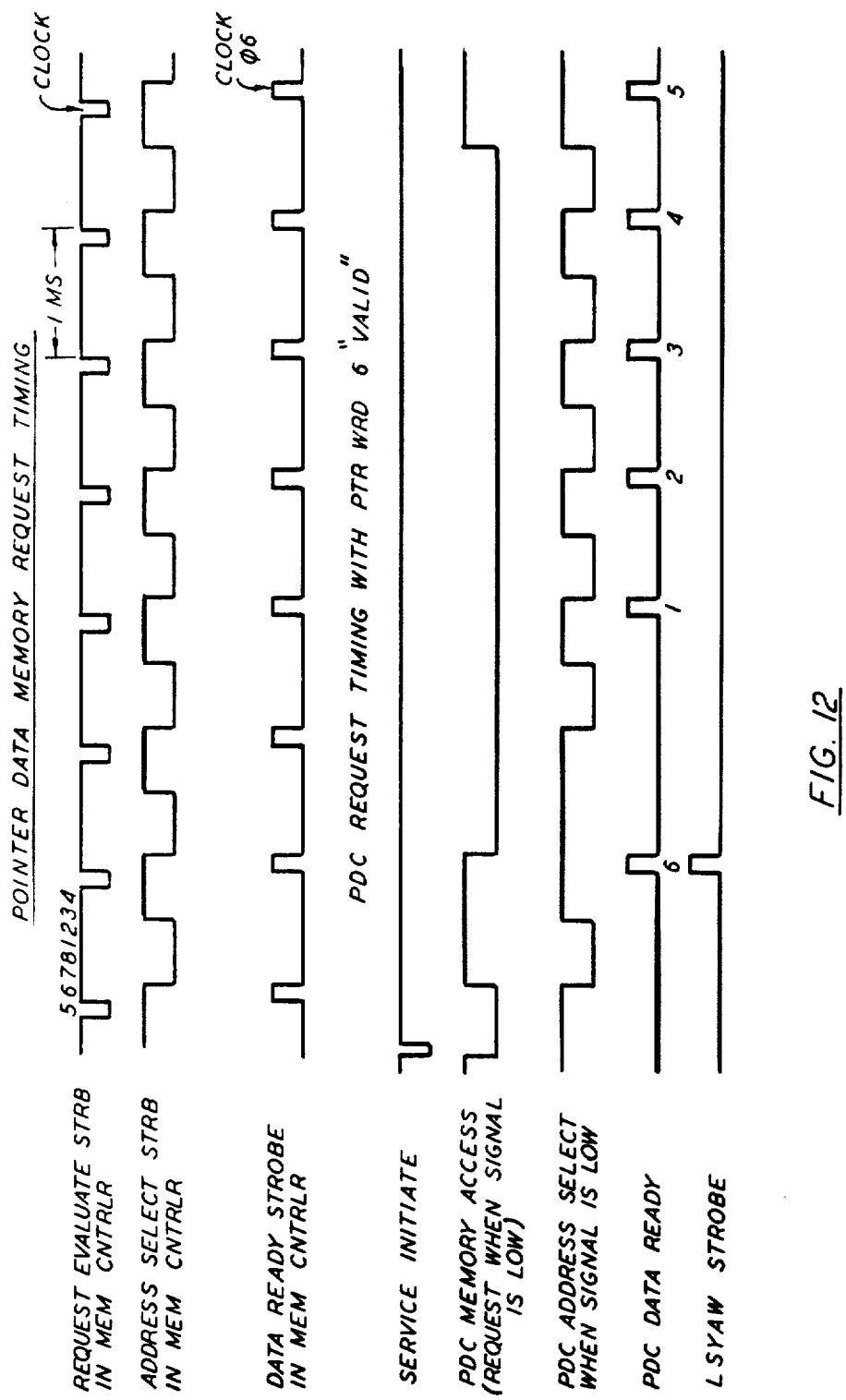
FIG. 12 is a timing diagram of the operation of one of the master controller circuits.

A timing diagram for the PDC interface to PDM 114 is shown in FIG. 12. The PDM select section 158 of memory controller 138 evaluates a PDC access request, and recognizes it if the request occurs during clock phase 5. The address select strobe and data ready strobe are then provided to the PDC at the proper clock pulse as was discussed heretofore. Note that after access request occurs for retrieval of pointer word 6, the request is discontinued as soon as the memory cycle for retrieval of pointer word 6 starts, causing a skip of the next available memory access cycle to allow the process phase/port code decoders to perform the evaluation on the pointer word 6 data. If the Process OK status is not achieved, RMPA is incremented and PDM is again accessed for retrieval of the next pointer word 6. Once the Process OK status is achieved, the memory access request is continued for the retrieval duration of pointer words 1-5 and then the access request signal is discontinued after memory cycle for retrieval of pointer word 5 commences. This occurs on the clock pulse phase 3.

The leading edge of the PDC data ready strobe stores pointer word 6 in holding register 240 and increments the RMPA counter 218 or TMPA counter 220. The trailing edge generates a second strobe that serves as a secondary function during pointer word 6 data retrieval and is primarily used for the retrieval of the next pointer word 1 to advance the count from count 0 to count 1 to change the PDM address to pointer word 2.

Transfer of pointer data from buffer storage in the PDC to output register 206, which is connected to a pointer data output bus, will be referred to hereinafter as the "dump cycle".

As shown in ODRLC 228, there are five sources which can make a dump cycle request. These are: (1) Normal Message Service Dump Request, (2) Test Message Service Dump Request, (3) First SIC Service during Normal Message Service Dump Request, (4) Test Message Service Dump Request after completion of special message that interrupted test service, and (5) Special Message Dump Request after normal service finished and test service finished or inhibited.

A dump request during normal message service occurs at the end of the normal message communication to the previous SIC. The first SIC serviced for normal message service request occurs after the input data retrieval sequence is complete and upon occurrence of the next output frame strobe one.

When a special message interrupts test service, the TMC New Data Request source is shut down and can only be reactivated by occurrence of the next dump cycle.

The special message dump request after normal service finished and test service finished or inhibited is contained partially in this subsystem and in the Special Message Process Control Subsystem. That portion in this subsystem involves the inhibit of a special message dump cycle if special message pointer data was retrieved but could not be output because a request for the next DMS update service interval occurred.

The pointer data dump request control circuit is inhibited upon occurrence of the DMA update service request signal. This signal prevents the generation of further dump cycle initiate signals until the beginning of the next update interval (Occurrence of Service Initiate Strobe). The dump request control circuit is also in an inhibit (shutdown) state after normal message service is finished and test service is finished or inhibited. It can be reactivated, however, by a special message service request as long as the DMA updata service request signal is inactive.

Send Next Word (SNW) identifies the end of serial message communication to a particular SIC. It is used by the special message process control to identify the special message communication to the SIC is finished. It is also used by the dump request control circuit as a reset signal. Once SNW has occurred, a new dump request signal must occur (input request sources must transition back to idle state and then to active state) to cause execution of another dump cycle.

As shown by ODCLC 230, during the dump cycle 5, read signals are generated (LDWRD 1 through LDWRD 5) by Input Data Retrieval Logic Control 226 for use internal to PDC 200, and PTR STRB 1 through PTR STRB 5 by Output Data Dump Cycle Logic Control 230 for use by the OMA, OMC, IMC and OPC, identifying when to read each of the five pointer output words. Key requirements of the dump cycle are:

1. The dump cycle begins at the start of a message word frame to allow the OMA maximum word assembly time for the first output word.

2. A set of valid input data has been retrieved and stored in the buffer registers/register files, i.e., words 1–5 have been received and stored.

3. The dump cycle is inhibited if the DMA updata service request signal is active or normal message service is finished and test message service is finished or inhibited and no special message service is requested.

A first dump cycle occurs after the input data retrieval sequence (discussed heretofore) is complete and upon occurrence of the next output frame strobe. Completion of the dump cycle initiates the next retrieval cycle, thereby resulting in continuing service to successive SIC's.

The dump cycle sequence, as previously discussed, involves reading the output pointer word 1 from register 206, commanding register file 208 to read address 2, transferring the address 2 data to output register 206, and generating the appropriate signal to command the other master controller users again to read register 206 for pointer word 2, and repeating operation for addresses 3, 4 and 5. The pointer output data read strobes are generated by clock phase 6 by ODCLC 230. The register file 208 to output register 206 transfer occurs with the leading edge of clock phase 2, while the out counter of register 208 increments with the trailing edge of clock phase 2. It should be understood that register file 208 has both read address and write address inputs, and that during the retrieval cycle, the read address must be forced to address 0 to allow input word 1 to be transferred through the register file to holding register 200. The dump cycle starts with phase 4 so that PTR STRB 1 occurs first, then the transfer of register file read address 2 when ODCLC 230 outputs the SFT-1 signal, then the incrementing of out counter to count 3, where the sequence repeats with generation of the next PTR STRB 2. The out counter was cleared during the previous retrieve cycle as access was made to the PDM 114 for retrieval of pointer word 1. Clearing of the out counter in register 208 was necessary so that pointer word 1 could be transferred through the register file to the output pointer register 206. The dump cycle terminates upon occurrence of PTR STRB 5. The dump cycle is also held in a terminated state when normal message service is finished and test service is finished or inhibited.

A special message is established by computer control where the equivalent of pointer word 6 is output from the computer through DMA 190 to PDC 200. SMPLC 232 shows the signals produced by the event sequencing of this logic circuitry.

Retrieval of special message data begins after the pointer buffer register is empty. The empty status is obtained at the end of the next dump cycle if normal message service or test message service is in progress. If normal message service or test message service are already finished, the buffer is empty and the special message retrieval cycle starts immediately.

When the special message pointer data retrieval cycle begins, operations in the input data retrieval control are modified to bypass the retrieval of pointer word 6. The special message pointer word 6 data from DMA 190 is transferred to the pointer word 6 holding register 204 by means of two channel multiplexer 242. In addition, one of the process code bits is forced high to prevent generation of a STOP BIT condition. The process OK signal is ignored, resulting in generation of a special message irregardless of process phase and output port power status.

The first access to PDM 114 is for retrieval of input pointer word 1. Occurrence of the data ready strobe causes an advance of the In Counter to count 1 via the load input of the counter. From this point on, the retrieval sequence is identical to the normal 6-word sequence. When the input retrieval sequence is completed, the special message data ready flag is set and the special message pointer data dump cycle begins. The serial message service to the appropriate SIC then takes place, after when the system reverts to the service mode active prior to the special message interrupt.

Input Message Controller

Figure 13:
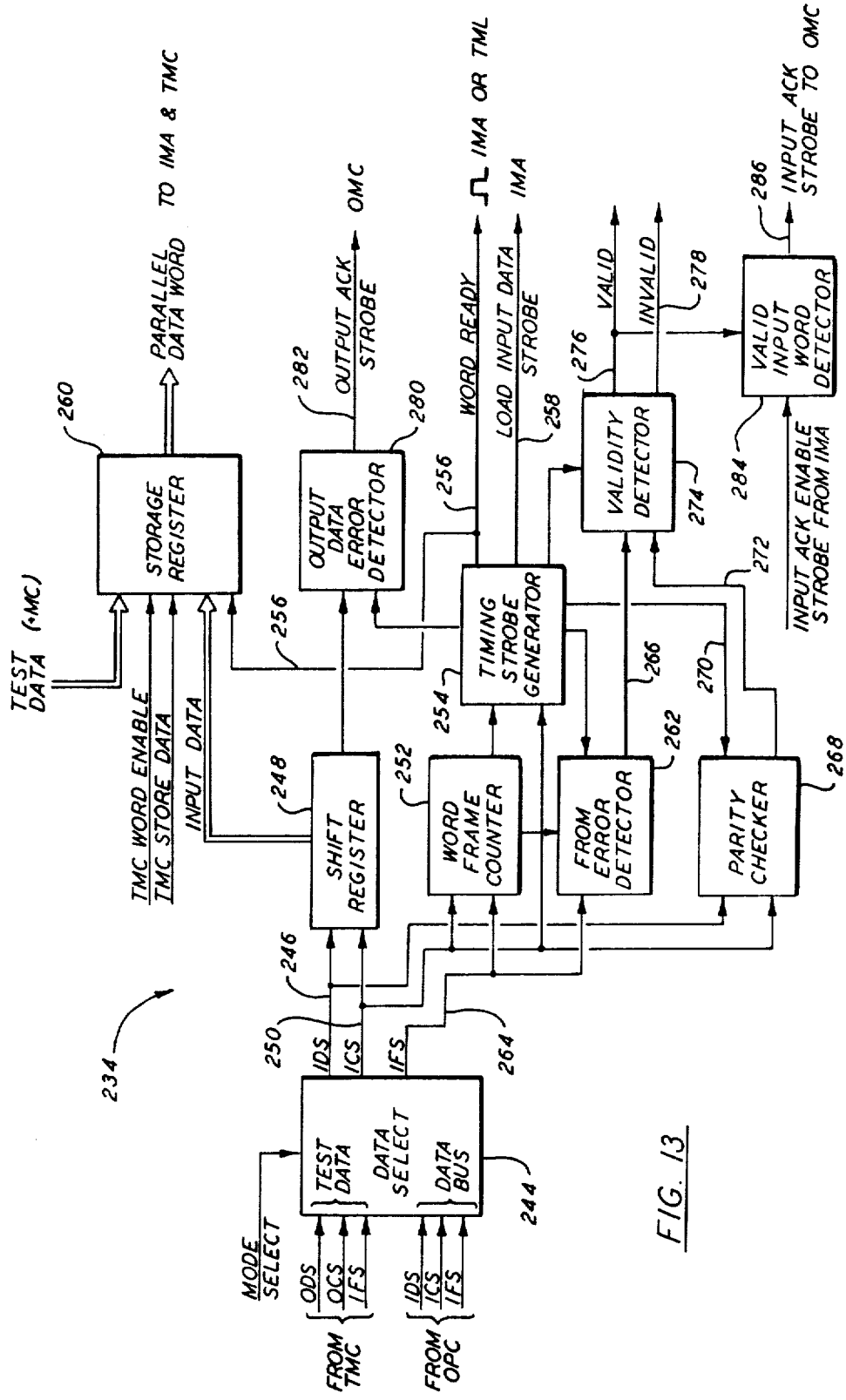
FIGS. 13 through 17 represent electrical block diagrams of various circuits used in the master controller of FIGS. 6A and 6B.

The input message controller (IMC) 234, shown in detail in FIG. 13, provides control of information received on the input data stream and at the same time detects associated timing and parity errors. This serial input message data is then converted to parallel form for transfer as a parallel input data to the input message assembler (IMA) 186. IMC 234 also monitors the header bit of the input data stream to determine if the previous output word was received without any errors.

IMC 234 receives the serial input data stream, the input clock stream and the input frame strobe via data selector switch 244 which determines whether the input serial data is from a SIC or the test message controller. The serial input data on line 246 is shifted into an 18-bit shift register 248 with input clock stream on line 250. While the input data stream is being loaded serially into 18-bit shift register 248, the input clock pulses are counted by word frame counter 252. When the input clock pulses count reaches 18, a complete 18-bit input data word has been received and the 16-bits of the input data word plus a parity bit and a header bit are in the 18-bit shift register. The timing strobe generator 254 then generates a WORD READY signal pulse on line 256 and a load input data strobe signal on line 258. The leading edge of the WORD READY pulse loads the contents of 18-bit register 248 into 16-bit storage register 260 where the input data word is available to IMA 186 for processing and storage.

When word frame counter 252 reaches a count of 18, a second counter in frame error detector 262 is enabled which counts 8 MHz clock pulses. The output of this counter is monitored and if the 8 MHz counter reaches a count of 5 before the input frame strobe on line 264 is received, it indicates that either the input frame strobe was late or the word frame count was erroneous. In either case, a FRAME ERROR signal is generated on line 266.

The last bit, 18, of each input data word frame is the parity bit. The parity of each input word is evaluated by the parity checker 268 which operates as follows. A parity flip-flop is reset to ZERO by the timing strobe generator on line 270 at the beginning of each input word frame. The state of the parity flip-flop is changed each time a ONE appears in the input data stream. After the 18 bits of each input word frame are received, the flip-flop should be in the ONE state if there were an odd number of ONE's in the frame. If not, it means that the parity was erroneous and a PARITY ERROR signal is generated on line 272.

At the end of each input word frame, both the FRAME ERROR and PARITY ERROR are tested by validity detector 274 to determine if the input word was received without errors. If no errors are detected, a VALID signal is generated on line 276. If either or both error types occurred, an INVALID signal is generated on line 278 and prevents the IMA from storing the erroneous data in IODM 112.

The header bit 1 of each input data word frame is used to indicate whether or not the previous output data word was received without errors. Output data error detector 280 monitors this bit and if it is a ONE, meaning that the previous output word was received error free, an OUTPUT ACK STROBE is sent via line 282 to the output message controller (OMC). If the header bit is ZERO, indicating that the previous output data word contained errors, then no OUTPUT ACK STROBE is generated.

Each time IMA 186 receives an input data word, it generates an INPUT ACK ENABLE STROBE which is monitored by the valid input word detector 284. If the data was VALID, an INPUT ACK STROBE is generated indicating that the input data word will be stored in IODM 112 after IMC processing. The INPUT ACK STROBE is also sent to the OMC via line 286 which uses it and the OUTPUT ACK STROBE to count how many input and output words were redeivederror free. This count is used by the OMC for formation of the Normal Message Error Status Word.

In all test modes except Mode 7, the IMC operation is identical to operation in the normal mode. Mode 7, which will be discussed in detail hereinafter, is a closed loop serial message test in the master controller. The data select switch 244 which normally passes input data selects test data when it receives a Mode 7 signal on the mode select line. This gates IFS from the TMC and ODS and OCS data to the IMC circuit. IMC operation on this data is then essentially the same as during normal message time.

Input Message Assembler

Figures 14, 14A:
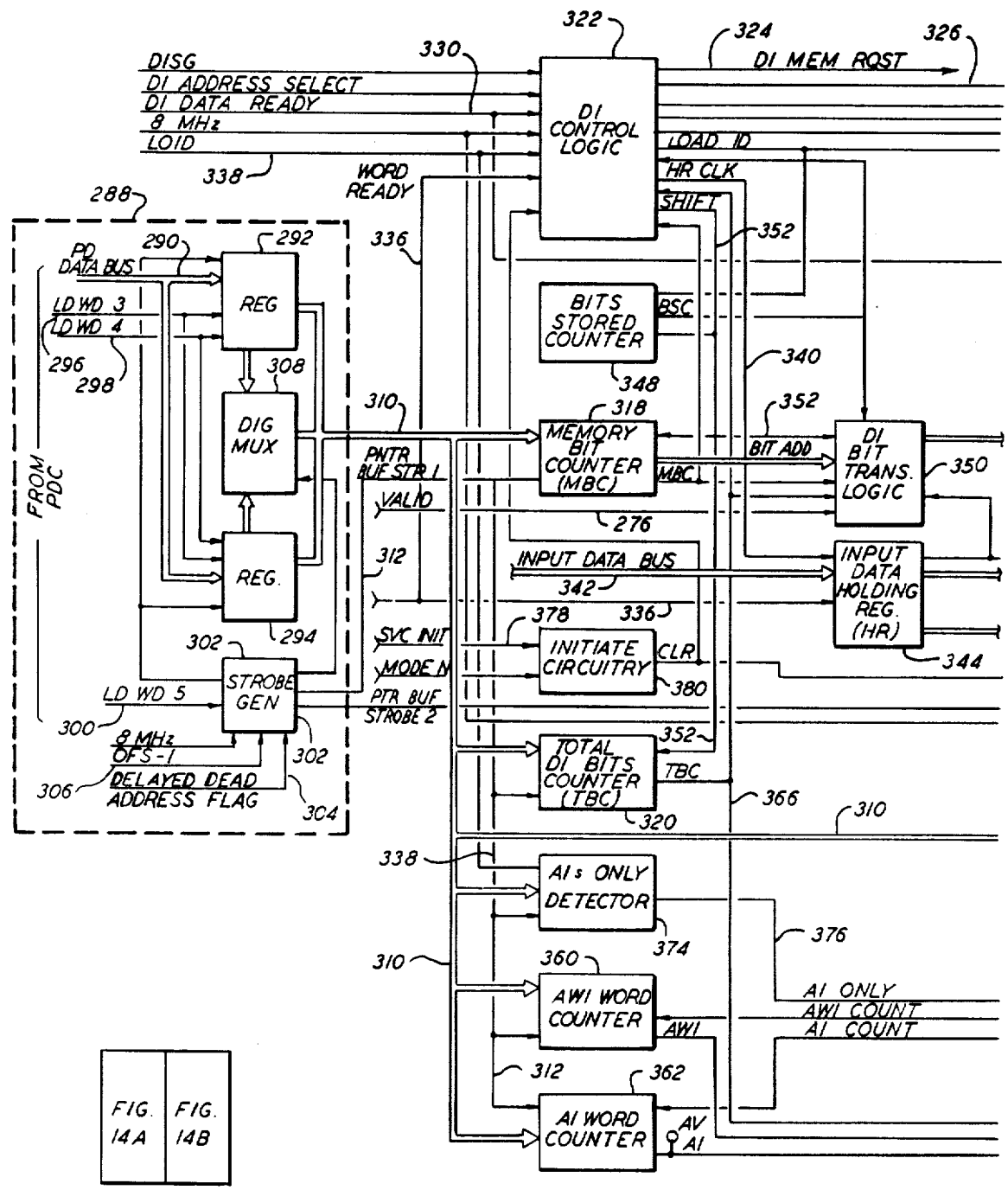
Figure 14B:
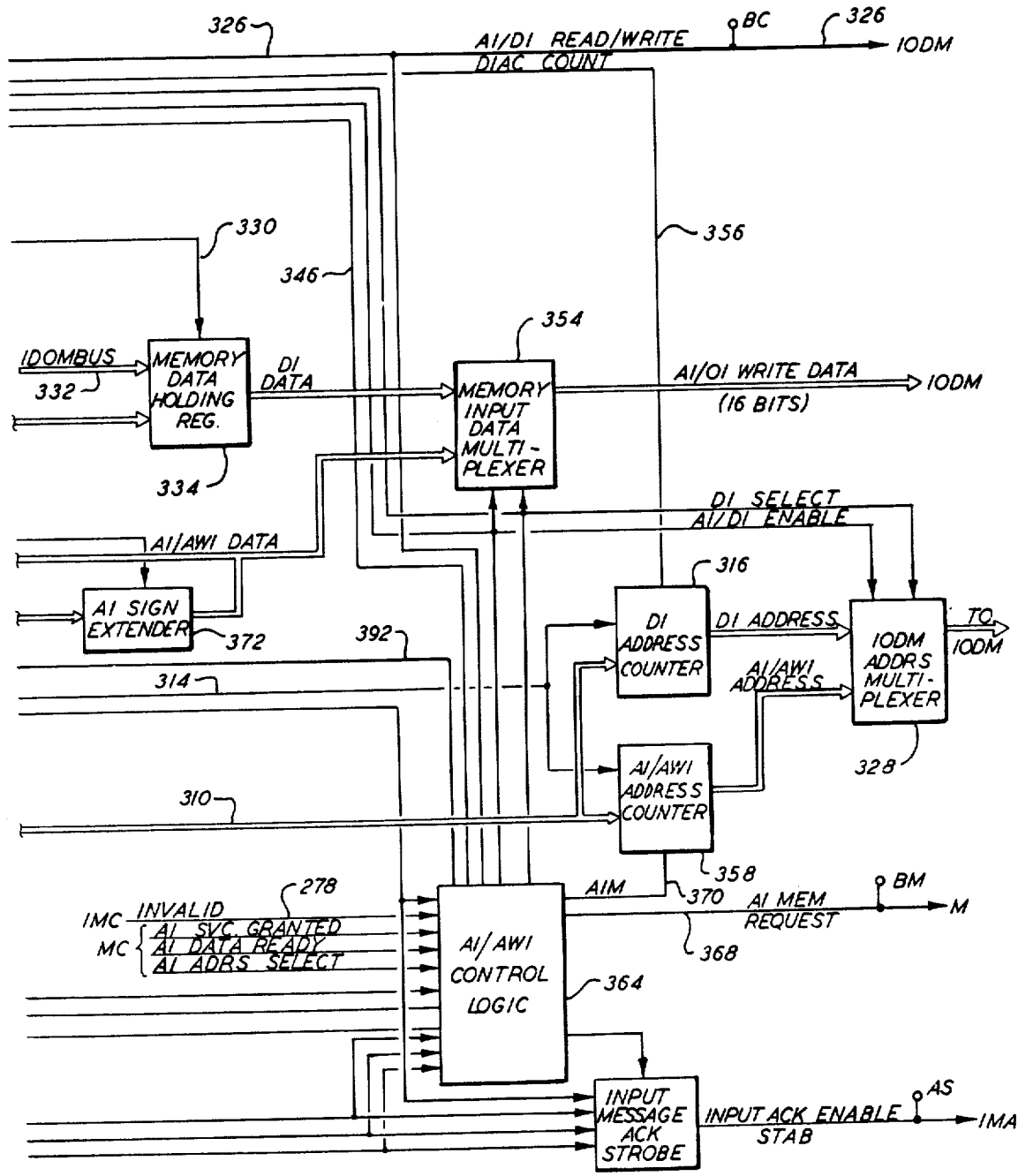

Input message assembler (IMA) 186, shown in FIG. 14, disassembles input message words and assembles the information into DBI (discrete bit input), AWI (arithmetic word input and AI (analog word input) data words for storage in IODM 112. DBI data is stored on a bit for bit basis. Each discrete input bit is transferred from the input message word to a particular bit position in memory. AWI data is received by the IMA in 16-bit parallel word form and is stored in its entirety in an I/O memory word. AI data is received in 12-bit parallel form and is transferred to the 12 most significant bit positions of an AI word in I/O memory.

The remaining 4 bits of the word are not used and are set to the sign bit value to achieve a more accurate round-off of the 16 bit analog word value.

DBI's can number anywhere from one bit to 127 bits ($2^8-1$), the quantity being limited by space on the SIC. AWI's are 16-bit words and can number from 1 to 8 on a SIC. AI's are 12-bit words and can number from 1 to 7 on a SIC. If all three types are contained on a single SIC, the processing order is DBI's, AWI's and AI's.

Pointer data is output from PDC 200 based on output message timing. This occurs before the IMA is finished processing messages from the current SIC. Consequently, IMA buffer 288 stores this pointer information and then transfers the data during the next word frame when the IMA has completed processing data from the previous SIC.

Pointer data is output from the PDC on the PD data bus 290 which contains 5 multiplexed pointer data words. The information used by the IMA is in words 3, 4 and 5, and is stored in one of the two pointer data registers 292 or 294 by the corresponding LDWRD strobes received on lines 296 and 298. When the last of the data is stored in the appropriate buffer by LDWRD 5 signal on line 300 via strobe generator 302, strobe generator 302 is then enabled to provide strobe signals to the IMA circuits upon receiving a delayed dead address flag $Q_D$ signal on line 304 and an output frame strobe (OFS 1) signal on line 306 from the OMC indicating that the IMA is finished processing the current system and is ready for pointer data for the next SIC. The digital multiplexer (MUX) 308 then gates the appropriate data onto PD buffer bus 310 and strobe generator 302 outputs PTR BUFFER STRB's 1 and 2 on lines 312 and 314 to load the corresponding information on PD buffer bus 310 into the IMA.

Figure 14C:
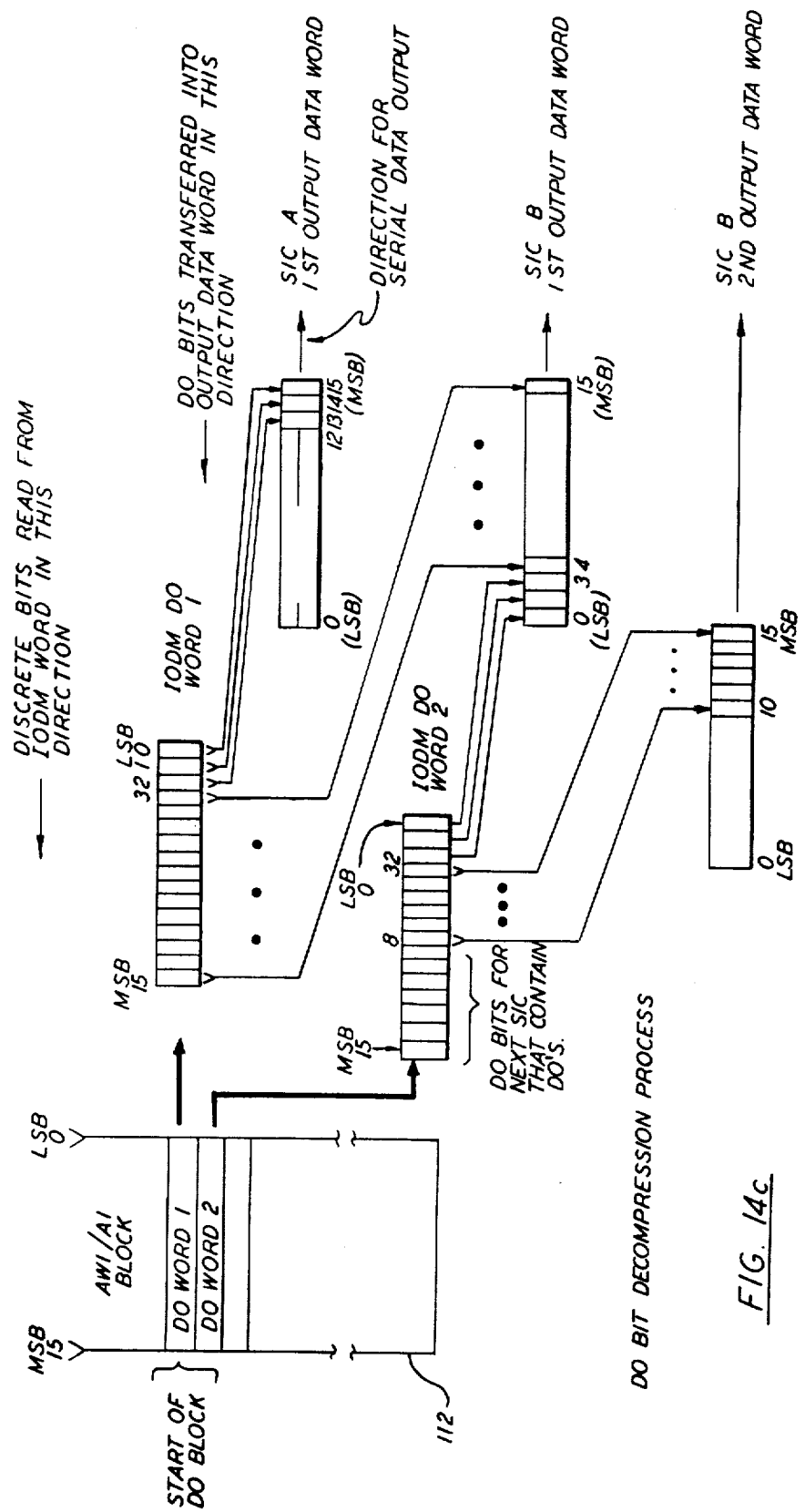

Referring now to FIG. 14C, there is shown the DBO bit decompression process. The compression process for DBI bits is similar except that the data flow is reversed.

Discrete bit input (DBI) data is stored in IODM 112 on a bit for bit basis. Successive discrete input bits from the SIC's are stored in the DBI section of IODM starting with the least significant bit (LSB) of the IODM, DI word proceeding toward the most significant bit (MSB) of the same word and continuing on into the LSB of the next IODM DBI word one word address higher than the previous memory word. The sequence continues with the second word from LSB position to MSB position of the second word to LSB position of the third memory word, etc.

The DBI section of IODM 112 is organized such that the first SIC containing DBI's is stored at the LSB position at the lowest address of the DBI section of IODM, with successive bits from that SIC stored in successively higher bit positions in the IODM word. If the SIC contains less than 16 discrete input bits, the remaining bit positions of the IODM 112 DBI word will be used for storing discrete bit input data from the next SIC containing discrete bit inputs (see FIG. 14C).

This implies that discrete input data of an input message word from the IMC can be stored in segments of two adjacent IODM DBI words. For this reason, IMA processing of discrete bit input data involves a read access to the DBI section of IODM 112, writing new data into either the entire word or just a segment of this word (when the SIC DBI starting bit position is not at the IODM DBI word boundary), transferring the processed word back to the DBI section of IODM (IODM write access), retrieving the next DBI word from IODM and repeating the above update process.

Pointer data for the DBI service is received on PD buffer bus 310 after being temporarily stored in data buffer 298 and is loaded into the following locations upon the occurrence of PTR BUFFER STRB 1 which is received on line 312 from strobe generator 302. The DI data IODM word address (9 bits) is loaded into DI address counter 316, the starting bit position in the IODM memory word, BIT ADD, (4 bits) is loaded into memory bit counter (MBC) 318, and the number of discrete input bits on the SIC TBC (7 bits) is loaded into the total DI bits counter 320.

After pointer data is loaded into these various locations, DI control logic 322 generates a DI memory request signal, DI MEM RQST, on line 324 and initiates an IODM read cycle with a signal on line 326. IODM address multiplexer 328 selects the data in DI address counter 316 which is the address of the word in the IODM that contains the first DI bit on the SIC. The signal and data exchange that takes place with the memory controller (MC) was discussed with respect to memory controller 138 and will not be discussed here. At the end of the memory cycle, a DI DATA READY signal from the MC is received on line 330 and initiates loading of the information on IODM bus 332 into memory data holding register 334.

While the IMA is being initialized at the beginning of service to a particular system, the first input data word is being retrieved by IMC 234. A WR (word ready) signal from the IMC on line 336 tells the DI control logic 322 that the first word is ready for transfer to the IMA. A LOID (load input data) signal on line 338 from the IMC causes DI control logic 322 to generate an HR clock signal on line 340 which, in conjunction with the WR signal, loads the information on input data bus 342 into input data holding register 344. LOID also generates a LOAD ID signal on line 346 which resets the bits stored counter (BSC) 348 to Zero and starts the DI bit transfer operation.

The bit transfer logic 350 transfers the first DI bit, which is the most significant bit (HR 15) of the input data word, to the memory in register 334 at the bit address designated by the contents of MBC 318. Each time a bit is transferred from the input data word to the memory in the memory data holding register 334, MBC 318, TBC 320 and BSC 348 counters are clocked by the signal SHIFT on line 352 and holding register 344 is shifted by the HR clock signal on line 340, placing the next most significant data bit of the input data word in the HR 15 position. This bit transfer process continues until one of the following three conditions occurs:

1. The MBC 318 reaches maximum count which means that all DI's in the memory word have been processed. The DI control logic 322 generates a DI MEM RQST on line 324 and initiates a memory write cycle. Memory input data multiplexer 354 and IODM address multiplexer 328 select the DI data and address, respectively, and the memory word is loaded back into the same location from which it was read. A DIAC COUNT pulse on line 356 from DI control logic 322 increments DI address counter 316, another DI MEM RQST is generated on line 324 and the next word is read from memory. The DI BIT TRANSFER then continues, provided all bits in the input data word were not processed.

2. The bits stored counter (BSC) 348 reaches count 15 which means that all 16 bits of the input data word have been stored and the DI processor is ready for another data word from the IMC.

3. The TBC 320 counter reaches Zero which means that all DI bits on the SIC being serviced have been stored and DI processing for that SIC is complete.

Recalling that if the IMC did not detect any errors associated with a given input word, it generates a VALID signal on line 276 telling DI control logic 322 that the data may be transferred to the IODM. If any errors were detected, the VALID signal is not generated and DI bit transfer logic 350 is inhibited. The DI control cycles the associated counters the same as they would be if the data was valid; however, none of the input data bits are transferred to the IODM. This is necessary to advance the bit position and IODM address to the appropriate position for processing and storage of the next input data word from the IMC.

AWI's are processed after all DBI's for a system have been processed. AWI's and AI's for a given system are loaded in consecutive memory locations, the last AWI word on the SIC being followed by the first AI word on the SIC. This allows the use of one starting address for both AWI's and AI's. The contents of the AI/AWI address counter 358 are incremented by one after the last AWI word is loaded in the memory and this becomes the starting address for the first AI word.

Pointer data for AI/AWI's is received on pointer data bus 310 immediately following receipt of DI pointer data, and is loaded with the occurrence of PTR BUFFER STRB 2 on line 314 125 ns after PTR BUFFER STRUB 1 occurs. The number of arithmetic word inputs, AWI, (4 bits) is loaded into AWI word counter 360, the number of analog word inputs, AI, (3 bits) is loaded into AI word counter 362, and the IODM starting address (11 bits) is loaded into AI/AWI address counter 358. If there are no DI's from the system being serviced, AI/AWI processing begins immediately following the loading of pointer data. If there are DI's from the system which have to be serviced, AI/AWI control logic 364 waits for a signal from TBC 320 on line 366, indicating that DI processing is complete.

AWI input data words are received in 16-bit parallel form on input data bus 342 from the IMC and loaded into input data holding register (HR) 344 in the same manner as DI input data words. A LOID signal from the IMC on line 338 causes a LOAD ID signal, line 346, to be generated which tells AI/AWI control logic 364 that the input data word is in HR 344 and ready for transfer to the IODM. Memory input data multiplexer 354 and IODM address multiplexer 328 now select the AI/AWI DATA and AI/AWI ADDRESS, respectively. AI/AWI control logic 364 generates an AI MEM REQUEST signal on line 368 which initiates an IODM write cycle and the 16-bit AWI word is loaded in its entirety in the memory location specified by AI/AWI address counter 358.

After each word is transferred to the memory, and AIM signal on line 370 increments AI/AWI address counter 358 and an AWI COUNT pulse decrements AWI word counter 360. This process continues until the AWI word counter reaches zero indicating that all AWI's of the system being serviced have been loaded in the IODM.

Following AWI processing, AI's are then processed by the IMA. The number of AI's on the system being serviced was loaded into AI word counter 362 with PTR BUFFER STRB 2, line 314. The starting address of the first AI word in the IODM is the contents of AI/AWI address counter 358. This address may be the data loaded with PTR BUFFER STRB 2 signal if there was no AWI service required by the system or the resultant address left after servicing AWI's. In either case, the first AI word is loaded into IODM 112 at the address specified by AI/AWI address counter 358.

AI processing is identical to that of AWI's with one exception. AI words are only 12 bits long, located in the 12 most significant bits of the input data word from the IMC. When an AI data word is being transferred to the IODM, the AI sign extender 372 is enabled and the four least significant bits of the input data word are replaced by the sign bit. This provides 0 roundoff of the 16-bit AI word as received by the computer. Input message processing lags output message processing by one word frame. As the second output word is being sent from the master controller to the SIC via the serial data streams, the first input is being sent from the SIC to the master controller. There is one additional word frame lag when the SIC contains AI's only. As the second output word is being sent from the master controller to the SIC, the first AI is being converted from analog to digital format in the subcontroller. The resultant digital value is sent back to the master controller during the third word frame.

When pointer data is being loaded into the IMA at the beginning of service to a SIC, the AI ONLY detector 374 monitors the data containing the number of DI bits and the number of AWI words. If all bits are zero, then there are no DI's or AWI's on the SIC being serviced and an AI ONLY signal on line 376 is generated. When service is initiated for a SIC containing only AI's, it takes one word frame to convert the first AI on the SIC. During this word frame, the first input word from the subcontroller contains no valid data and the first AI word will be the second word from the SIC. If the SIC contains either DI's or AWI's, then the first AI word is being converted while the last DI or AWI word is being input to the IMC and there is no invalid data received.

Since the IMC is constantly monitoring input data for error detection, AI and AWI input words are tested the same as DI input words. If there are any errors in an AI or AWI input word, an INVALID signal is received from the IMC on line 278. In this case, AI/AWI control logic 364 cycles through the same sequence it would if the data was valid, the only difference being that no AI MEM REQUEST signal, line 368, is generated and the data is not stored in the IODM.

When the outputs of counters TBC 320, AWI 360 and AI 362 all reach zero, the IMA has finished processing input data for the SIC being serviced. Nothing takes place on the SIC until pointer data for the next SIC is loaded into the IMA logic and the cycle is repeated.

After turn-on, the IMA logic may come up in any state and must be initialized. At the beginning of each I/O update cycle, a SERVICE INITIATE pulse, line 378, from the PDC to initiate circuitry 380, clears the logic by a signal on line 382 to AI/AWI control logic 364 and DI control logic 322, and the IMA is ready to process input data. During test mode, to be discussed later, the IMA is ready to process input data. During test mode, to be discussed later, the IMA is inhibited by a MODE N signal to initiate circuitry 380 from the TMC. This prevents the IMA from loading test data in the IODM.

Output Message Assembler

The output message assembler (OMA) 188 assembles arithmetic word output/analog output (AWO/AO) and discrete output (DO) data retrieved from IODM 112 for transmission to the system. Information contained in pointer data memory 114 is used by the OMA to access the correct output data sections of the IODM.

The discrete output data assembly is on a bit-by-bit basis. One bit is transferred from the DO memory data word to a DO bit position in the output message data word. Referring now to FIG. 15, the discrete bit input position counter (DBIP) 382 is loaded from pointer daa bus 210 with DO starting bit position data by pointer strobe two (PTR STRB 2). This is received from the PDC via the OMA process control 386 on pointer strobe bus 388. DBIP counter 382 generates the subsequent DO bit address as it is clocked.

The initial DO data memory word address is loaded from pointer data bus 210 by pointer strobe three (PTR STRB 3) into discrete memory address up counter (DBADRS) 390.

The number of DO bits is loaded from pointer data bus 210 by PTR STRB 2 into a seven bit down counter (DB CNT) 392.

The AWO data is organizeed on a 16-bit parallel word basis. The number of AWO words is loaded into a four bit down counter (AW CNT) 394 and the initial AWO address is loaded into an 11-bit up counter (AN/AW ADRS) 396 from pointer data bus 210 by pointer strobe one (PTR STRB 1).

AO data assembly is organized on a 12-bit parallel word basis. The number of AO words to be transferred are loaded from pointer data bus 210 by PTR STRB 2 into the analog word down counter (AN CNT) 398. The AO address is derived from the AWO address during PTR STRB 1 and was previously loaded into address counter (AN/AW ADRS) 396.

If both AWO and AO data exist, they are stored in contiguous memory words with the AO data preceded by the AWO data. Consequently, the AN/AW address counter will be advanced to the first AO address at the conclusion of AWO processing.

The OMA determines from pointer data during discrete output word assembly (DO's, LDO's) whether the output message word contains a full 16 bits of discrete output information (fully packed discrete bit output word) or less than 16 bits of discrete output information (partially packed discrete bit output word). This operation is essential during test service to prevent testing of non-existent discrete output devices which would result in an indication of test failure.

As will be discussed in more detail hereinafter, during test mode operation, the OMA generates test values in place of the normal output data and, for certain test situations, allows the normal data to replace the test data.

Interaction with the output message controller by notifying the OMC when word assembly is complete is a function of the OMA. Upon notification of acceptance of a word by the OMC, the next output word is assembled.

During normal message service, the OMA assembles output data words from output data received from IODM 112 on IODM read bus 398. Assembly starts with discrete bit output data words which may involve the retrieval of up to two IODM DO words/SIC. The processing of such discrete words is similar to that discussed hereto fore with respect to the IMA. Upon completion of discrete bit word assembly, arithmetic output words are then assembled (involving one IODM word/SIC output word), finishing with assembly of analog output words (involving one IODM/SIC word). If any initial word count is zero (i.e., DB CNT=0 and-/or AW CNT=0), the word counter of next higher sequence is addressed and, if non-zero, assembly of the associated word type commences. If all initial word counts are zero (i.e., DB CNT=0, AW CNT=0 and AN CNT=0), the OMA remains inactive for the duration of serial message service to that SIC.

Assembly of the first output data word commences at the end of the pointer data dump cycle as was discussed heretofore. When the first output word assembly is finished, a load strobe is generated on line 400, transferring the output data word to a holding register in the OMC. The OMA then goes to an idle state until occurrence of a signal indicating that the OMC has loaded the previously assembled output data word into the ODS parallel to serial shift register. Assembly of the next output data word commences with this strobe.

Discrete bit output words are assembled on a bit-by-bit basis. A DO word is retrieved from the DO section of IODM 112 and placed in DO holding register 402 upon receipt of a load strobe signal on line 404. The bits are then shifted into output word assembly register 406 at bit at a time by means of multiplexer 408 until either a DBOP MAX signal is received by flip flop 410 from discrete bit output counter (DBOP) 412 on line 414 to identify that 16 bits have been assembled thereby completing assembly of the output data word or that a DBIP MAX strobe from DBIP 382 occurs on line 416 causing an interrupt to the transfer cycle. The DBIP MAX strobe identifies that the last bit of the IODM DO word has been transferred and the next DO word from IODM 112 is then retrieved, after which the transfer cycle continues until either the DBOP MAX strobe occurs or the signal on line 418 from DB CNT 392 goes to zero. DB CNT 392 is decremented for each discrete bit transfer.

When DB CNT 392 goes to zero before the max strobe signal from DBOP 412 occurs, a partially packed discrete bit output word exists on the system (i.e., a discrete word containing less than 16 bits).

Arithmetic output word assembly operations commence when DB CNT 392 is zero upon occurrence of a frame strobe, provided the AW count in the AW CNT 394 is not zero. The AWO/AO section of IODM 112 is then accessed for retrieval of the AWO word. Receipt of the AO/AWO data ready strobe on line 420 (completion of the memory access cycle) results in storing the word in output word assembly register 406, decrementing of AW word counter 391, incrementing of AWO-/AO IODM address counter 396 and generation of the load strobe on line 422 which transfers the output data word to the OMC holding register via output data source multiplexer (MUX) 424.

Analog output word assembly operations commence upon occurence of a strobe signal after DB CNT 392 is zero, AW CNT 394 is also zero, but AN CNT 398 is not zero. The AN/AW portion of IODM 112 is accessed and the AO data is stored in both the DO/AO/ATV holding register 402 and the output data word assembly register 406. The transfer to the output data word assembly register is required during test service time, but is performed during normal message service time as well, for convenience.

The AO data transfer to DO/AO/ATV holding register 402 results in decrement of the AN counter 398, increment of the AN/AW ADRS counter 396 and generation of the output data word store strobe signal on line 400.

The general differences between normal message service and test message service are discussed in the section of this application entitled Test Message Controller (TMC). As will become clear from later discussion, Mode 1 test service is identical to Mode N operation of the OMA.

During test of a discrete bit or arithmetic device word, the test ones word is generated first, followed by generation of the test zeros word in consecutive word frames. The OMA DB count is decremented during assembly of the discrete bit test zeros word as each discrete bit is assembled. The arithmetic test zeros word is generated as a parallel word where the OMA AW CNT is decremented at that time.

During Mode 3, the AN counter is first preset with AON count data, evaluated for zero count, and if zero, reloaded with AIN count data. This is because Mode 3 testing of the subcontroller D/A and A/D is based on pointer data. Testing of a subcontroller D/A and A/D will only be performed if any of the SIC's associated with the subcontroller contain analog devices (either AO's or AI's). Consequently, the test will be re-executed for that subcontroller if more than one SIC associated with the subcontroller contains analog devices.

Testing of analog devices in any of the test modes involves generation of two analog test data words simultaneously. One is generated by loading the ATV from TMC 194 into the output word assembly register which, in turn, is transferred to the TCV parallel to serial shift register and eventually sent to the IMC. The other analog test data word is generated via the DO/AO/ATV holding register and the D/A code translator which, in turn, is transferred to the OMC for output on the ODS. This value is used by the subcontroller D/A or is stored in the SIC D/A holding registers during Mode 5 AO testing.

During Mode 4, the ATV is transferred to the output word assembly register. This, in turn, is transferred to the TCV serial data stream and the ODS. A similar transfer is performed during Mode 7 except data into the TCV serial shift register must be modified so that the test command value as received by the test evaluation comparator in the IMC reflects the same data received on the IDS. The Mode 7 closed loop connection results in an input data word containing output parity as the MSB and the 15 MSB of the ATV as the 15 LSB of the input data word. The IDS format translator in the OMA performs the above translation to the TCV serial data word.

During Mode 3, the TMC is concerned only with the existence of analog devices. Consequently, the pointer word count data is modified by clearing the DB and AW word count data. A similar clearing of the AN count occurs during Mode 1 testing.

Output Message Controller

The primary functions of the output message controller (OMC) 126 are to generate and format the proper address data (i.e., subcontroller, system and word address) from information on the pointer data bus, to perform serial conversion on the assembled output message data word from the OMA and to provide basic timing for the subcontrollers and system. The primary outputs, therefore, are the output address stream (ODS), output data stream (ODS), output clock stream (OCS) and the output frame strobe (OFS).

As shown in FIG. 16, the OMC has access to bits zero through ten and bits 16 through 19 of pointer data bus 210. Bits zero through ten provide the number of I/O words required for a particular SIC. Bits 16 through 19 provide the subcontroller and SIC address and the analog output identification code for which the OMC provides buffer storage.

The number of discrete output words is the number of arithmetic words (AWO) plus the number of discrete output (DBO) bits. During the PTR STRB 1 signal received from pointer data strobe bus 426, the number of AWO words is buffer stored in the number of discrete I/O words computer (NIOC) 428. During the PTR STRB 2 signal, the number of words of discrete output bits is computed by NIOC 428, added to the number of AWO's and the resultant value loaded into the number of discrete output words down counter (NDOC) 430. This same PTR STRB signal loads the number of analog output words into down counter NAOC 432.

The number of discrete input words is the number of arithmetic words (AWI) plus the number of discrete input (DBI) bits. When the PTR STRB 4 signal occurs, the number of AWI words is buffer stored in NIOC 428. During the PTR STRB 5 signal, the number of words of discrete input bits is computed by NIOC 428 and added to the number of AWI's. The resultant value is loaded into the number of discrete input words down counter (NDIC) 434. PTR STRB 5 also loads the number of analog input words into a down counter, NAIDC 436. Outputs of each of these word counters (on lines 438 and 440) are used by OMC logic circuitry 442 to determine the type of serial message service for each word frame. These include:

1. Full duplex operation (both input and output data transfers).
2. Half duplex output (only output data transferred).
3. Half duplex input (only input data transferred).
4. Whether the subcontroller A/D output should be connected to the input data stream for the current word frame.
5. Whether the serial message is a test message requiring various test connections be made on the subcontroller and/or SIC.

These word counts are decoded to determine the status of the mode flags A, B, C, D which are sent as ODS data to the subcontroller and SIC's where further decoding is performed to generate the appropriate set of control signals.

Basic timing for the OMC is provided by the master controller phased clock system (Phase 1 through Phase 8) to the frame and bit timing circuitry 444. Phase 1 is used as the basic counter clock; the other phases are used to gate decoded counts.

The subcontroller and system addresses from the system address/AOID holding register 446, the word address, which is generated by a three bit up counter 448, and the mode flags (for test service) from holding register 450 are loaded into a 16-bit shift register 452. At the same time, parity is computed by parity generator 454 and added along with the header bit. The output of register 452, therefore, represents the serial output address stream (OAS).

Similarly, the assembled output data word from the OMA is loaded into a 16-bit shift register 456. Parity is computed by parity generator 458 and is added along with the header bit to make up the output data serial stream (ODS).

The output frame strobe generated by the OMC is used by the system subcontrollers as a synchronization command. This strobe is generated at the end of each dead address frame. A dead address frame is a frame time when a non-valid address field is sent from the OMC to all subcontrollers. This frame is generated when service is transferred from one system to the next, and is one word frame in length. The purpose of the dead address frame is to allow transfer of the last input data word of the previous SIC before commencing transfer of the first output data word to the next SIC. At the conclusion of a dead address frame, all subcontrollers and SIC's go to an inactive status.

The OMC also processes some test and error messages. These functions are the following:

1. The OMC generates the normal message service error/status word which is evaluated in the TMC at the end of normal message service to each SIC for serial message communication error. The error/status word indicates for each SIC,
   (a) word address not responded to by each SIC;
   (b) output data words not stored on the SIC;
   (c) input data words not stored by the IMA.

Information or any SIC having communication errors during normal message service time will be transferred to the computer during the next DMA update interval.

2. The OMC interacts with the test mode controller during test mode operations by modifying output word count operations to meet the requirements of the test mode.

Output Port Circuit

Output port circuit (OPC) 460 provides the fan-in and fan-out capabilities required to expand the I/O data bus from one port up to eight ports so that two or more simulators may be serviced simultaneously. Port inputs are inhibited if systems connected to the port are in the power-off condition. Master controller outputs are simultaneously driven on all ports regardless of port status. Thus, OPC 460 gives the master controller the capabilities to operate even though one or more of the simulators in a complex is not operating.

Figure 17A:
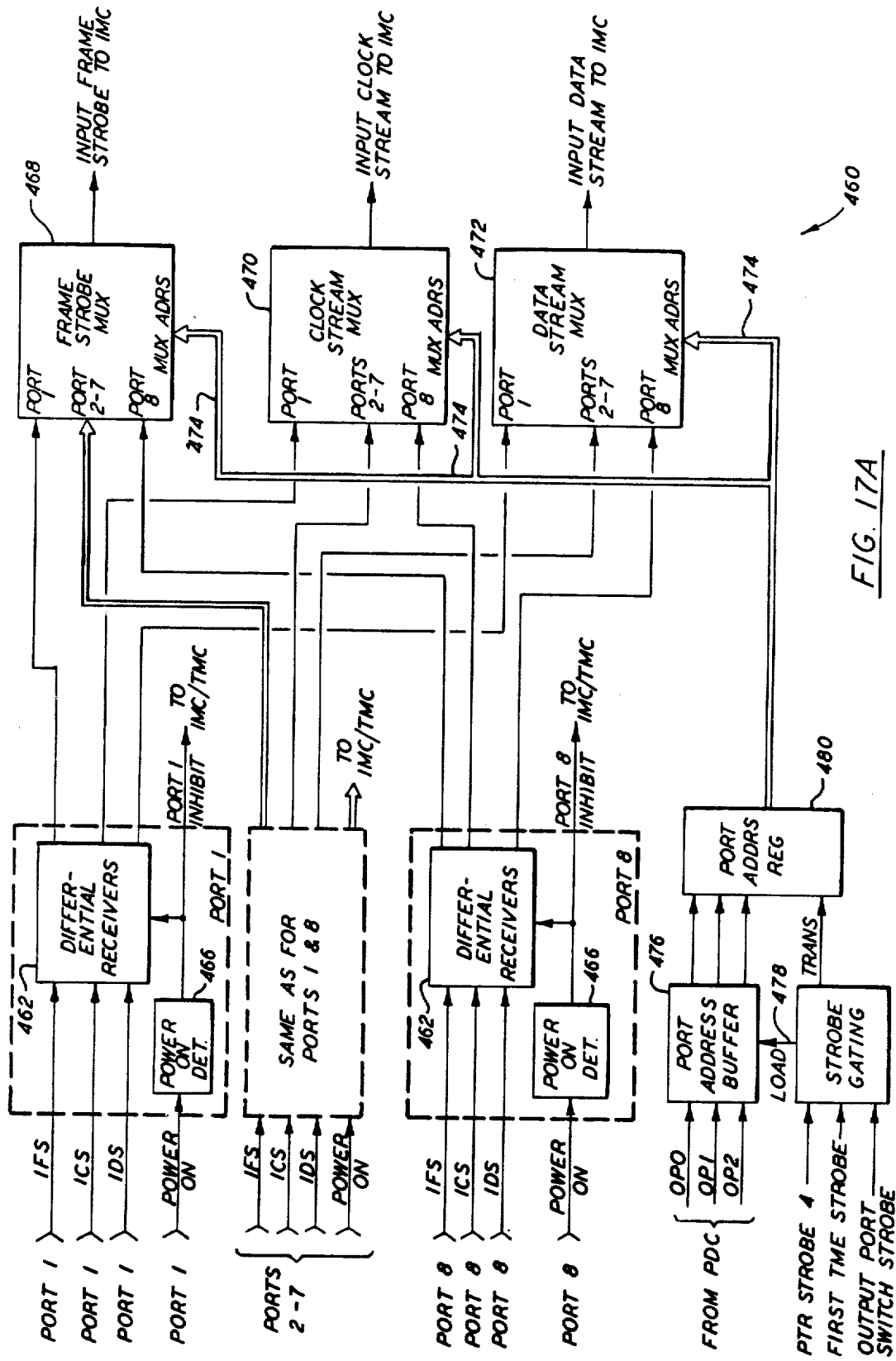

As shown in FIG. 17, a typical OPC I/O channel consists of differential receivers 462, differential transmitters 464, and a voltage comparator 466 for "power-on" detection. The differential receivers 462 are for the input frame strobe (IFS), input clock stream (ICS) and input data stream (IDS). The absence of a PORT POWER ON signal, representing that the associated simulator is operating, produces a PORT INHIBIT signal which inhibits the differential receivers for that port, and also informs the IMC and TMC that the simulator associated with the inhibited port is not operating.

The outputs from each of the eight ports of the differential receivers 462 for each input signal type are provided to multiplexers 468, 470 and 472 to form a single signal string. The channel at the output of the multiplexer is selected by a 3-bit output port code (OP0, OP1, OP2) from the PDC and is provided by bus 474. Since input data is always one frame behind output data, a buffer is necessary to hold the port code for the next system. This code is dumped by the PDC before data retrieval is completed for the present SIC. The port code is loaded in buffer 476 upon the occurrence of the PTR STRB 4 signal on line 478 from the PDC and is then transferred to the port address register 480 by the OUTPUT PORT SWITCH STRB signal. When the port address for the very first SIC being serviced in the update frame is loaded in the buffer, a FIRST TIME PORT STRB signal transfers the address to the holding register so that the port will be enabled when the first input word arrives.

Output data is transmitted simultaneously on all ports by differential transmitters 464. The four output signals are output frame strobe (OFS), output address stream (OAS), output data stream (ODS) and output clock stream (OCS).

In a single port system, the OPC circuit is not required and the I/O data bus is connected directly to the IMC.

Test Message Controller (TMC)

As was discussed in the overview, the automatic self test features of this data transmission system accomplishes the two primary purposes of (1) continually monitoring normal message updates for communication error to provide a constant indication of the data transmission reliability, and (2) providing a series of diagnostic closed loop tests at different points in the system for identifying a malfunction down to a particular input/output device. The different types of tests and a code for each are summarized in Table I. The computer can command any of the seven types of tests. When none are commanded, the TMC automatically cycles between Modes 1 and 4. When Mode 4 is finished, it will recycle back to Mode 1 (Auto Recycling Test Modes).

Figure 32:
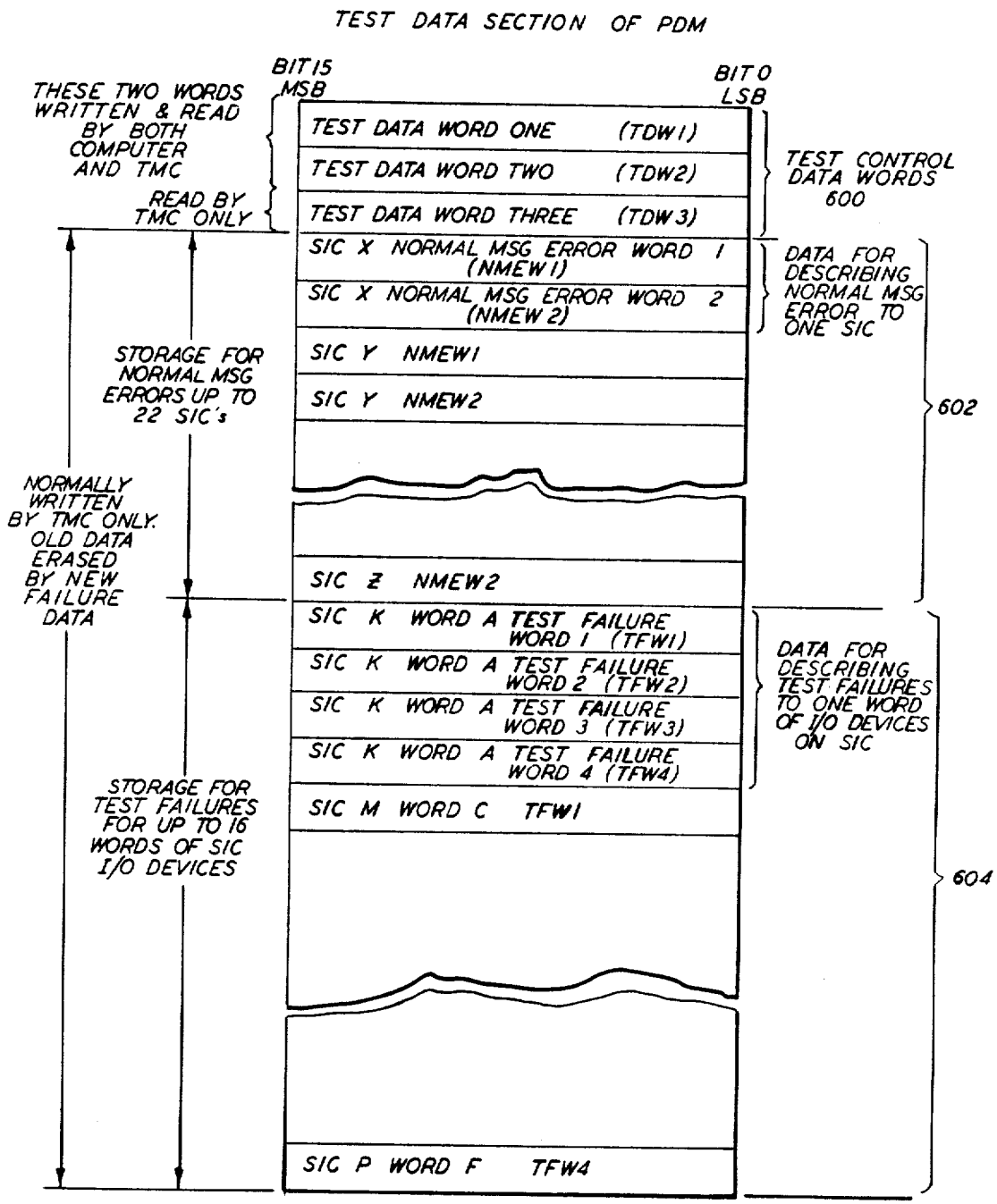
FIG. 32 shows the mapping and location of the test data in memory storage.

A map of a typical test data section of PDM 114 is shown in FIG. 32. As shown, this section of PDM 114 consists of three parts:

(1) Test control words shown at 600 are for the control of test processing (TDW 1 and TDW 2) and analog test data (TDW 2 and TDW 3).

(2) Normal message error words shown at 602 are for the identification of normal message communication errors.

(3) Test message failure words shown at 604 are for the identification of test failures.

Figure 33:
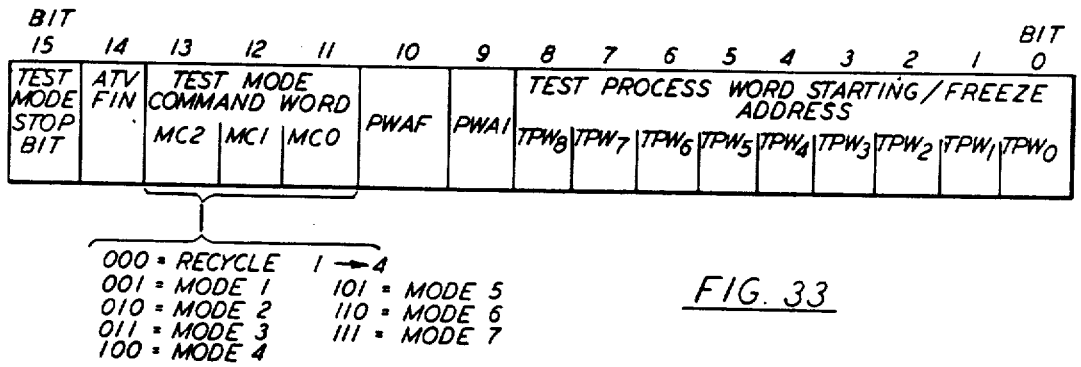

Referring now to FIG. 33, there is shown TDW 1 which is written by the computer 68 (FIG. 31) at the end of normal DMA update service and is read by TMC 194 (FIG. 31) at the beginning of normal message service.

Figure 44B:
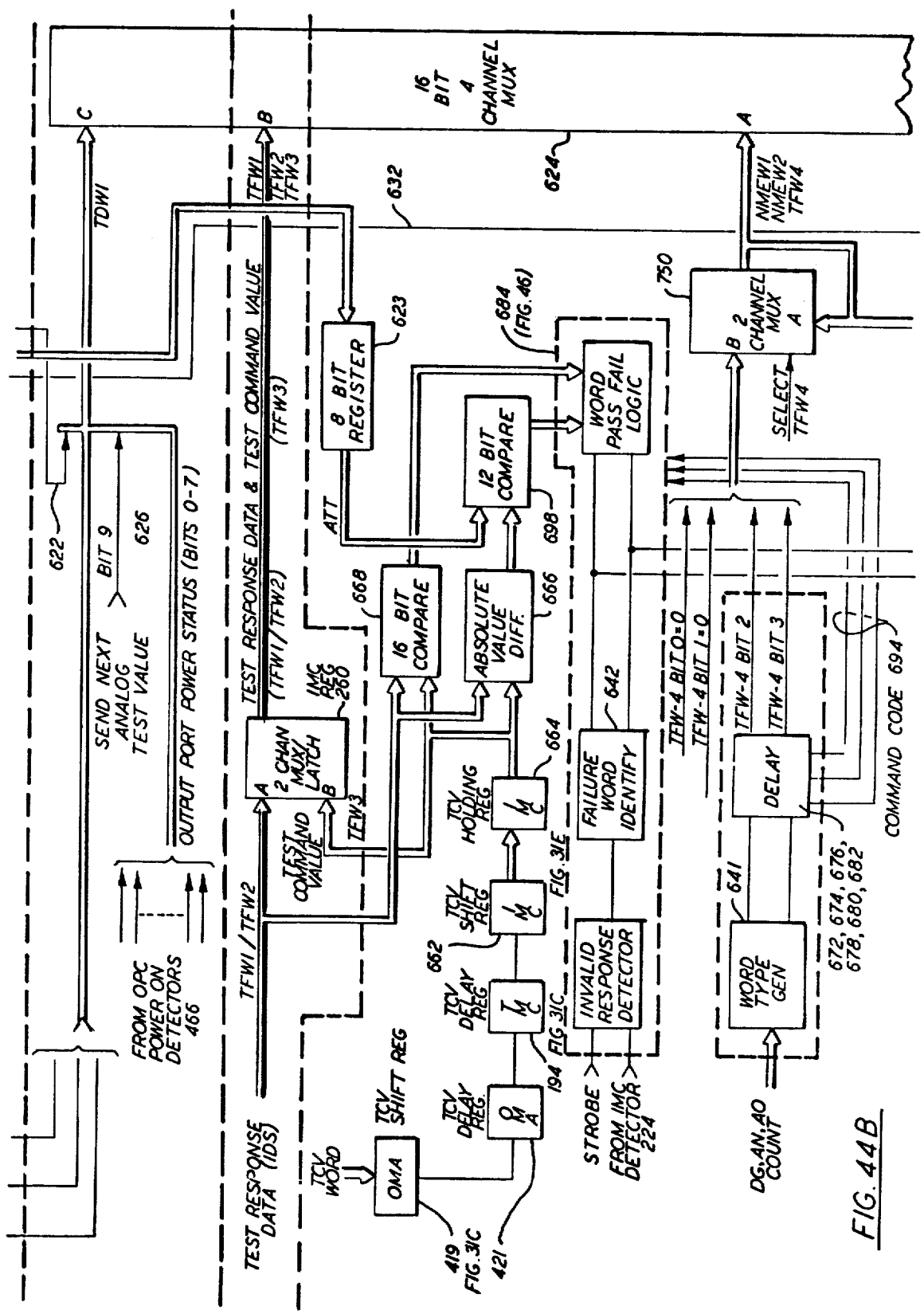

The most significant bit (MSB) or bit 15 is the test mode stop bit. As shown in FIGS. 44A, B and C, this bit is set to "logic 1" by the computer via line 604 from the PDM read bus to inhibit test mode processing until the computer finishes processing of the previous error message. For example, if the bit is "logic 1" at the beginning of test mode service, normal message error monitoring and test message service will be inhibited for that update frame. As will be discussed later, this bit may also be set to a "logic 1" by the test mode stop bit logic 606 in TMC 194 upon the occurrence of the first test error. Holding register 607 provides buffer storage for bit 15 and other data as shown to accommodate the time difference between reading the PDM bus and using the data. After the computer finishes processing the previous error message, bit 15 is set to "logic 0" by the computer so that other error messages can be received. The previous information written by the TMC in bits 0-14 is erased and new valid information to the TMC is provided by means of these bits at the same time bit 15 is set to 0.

Bit 14 (ATV FIN) is used for control of auto-recycling test modes. The computer sets bits 14, via line 608, to a logic "one" when automatic testing by recycling test modes 1 through 4 is active. Bit 14 high in conjunction with bits 11, 12 and 13 low causes counter 613 to advance one count via test mode control 614. Normally, bit 14 is brought high for one frame only to allow advance to the next auto-recycling test mode (e.g., from Mode 1 to Mode 2). Bits 14, 13, 12 and 11 then remain low for successive update frames until all SIC's have been tested in that test mode for the range of analog test values (ATV) required.

If "logic 0", bit 14, indicates that analog testing at all values is not complete and that a new ATV will be required upon completion of test mode service to the last SIC. Bits 11, 12 and 13, carried by lines 610, 611 and 612, are used by the computer to demand a particular test mode 1-7 or, if all bits are "logic 0", automatic recycling of test modes 1 through 4.

Bits 9 and 10, on lines 616 and 617, represent the code used by starting address control logic 618 to control the test mode process word address determined by the TMPWA counter in the PDC. For example: (a) If bit 10="logic 0" and bit 9="logic 1", then the TMPWA in the PDC will be initialized to the starting address specified in bits 0 through 8 of TDW 1 at the beginning of the test mode service. The address will be incremented for testing of other SIC's during the current update interval, but will be reinstated at the beginning of the test mode service in the next update interval if this code is the same; (b) If bit 10="logic 1" and bit 9="logic 0", the current address in the PDC TMPWA counter is maintained and testing is performed continuously to the selected SIC for the duration of the test mode service cycle; (c) If both bits 9 and 10 are "logic 1", testing is performed by the computer to the address specified by TDW 1 bits 0 through 8 for the duration of the test mode service cycle. Bits 0-8, received on lines 620 by register 220 of FIG. 9A represent the address as discussed above for retrieving pointer words; and (d) If both bits 9 and 10="logic 0", the address in the PDC TMPWA counter is allowed to increment as the various SIC's are tested.

Figure 34:
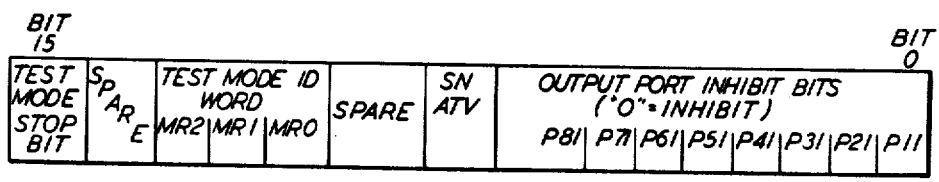

FIG. 34 shows TDW 1 as written by TMC 194 at the end of test mode service and read by the computer at the beginning of the normal DMA update service. Bit 15 in this situation functions as was described above. However, the following should be noted. If this bit is a "logic 1" at the beginning of normal message service, it will be restored to the "logic 1" via line 622 through channel C of 4-channel MUX 624. If the bit is a "logic 0" at the beginning of normal message service, it will be set to "logic 1" at the end of test message service by the TMC if normal message errors or test message errors occurred during the current update interval. It should be understood, however, that only the computer can change this bit from a "logic 1" to a "logic 0". Bits 14 and 10 are not used by the TMC to provide information to the computer and are, therefore, spare in TDW 1 when read by the computer. Bits 11, 12 and 13, on lines 610', 611' and 612', are used to identify the active test mode for the current test message service. Bit 9 of channel C in MUX 624 is used by the TMC to instruct the computer to send (via line 626) a new ATV ("logic 1") or to maintain the current test value ("logic 0"). Bits 0-7 are used to provide information to the computer concerning the status of the various output ports. That is, whether or not they are in power shutdown situation (power shutdown="logic 0" and power enable='logic 1"). This information allows the computer to identify cockpits having a power shutdown condition.

Figure 35:
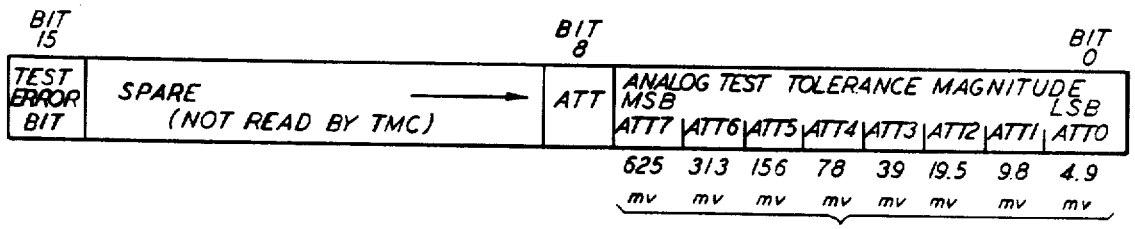

FIG. 35 shows test data word 2 (TDW 2) as written by the computer at the end of normal DMA update service and read by TMC 194 at the beginning of normal message update service. The test error bit 15, also carried on line 604, is set to a "logic 1" by TMC 194 to indicate that a test message failure occurred during the current update interval. If such a failure occurred, and the bit is a "logic 1", the computer will set it to a "logic 0" at the end of the normal DMA update service when the computer is ready to accept new failure data. Bits 9-14 are spare and are not read by the TMC. Bit 8, received on line 628 by register 630, is used to indicate that the analog test tolerance is above or below a selected value such as, for example, the mid-value 39 mv or other selected value illustrated in FIG. 35. Bits 0-7, received on lines 620, indicate the magnitude of the ATT used for all analog tests. The values shown in FIG. 35 are representative only and should be chosen to meet the needs of the particular application. The ATT is transferred through register 621 to holding register 623 in the IMC. This transfer occurs with the TDW 3 load strobe as holding register 621 receives the ATV.

Figure 36:
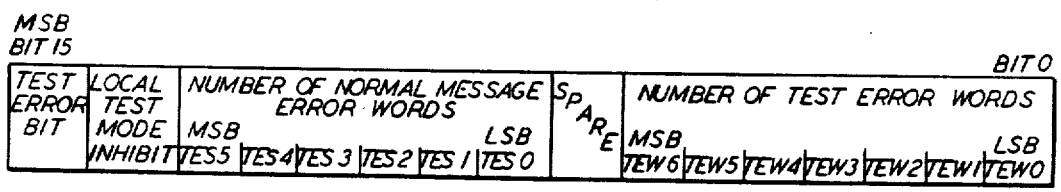

FIG. 36 shows TDW 2 as written by TMC 194 at the end of the test mode service and as read by the computer at the beginning of the DMA update service. As discussed above, bit 15 carried by line 632 is set to a "logic 1" by test error bit logic 634 of the TMC at the end of the test message service if a test message failure occurred during the current update interval. Bit 14 carried by lines 636 is set to a "logic 1" for indicating to the computer that test service is inhibited by a switch on the TMC (not shown). Bits 8-13, generated by NME counter 638, identify the number of message error words that should be read by the computer. These words will only be read by the computer when the test mode stop bit is a "logic 1". Bit 7 is a spare. Similarly, bits 0-6, generated by TMEW counter 640, identify the number of test error words that should be read by the computer when the test error bit is a "logic 1".

FIG. 37 shows TDW 3 as written by the computer in register 621 of the TMC. This word is completely filled by ATV data as shown. Bits 15-4 represent the actual ATV to be used and this information is stored on the appropriate SIC and subcontroller. Bits 0-3 are not accessed by AO's or AI's and, therefore, are only used during modes 4 and 7. This is the only operation of TDW 3 since the word is not used to provide data from the TMC to the computer.

Thus, in summary, it can be seen that the three test control words (TDW 1, TDW 2 and TDW 3) shown at FIGS. 33 through 37 provide the communication path between the computer and master controller for control of test processing and transfer of computer-generated data required for analog testing. The first two words (TDW 1 and TDW 2) are interactive control words which are read and written by both the computer and TMC. The intent is they be read by the computer at the beginning of the DMA update interval, processed during the DMA update interval and written by the computer at the end of the same DMA update interval.

Interactive operation allows the TMC to shut down processing after test errors occur in a particular update frame and remain shut down for successive update frames without further intervention by the computer. This allows the test processors to remain shut down until the computer finishes processing test failure data that occurred in an earlier update frame. The computer resumes test processor operation by resetting the control bits (bit 15) in TDW 1 and TDW 2.

The TMC reads the test data words at the beginning of normal message service, i.e., shortly after the end of the DMA update interval where the computer just finished writing the test data words. The TMC writes the test data words at the end of the current update interval just prior to granting DMA update service for the beginning of the next update interval.

The computer can inhibit both normal message error monitoring and test message service by setting the MSB of TDW 1 high (Test Mode Stop Bit). In addition, it can enable normal message error monitoring service but inhibit test message service by setting bit 15 of TDW 1 low and bit 15 of TDW 2 high (Test Error Bit). If either of these bits are high at the beginning of normal message service, the high status will be restored by the TMC at the end of the current update interval. Hence, from one update to the next, the inhibit state will be maintained until the computer finally resets both bits low. Note, however, the remaining information in both these words, after an inhibit state occurs, will reflect the TMC write status format.

A normal message monitoring error causes test mode stop bit logic 606 in the TMC to set the test mode stop bit high during the update frame in which the error occurred. A test message test failure causes the TMC to set both the test mode stop bit and test error bit high at the end of the update frame in which the error occurred. Since the TMC cannot reset these bits, when a test message test failure occurs, computer intervention will be required to enable normal message error monitoring for the next update interval if normal message error monitoring is desired.

Testing of analog devices requires checking them through a range of analog test values and determining if the analog device responds to the test value within a given analog test tolerance. The ATT is computer-generated and transferred to the TMC via bits 0-7 of TDW 2. The tolerance represents a magnitude band between 0 v and 1245.1 mv with a resolution of 4.9 mv (set by bit 0). When the selected tolerance is less than or equal to a preselected value (39 mv, for instance), the computer identifies this condition by setting bit 8 of TDW 2 high (received by holding register 630). This bit, when set, will result in Mode 5 (Force Test Outputs) testing of MDAC (multiplexing digital to analog converter) type D/A converters being skipped since the test tolerance would be less than the resolution of the MDAC converter.

Operations with the ATV (received as TDW 3 and shown in FIG. 37) involve checking all the analog devices in the system with a particular ATV, then requesting a new ATV from the computer (SN ATV=bit 8) and retesting all the analog devices at the new value. This sequence continues until the computer informs the TMC that the ATV sent out in the previous update interval was the last ATV. When all analog test values have not been checked, the next ATV must be available at the beginning of the next update frame.

The computer can request selection of any of the 7 test mode types described in Table I. It does this by setting bits 11, 12 and 13 of TDW 1 (FIG. 33) to the desired mode code (Mode Command Bits). Mode 5 should not be requested until certain power shutdown procedures have been executed (e.g., motion pumps off, aural cue power amp off, etc.), since the test values utilized in this mode may cause abnormal operation of the simulation equipment.

When no particular test mode is commanded by the computer (uncommanded test mode), the TMC automatically recycles through modes 1, 2, 3 and 4. This is enabled when the test mode command word from the computer (bits 11, 12, 13 of TDW 1 as written by computer) is zero. In the automatic recycling, the TMC will recycle back to Mode 1 after finishing Mode 4. Advancing from one auto-recycling test mode to the next requires computer intervention in that ATV FIN (Bit 14 of TDW 1 as written by computer) must be brought high (line 608) for one update frame. This enables the TMC to advance to the test mode of the next higher number (e.g., 1-2-3-4-1, etc.).

When terminating a commanded test mode where no further commanded modes are desired, the computer must command one of the auto-recycling modes (1 through 4) before going to the non-commanded state. Otherwise, the TMC will remain selected at the last commanded mode if it was Mode 5, 6 or 7.

When the non-commanded mode is selected, the actual mode selected for the previous update interval is indicated to the computer via bits 11, 12 and 13 of TDW 1 as written by TMC. Continuation of uncommanded mode operation in the next update interval requires setting these bits low by the computer.

FIGS. 38 and 39 show the normal message error words 1 and 2 (NMEW 2 and 1) as written by the TMC and read by the computer. These words are always used as word pairs. Bits 0–6 of NMEW 2 (FIG. 38) are spares and unused. Bits 7-15 contain the address of the SIC involved with a communication error which occurred during normal message update service executed in the previous update frame. NMEW 1 provides information concerning the error or errors which occurred on the SIC identified in NMEW 2. Bits 0–3 identify the number of input words not stored, bits 4–7 identify the number of output words not stored and bits 8–15 identify the word frame in which there was a failure of address data.

The PDM provides storage capacity for identifying normal message errors for up to 22 SIC's. If more than 22 SIC's have normal message errors in a particular update frame, only the first 22 can be identified. The first 22 SIC malfunctions must be corrected before identification of errors to other SIC's is possible.

The normal message error section of the PDM is read by the computer and written by the TMC only if an error occurs. Consequently, old error data is normally not erased but instead written over by new error data. The new error data storage starts at the top of the normal message error list and progresses downward (incrementing PDM address) to the end of the list. As was mentioned above, when the test mode stop bit goes high for the first time (set by the TMC), the number of error words signifying the occurrence of new error data, identified by bits 8 through 13 of TDW 2 (FIG. 36), is reset to the associated number of failures.

FIGS. 40, 41, 42 and 43 show the test failure word format for a SIC. These words are used in groups of four. Test failure word 4, shown in FIG. 40, is used to identify the SIC and word address at which the test failure occurred. Bits 7 through 15 identify the SIC address, and bits 4 through 6 identify the word address. Bits 2 and 3 generated by word type generator 641 identify the type of word tested. For example, if bits 2 and 3 are "0 0" then the failure was in the subcontroller D/A or A/D or in the transmission of the serial message itself. If bits 2 and 3 are "0 1", then the failure was a discrete bit word failure. If bits 2 and 3 are "1 0", then the failure was an arithmetic word failure. And, if bits 2 and 3 are "1 1", the failure was an analog failure. Bits 0 and 1, generated by failure word identifier 642, provide information as to which of test failure word 1-3 are to be read. This is important since data is not erased from these words but simply written over. Therefore, this information is necessary to assure that stale data is not read. If bits 0 and 1="0 0", then an error occurred during the serial test message communication and the test failure messages for this device word should be ignored. If bits 0 and 1="0 1", then test failure word 1 is to be read. If bits 0 and 1="1 0", then test failure words 1 and 2 are to be read. And, if bits 0 and 1="1 1", then the test failure words 1, 2 and 3 are to be read. Test failure word 1 (FIG. 40) contains the test response for discrete bit ones or arithmetic word ones (if DB or AW word). Test failure word 2 (FIG. 42) contains the test response for discrete bit zeros or arithmetic word zeros (if DB word or AW word); the serial message response word (if serial message test mode); or the analog response word (if analog word). Test failure word 3, shown in FIG. 43, contains the test command value for the various device tests.

The PDM provides storage capacity for identifying test failures for up to 16 words on the SIC. It may take up to four words/SIC word to describe a test failure; however, sometimes less than four words/SIC word will be required. TMC control circuitry, however, is organized to occupy 4 PDM address locations/SIC device word irregardless of the number of failure words required. Therefore, the computer is informed of how many of the words in a 4-word group to read and which ones via the failure word bits 0 and 1 in test failure word 4.

It is essential to read the information in bits 0 and 1 as well as the number of test failure words information in TDW 2 as written by the TMC (FIG. 36) because old failure history is not erased but written over by the TMC when failure occurs. For example, if the new SIC word failure involved storage of only three failure words which were written over an old failure history that involved storage of four failure words, the necessity of reading only where the new failure information is stored can be appreciated.

If the code provided by bits 0 and 1 is zero, the test failure data should be ignored because a serial message communication error during test message service occurred. In particular, the SIC under test did not respond to an active word address.

The test command value (Test Failure Word 3) during discrete bit word testing has significance as it identifies non-existent bits in partially-filled discrete bit words. This word represents the command value for the discrete bit zeros test and normally is all zeros. However, for partially-filled discrete bit words, the non-existent bits appear as "logic 1's" in the test command value word and, consequently, the same bit positions in the discrete zeros response word (Test Failure Word 2) must appear in the same state for a successful response.

Test Failure Word 3 will indicate: the ATV during analog device test and during serial message transmission test (Mode 4 or 7), all zeros during an arithmetic word test, and the simulation program value during Mode 1 output device monitoring.

The primary data source for control of normal message service and test message service is SIC word count data and test mode type. The word count data—a segment of output pointer data—identifies the number of each type of I/O device contained on a SIC which can be any combination of 6 different types. These are: number of discrete output bits (DBON), number of arithmetic word outputs (AWON), number of analog outputs (AON), number of discrete input bits (DBIN), number of arithmetic word inputs (AWIN), and number of analog inputs (AIN).

The basic method of message word control is to: load a set of downcounters with this pointer data (during pointer data dump cycle); then first access the discrete bit word counters; decrement them each word frame as successive discrete bit word messages are executed until the count reaches zero; then access the arithmetic word counters; decrement them once each word frame as successive arithmetic word messages are executed until the count reaches zero; then access the analog word counters; decrement them once each word frame as successive analog word messages are executed, whereupon attaining count zero (all word counts zero), message service to that SIC is terminated.

The discrete bit counters in the OMA (and IMA during normal message service) are actually decremented up to 16 times/word frame. In the OMC, the number of discrete bits is converted to the number of discrete bit words—DBON/16 and DBIN/16, respectively, where any remainder yields an additional discrete bit word. The resultant numbers are respectively added to AWON and AWIN to yield the number of discrete words (DWON and DWIN). These numbers then preset a set of discrete word downcounters.

Figure 16A:
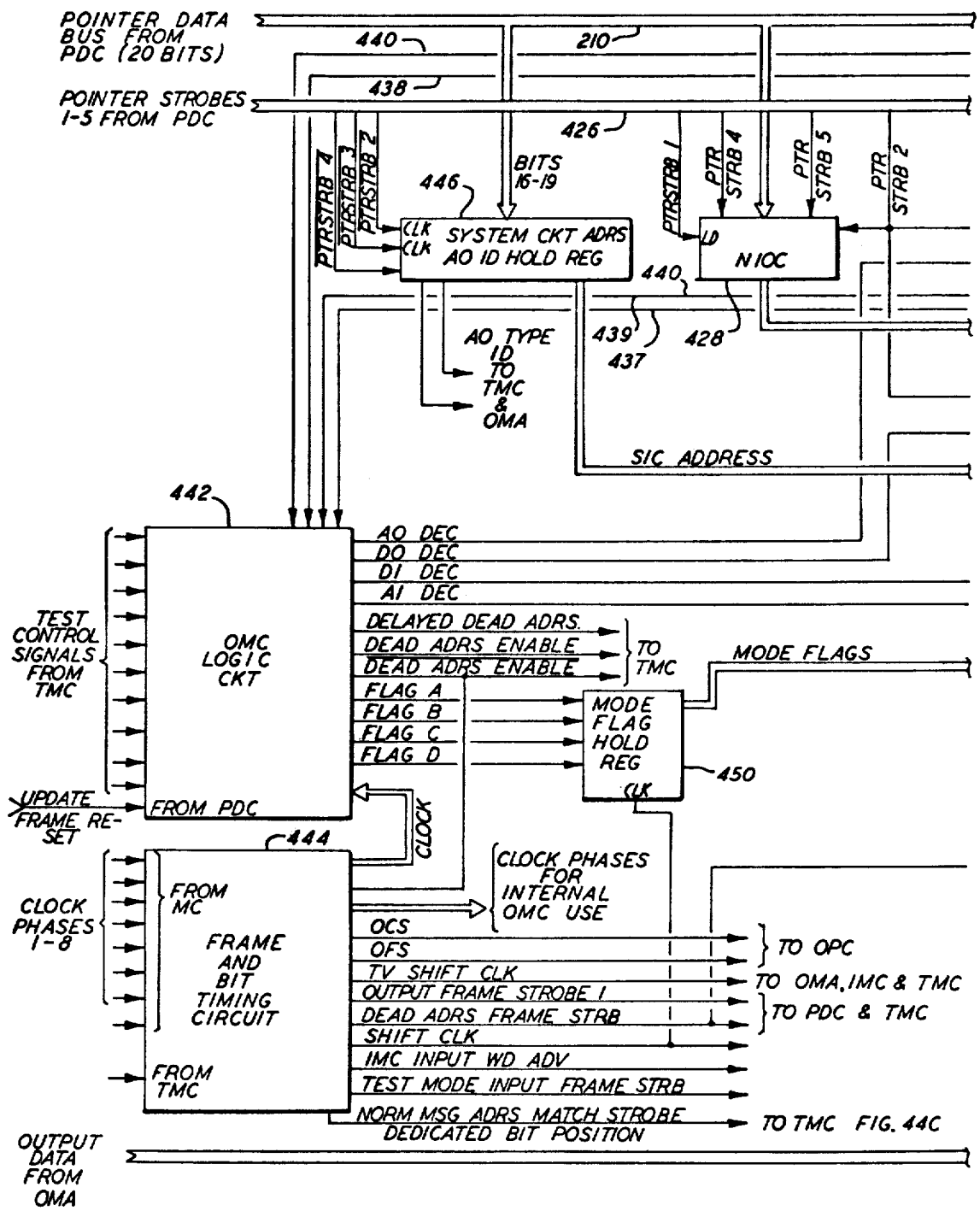

OMC 126, shown in FIGS. 16A and 16B, utilizes these word counts (DWON, AON, DWIN and AIN) to determine the total number of active address frames. By accessing them in the order discrete words first, analog words last, in conjunction with test mode type identification signals, they control the state of mode flags D, C, B, A, produced by OMC logic circuit 442. The mode flags provide control information to the subcontroller and SIC via the OAS for: identifying the message type, directing whether the A/D output should be read, directing whether an output data store strobe and/or input data read strobe should be generated, selecting the closed loop test connection on the SIC and subcontroller, generating the DBI/AWI test signals ($V_R/V'_R$), and reading the output data word for generating the analog test signal. The mode flag functions are summarized in Table I.

The word counts received from OMC 126 are converted to two total word counts for the normal message error status word. This is accomplished by total number of I/O words computer 643 shown in FIG. 44. Store status downcounter 644 stores the total number of output words, and store status downcounter 646 stores the total number of input words received by dual holding register 648. During the course of normal message communication to a SIC, each downcounter is decremented respectively, after the satisfactory transfer of an output data word to the holding register on the SIC, and after the satisfactory transfer of an input data word on the SIC to the IMA in the master controller. At the end of normal message service to each SIC, the error status word is evaluated by the TMC for a non-zero condition. If non-zero (errors occurred), control circuitry in the TMC will cause the store or NMEW-1 and NMEW-2 in an appropriate section of the PDM. The data flow for storage of these words is shown in FIGS. 31 and 44.

Figure 15B:
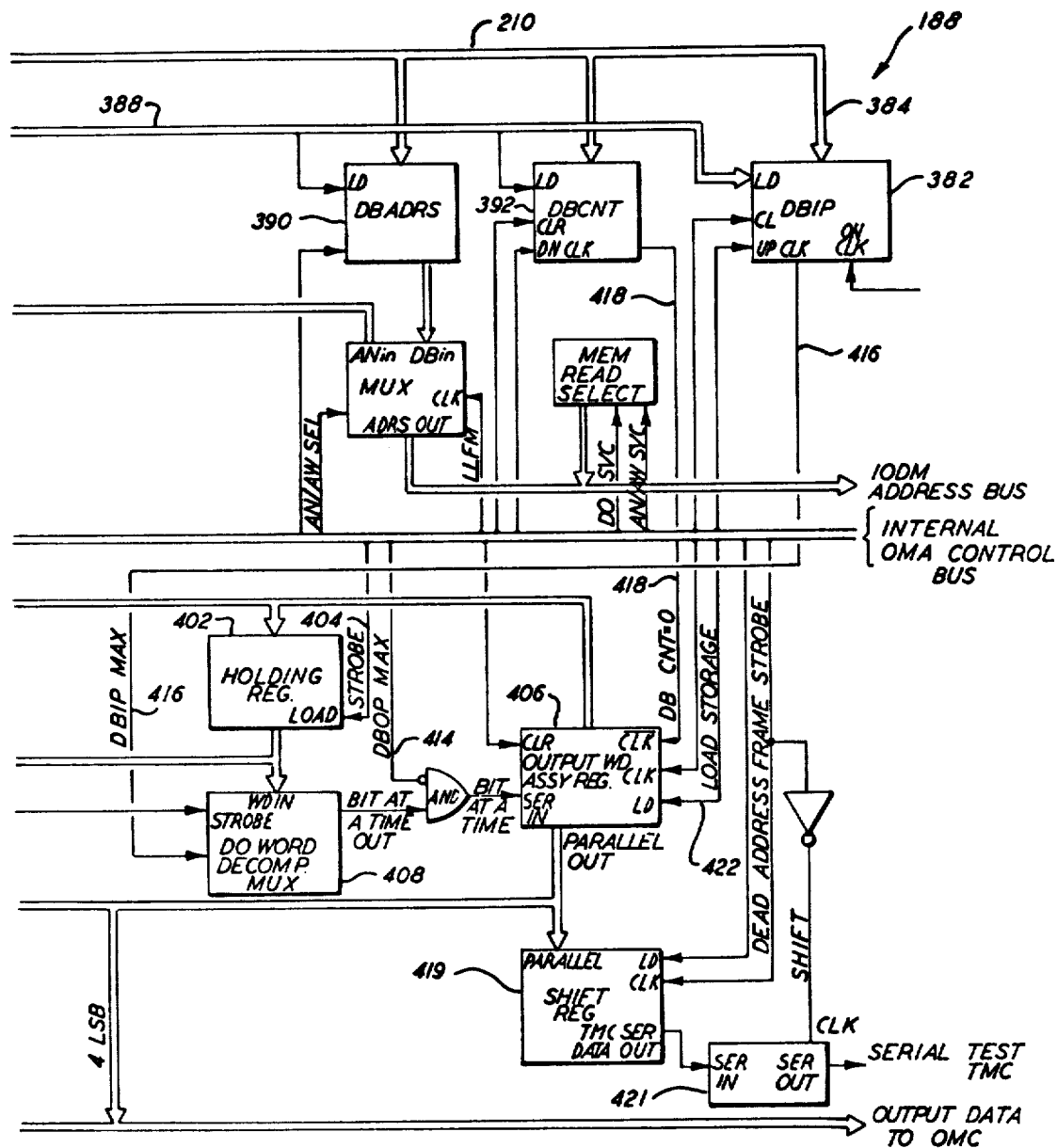

Referring now to FIGS. 15A and 15B, it can be seen that there are only three word type counters in the OMA-DB (392), AW (394) and AN (398) for discrete bits, arithmetic words and analog words, respectively. The counter inputs are normally loaded (preset) with the output word count segment of pointer data during normal control message service and test message service involving output I/O device type test (i.e., Modes N, 1, 3, 4, 5 and 7). During test service involving test on input I/O device types (Modes 2, 6 and Mode 3 if AON is zero), the counter inputs are preset with the input word count segment of pointer data.

Referring now to FIGS. 16A, 16B and 44, OMC operations involved in generating the normal message error status word are as follows.

Output word store status (Bits 4, 5, 6 and 7 of NMEW-1 shown in FIG. 44) is generated by presetting downcounter 644 with the total number of output words one word frame after the pointer data dump cycle (Output Shift Clock 8 of second active address frame), and decrementing this count upon receipt of the "Output Words Stored Strobe" signal from IMC 234.

This signal from the IMC is derived from the IDS header bit which is set "logic 1" by the subcontroller if: the output data word transmitted in the previous word frame was received free of parity error, the SIC and subcontroller responded to the address data for that word frame (address match) and the ODS contained information that was to be stored in a holding register in the SIC. When these conditions are met, an output data store strobe is generated by the subcontroller. Consequently, when all output data words for a SIC have been received by the subcontroller free of error, the resultant count at the end of serial message service to that SIC will be zero.

Input word store status (Bits 0, 1, 2 and 3 of NMEW-1) is generated in a similar manner by loading downcounter 646 with the total number of input words and decrementing the count upon receipt of the "Input Words Stored Strobe" signal from the IMC. This signal is generated at the end of each input word frame if: the input data word was received by the IMC free of parity error and timing error, and the IDS contained information that was to be processed by the IMA and stored in the IODM. The resultant count at the end of serial message service to that SIC will be zero if all input data words were received by the IMC error free.

The address portion of the error status word consists of a dedicated bit position for each of the 8 possible SIC word addresses (Bits 8-15, FIG. 39). This information provides indication: that the address data was received by the subcontroller free of parity error which allowed the subcontroller and SIC to respond to the serial message, i.e., input data transaction occurred and/or output data transaction occurred (if output data was received error free). The address match information allows identification of an address data error to the word address level because of the dedicated bit for each word address.

Generation of an address match signal requires the address data to be recognized by both the subcontroller and the appropriate SIC. If the SIC is not connected, no address match will occur. When no address match occurs at the end of each output frame, both the subcontroller and SIC will be turned off (deactivated). Turn-off of the subcontroller inhibits generation of the IDS, ICS and IFS from that subcontroller.

Detection of a word address match signal involves verifying the existence of an input clock stream (ICS) 6 μs into the output word frame (6th output shift clock). Since the ICS, IDS and IFS lag the output streams by one word frame, evaluation of ICS existence is delayed one word frame. Consequently, assembly of the error status word is not completed until one frame after the last active address frame (end of dead address frame). The address match status is known shortly after the beginning of a word frame (after the one frame lag) while the stored strobe status is not available until the end of the word frame.

The dedicated bit positions for address match data requires that 8 shift clocks/SIC services be generated for assembler 650. An address match results in a logic zero being placed in the bit position associated with that word address. When a particular SIC contains less than eight word addresses, logic zeros must be placed in the non-existence word address positions. This occurs at the beginning of the dead address frame shortly after occurrence of one clock phase 6 when the address match status for the test active word has been processed. Logic zeros are shifted into the address match assembler at a 1 MHz rate until a total of 8 shift clocks/SIC service has occurred. This represents the end of normal message error monitoring.

Shortly after occurrence of the eight shift clocks, assembler 650 generates an error status data ready strobe 649. This signals the normal message error word processor (NMEWP) in the TMC to evaluate the error status word. This is performed by AND gate 652 in FIG. 44C. A non-zero word denotes a failure and causes the NMEWP to initiate a 2 word storage cycle to the normal message failure section of PDM. The first write access cycle to PDM results in storage of the error status word itself (NMEW 1) through channel A of MUX 624. This storage is at an address determined from the value of NME counter 638 summed with a hardwired constant. The NMEW 1 store cycle terminates by incrementing NME counter 638, requesting a second access to PDM at the next higher address, and transfer of SIC address data into MUX/LATCH 654 and then in to channel A of MUX 624. The completion of this cycle results in storage of NMEW 2, increment of NME counter 638 and reset of assembler 650 for generation of the error status word to the next SIC.

Figure 45B:
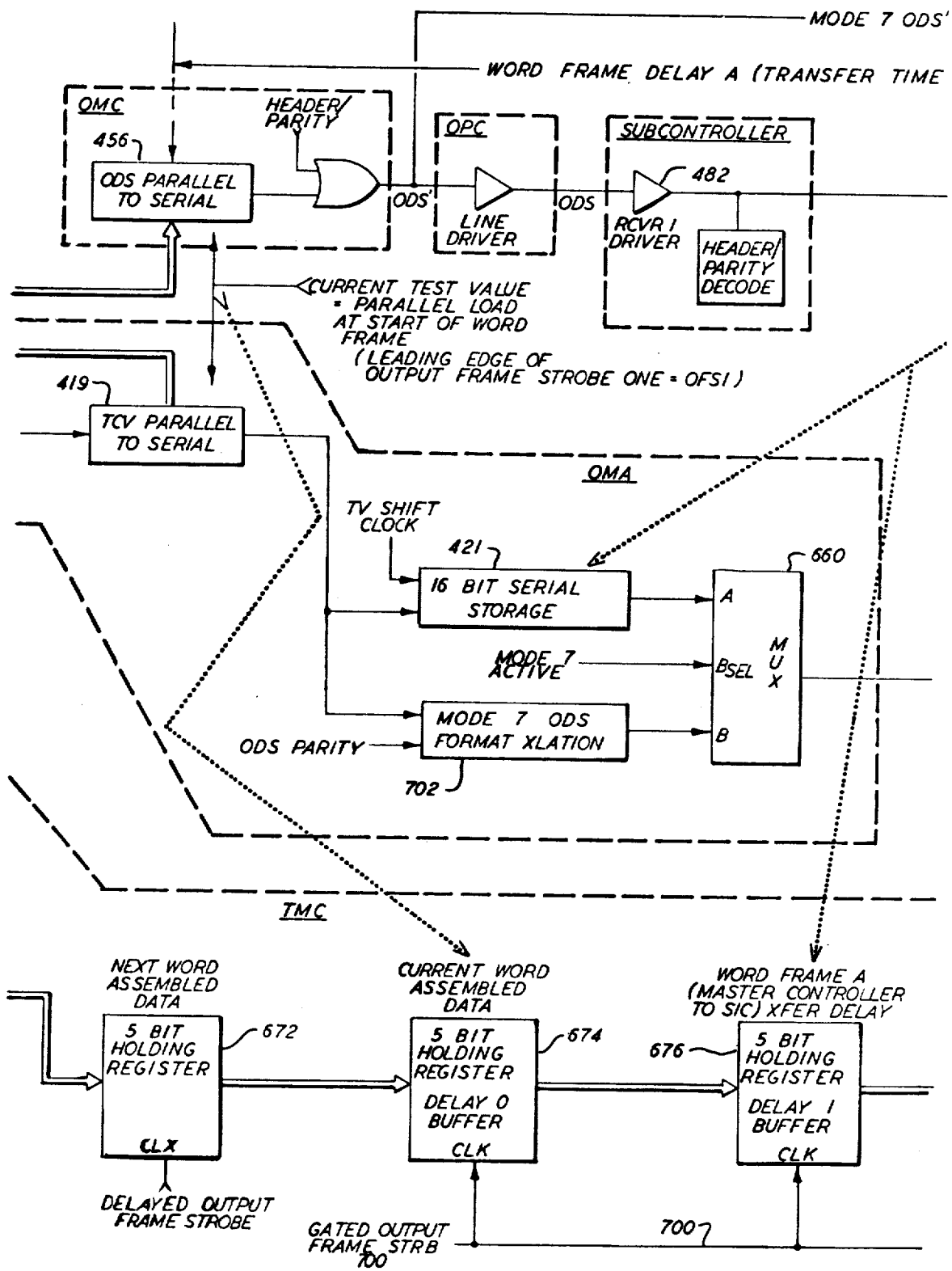
Figure 45D:
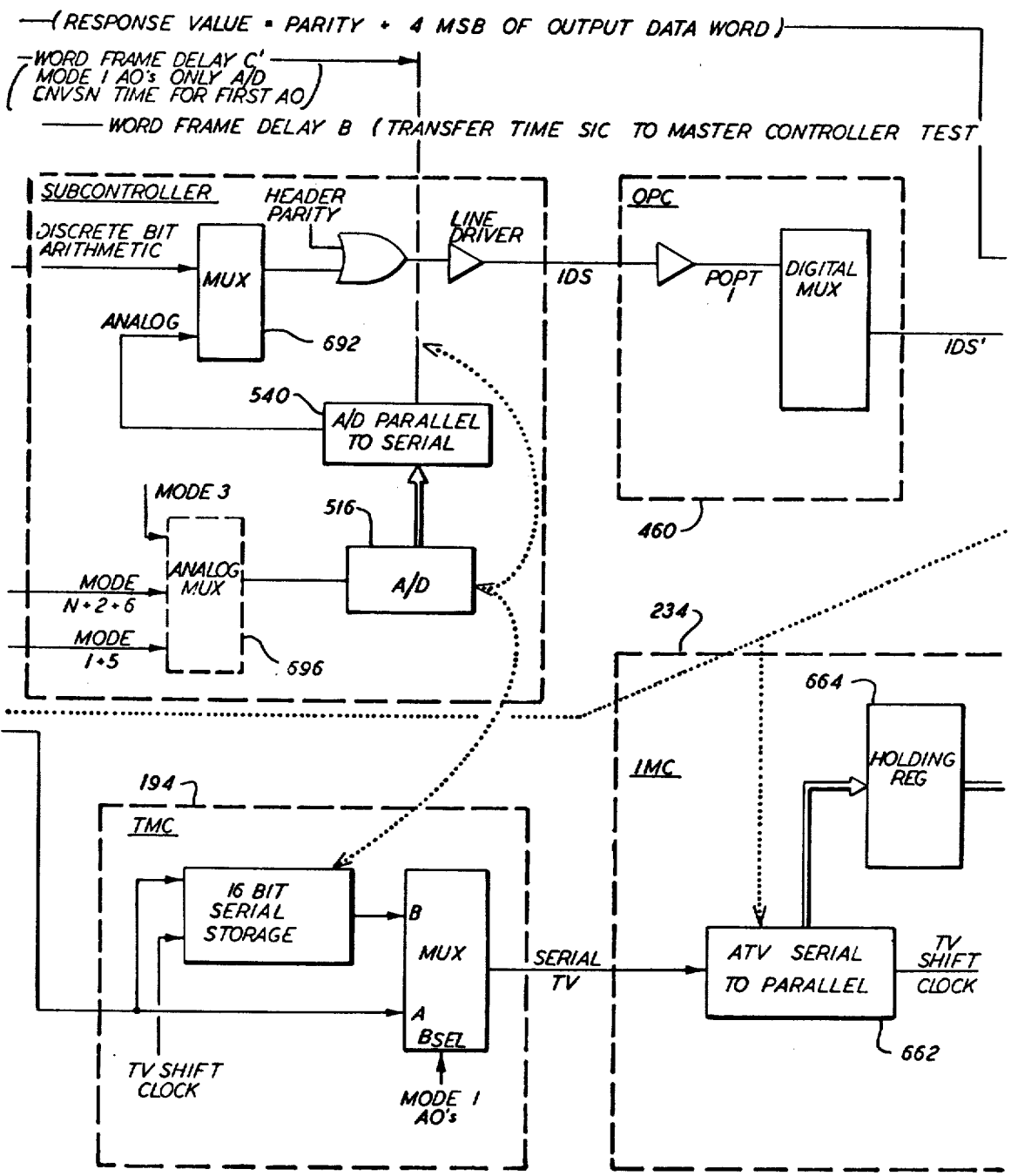
Figure 45E:
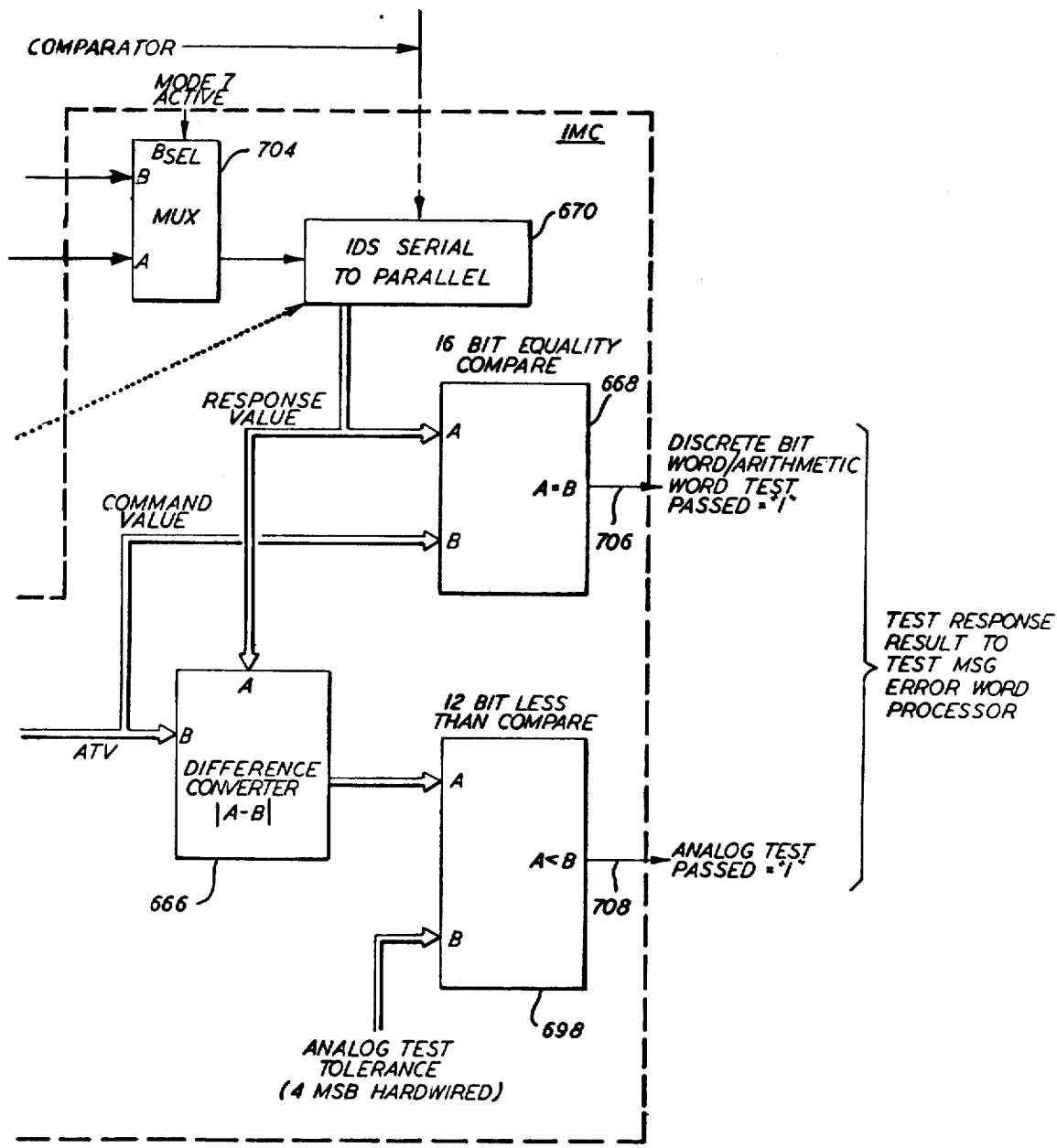
Figure 46B:
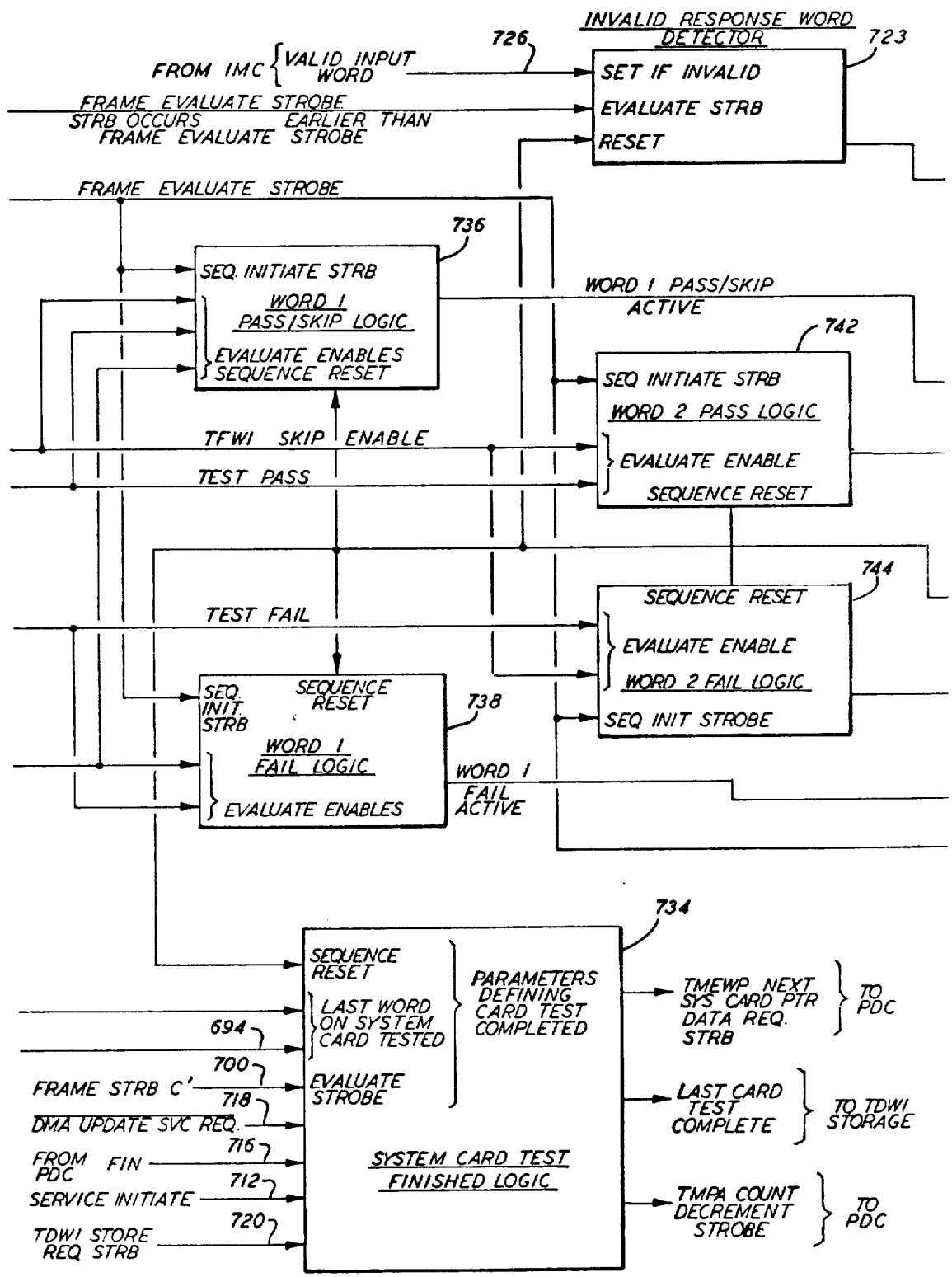
Figure 46C:
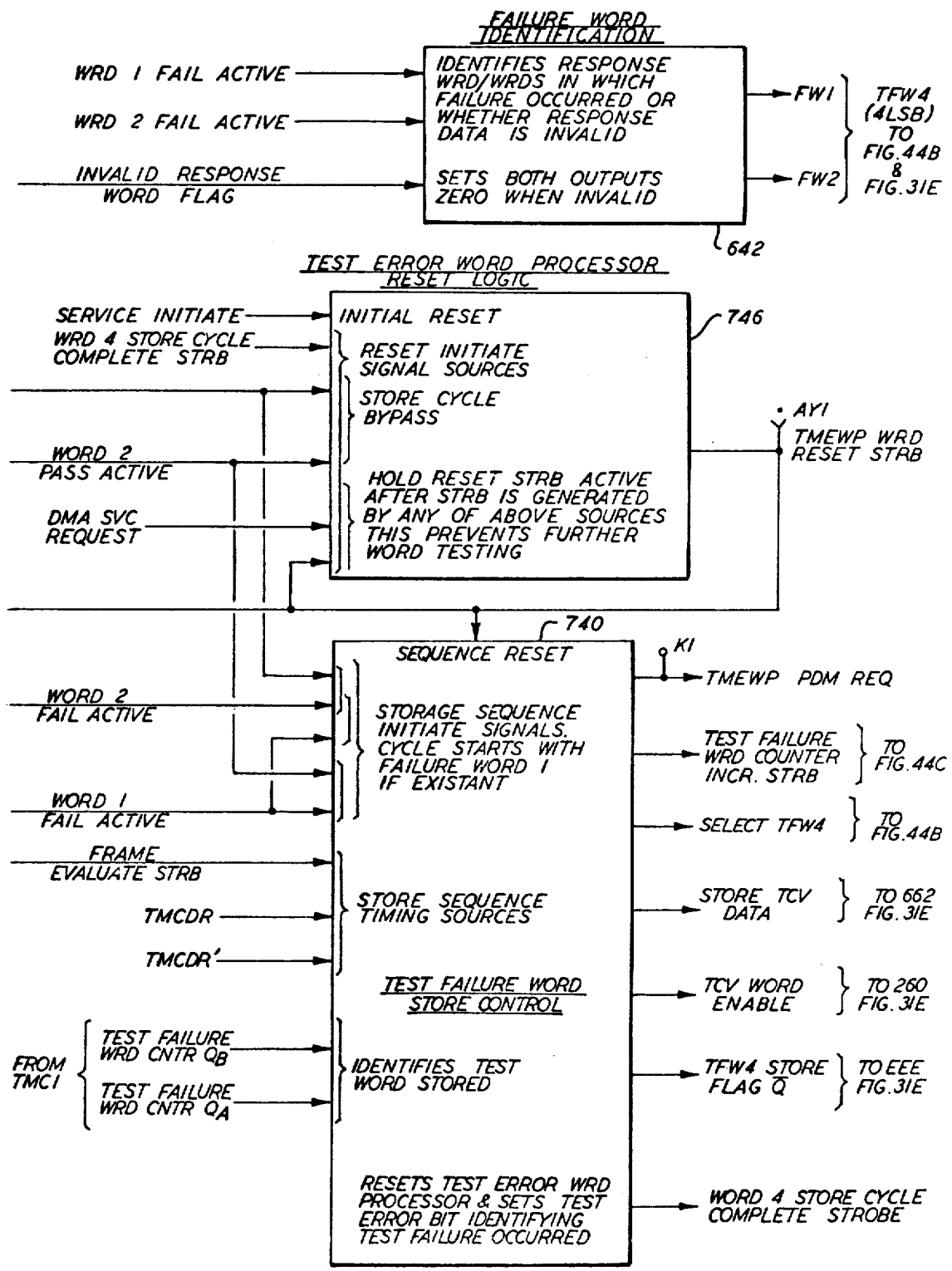

Referring now to FIG. 45 and FIG. 46, the TMC operations involved in generating test failure messages are as follows. FIG. 45 indicates the elements involved in generating and responding to a test message. The "output" of the circuits shown in FIG. 45 is a set of test failure pass status signals, I/O device type identifiers, and a set of command codes for directing operations in the test message error word processor. These outputs are inputs to the circuits shown in FIG. 46 where the latter FIG. indicates the elements in the test message error word processor (TMEWP). The TMEWP function is to evaluate the test failure/pass status signals for a test failure condition and if a failure occurred, generate test failure messages and store in the appropriate section of PDM.

The essential functions of the subsystem of FIG. 45 consist of:

1. Generating the test command value (TCV)—circuit 406;
2. Generating an identifier code for the I/O device under test (WT1/WT2)—circuit 656;
3. Generating a command code for directing the TMEWP failure word storage sequence (WTA/WTB/WTC)—circuit 658;
4. Outputting the TCV and test connection command to the SIC under test via the ODS and/or OAS;
5. Outputting the TCV (circuit 419) through word frame delay array (circuits 419, 660, 194, 662 and 664) so that it arrives at the test evaluation comparator input (circuits 666 and 668) at the same time as the response word from the SIC under test (output of circuit 670); and
6. Transferring the I/O device type identifier code (circuit 656) and TMEWP command codes (circuit 658) through word frame delay array (672, 674, 676, 678, 680 and 682) so that the associated command code is presented to the TMEWP 684 (FIG. 46) at the same instant that the response word from the SIC under test is presented to the test evaluation comparator input.

Items 1, 2 and 3, above, are generated simultaneously at the beginning of a word frame. Items 2 and 3 are delayed through an adaptive pipeline network where the number of word frame delays (length of the pipeline) is adjusted to match the transfer time of the TCV to the SIC under test and the transfer time of the resultant response word back to the test evaluation comparator inputs in the IMC. Dotted connecting lines in FIG. 45 correlate the item 2 and 3 delays to the TCV propagation through the SIC and response word reception in the IMC. The transfer time also includes additional word frame delays to allow settling of analog output devices. The standard D/A requires approximately three word frames for the output to settle to a new input value. The TMC accounts for this by repeating the TCV for three consecutive word frames but preventing the TMEWP from evaluating the response for these first three word frames by sending command code 000 for these word frames.

Transfer of the TCV to the SIC under test (Item 4, above) is accomplished via information on the output data stream (circuits 456, 460, 482, 554 of FIG. 45) and/or information on the address data stream (vis mode control flags A, B, C, D). The latter is illustrated in FIG. 31 (circuits 686, 452, 460, 482, 492, 688, 690, 548, 546 and 550). Recall that mode control flags A, B, C, D establish the test connection on the subcontroller and/or SIC. These flags also generate test signals on the subcontroller $V_R/V'_R$ (via lines 510, 512 of FIG. 31) for testing discrete bit input and arithmetic word input devices on the SIC.

Transfer of the response word from the SIC under test to the test evaluation comparator inputs in the IMC depends on the test mode type and nature of the I/O device. Modes 1, 2, 4, 5 and 6 involve check of devices on the SIC. Modes 1 and 5 involve test of output devices. If DO or LO (circuits 568 and 576, respectively, of FIG. 31D), closed loop test gates provide connection of the device output to the input data word bus (circuits 570, 584 and 556, respectively, of FIG. 31D). Circuit 584 also performs level translation from LO logic levels to T²L logic levels required by the input data word bus. The response word is parallel loaded to shift register 556 at the beginning of the word frame in which the response word is transferred back to the IMC.

The response word is then serial transferred to the subcontroller via the SCIDS where header and parity bits are attached via mux 612 and the serial transfer to the MIC continues via the IDS to serial to parallel shift register 670. At the end of the word frame, the outputs of shift register 670 are applied to the inputs of 16 bit equality comparator 668 in conjunction with the test command value which also has arrived at TCV holding register 664 at the same time.

At this instant, command codes 694 of FIG. 45 are input to the Test Message Error Word Processor illustrated in FIG. 46 where they command the TMEWP to evaluate the status of the "Discrete Bit Word/Arithmetic Word Test Passed" line and initiate a 4 word storage sequence in the test failure word section of PDM if a test failure occurred.

Figure 31A:
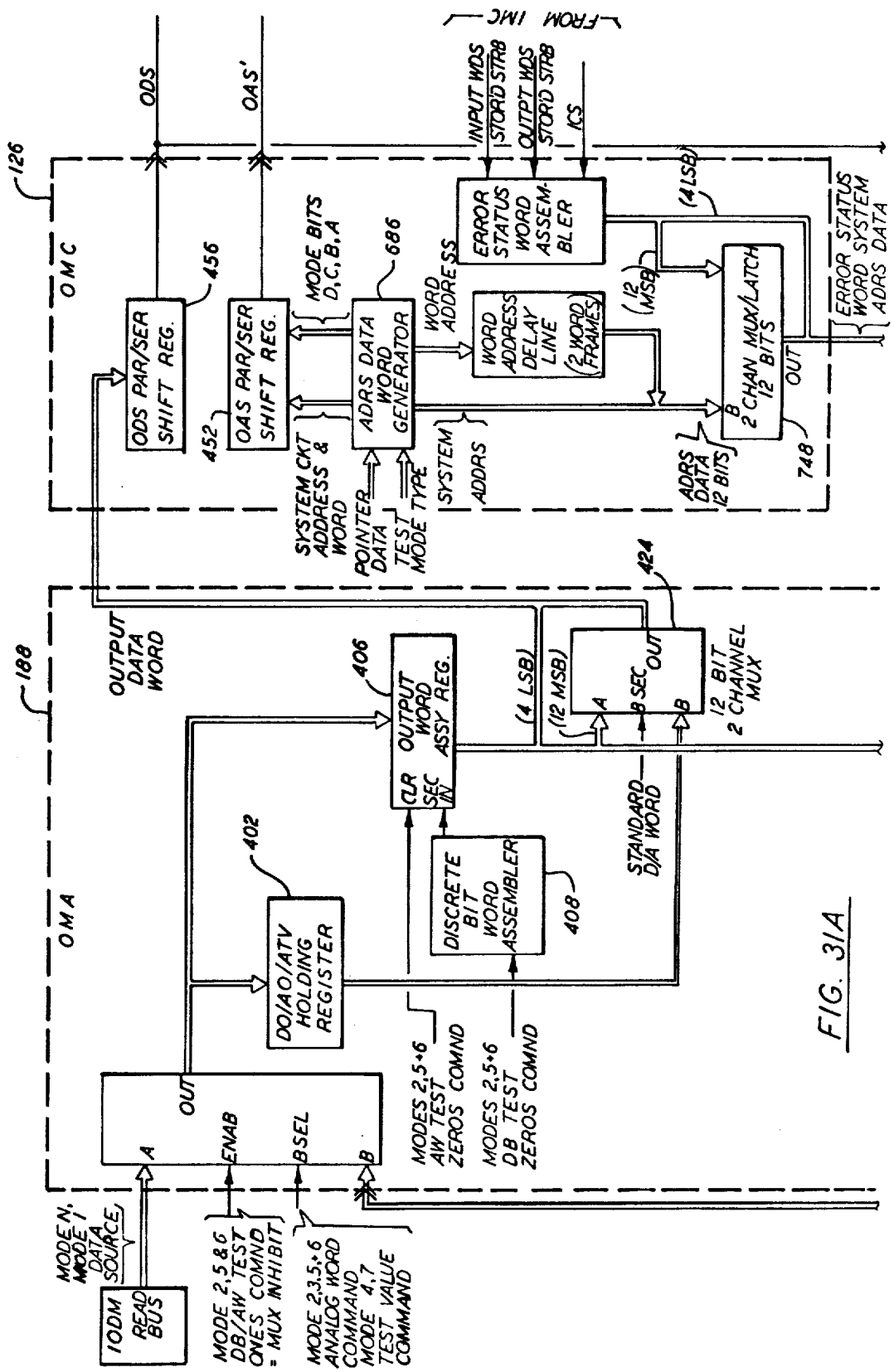
Figure 31B:
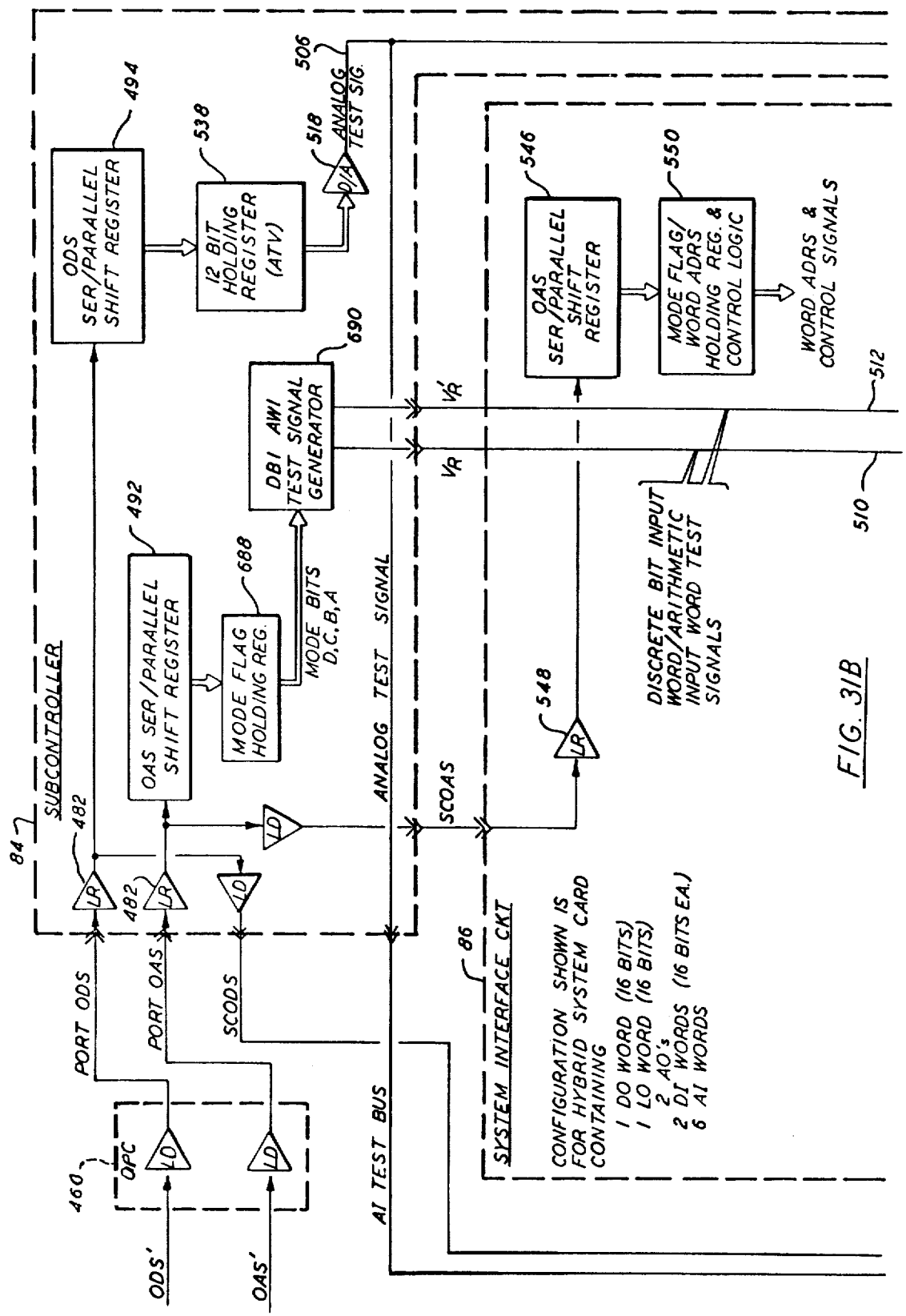
Figure 31D:
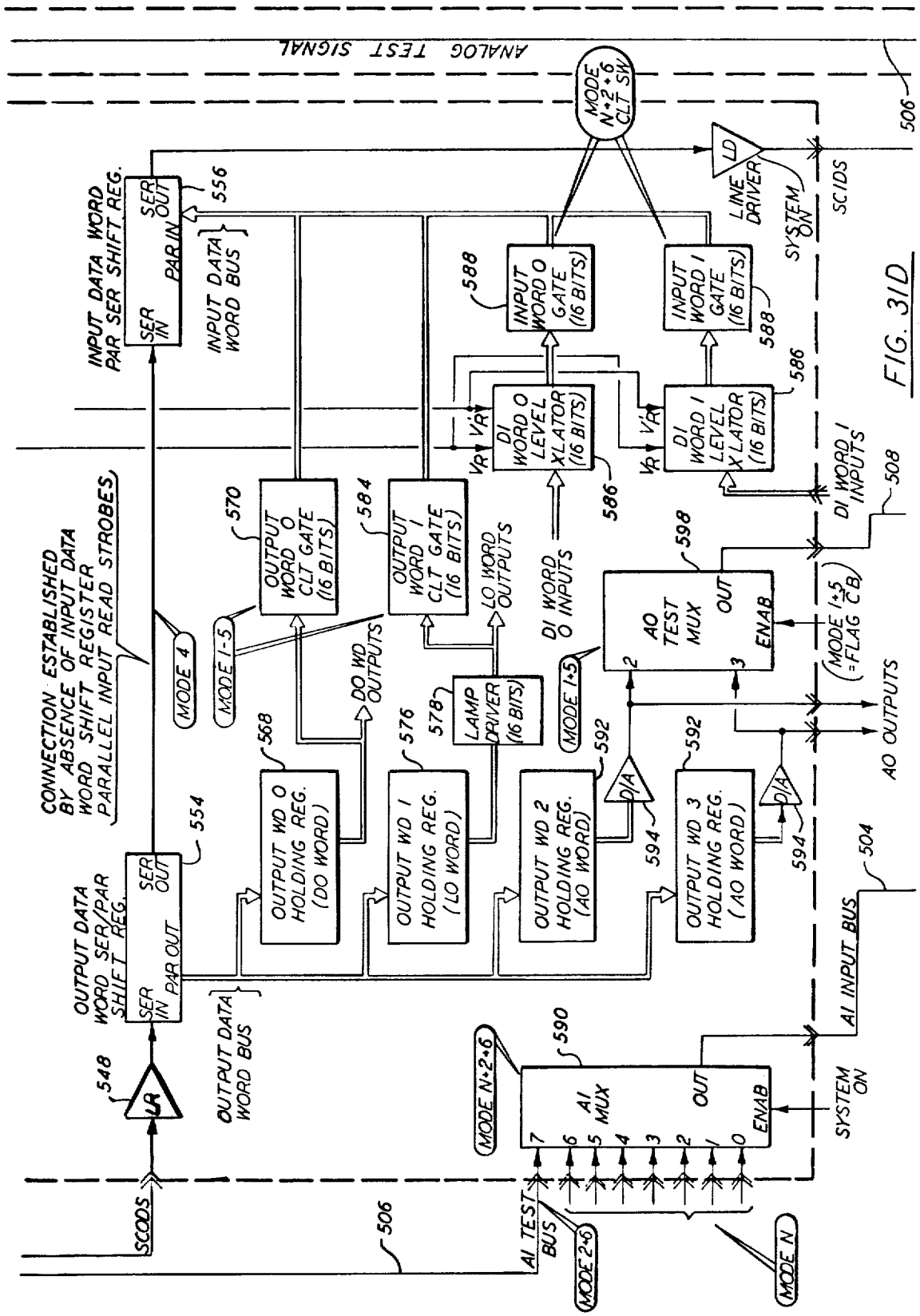
Figure 31F:
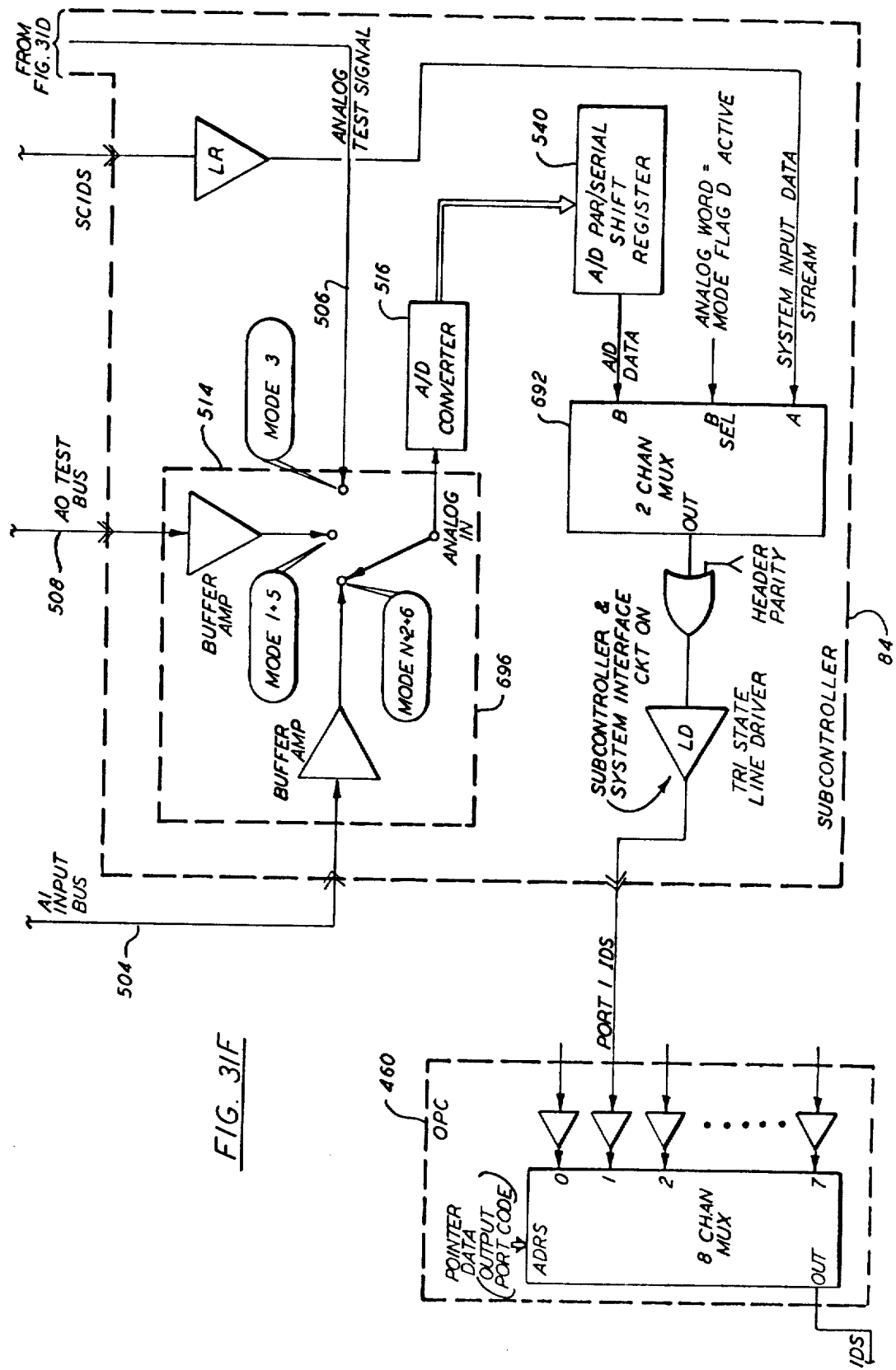

Returning to the Modes 1 and 5 description, it the device is an analog output (AO), AO test mux 598 in FIG. 31D is activated which connects the D/A 594 which is under test to AO test bus 508. Decode of the mode flags A, B, C, D in the subcontroller causes analog multiplexer 696, shown in FIG. 31F, to connect to the A/D test bus to the input of A/D 516 and initiation of the A/D convert cycle. At the end of the word frame, the A/D digital output is transferred to register 540 where it is then serially transferred during the next word frame to serial/parallel register 670 in the IMC. At the conclusion of that word frame, register 670 output is presented to computer 666 which computes the difference between A and B (i.e., |A-B|) concurrent with the TCV resulting in a difference signal which is compared by comparator 698 against the analog test tolerance (ATT). If the difference signal is less than the ATT, the analog word test is in a PASS state. At this instant, command codes 694 of FIG. 45 are input to the TMEWP (FIG. 46) commanding the system to evaluate the "Analog Test Passed" line and initiate a 3 word storage sequence in the test failure word section of PDM if a test failure occured.

The A/D convert cycle requires a full word frame to perform the conversion and, consequently, reception of the A/D test response at the IMC is delayed one word frame, Mode 1 testing of the first AO on each SIC requires compensation for this additional word frame delay. This is accounted for by delaying presentation of command codes 694 of FIG. 45 to the TMEWP inputs (system of FIG. 46) through the delay 3 buffer (680) in FIG. 45. The delay 3 buffer injects one additional word frame delay. The delay 3 buffer is switched in to the delay network at the conclusion of digital output processing (DO's/LO's) which does not require the additional frame delay.

Mode 1 testing of AO's involves connection of each AO to AO test bus 508 (FIG. 31D) for one word frame only. Hence, while the digital value for the AO #1 test response is being transferred back to the IMC, A/D converter 516 is busy converting the test response for AO #2. The AO test values for Mode 1 testing was previously transferred to the D/A inputs during the normal message service to that SIC. Consequently, the SIC D/A has settled by the time test service begins.

Mode 5 testing of AO's, on the other hand, involves transfer of the analog test value to the D/A input which is different from the value at the D/A input before test service begins. Consequently, additional time must be provided to allow the D/A to settle before starting the A/D conversion of the test response. This is achieved by transferring the TCV to each output device for five consecutive word frames and performing an evaluation of the test response every fifth word frame. Command code 694 is transferred to the TMEWP every fifth frame by gating the frame strobe (strobe 700) that clocks the command code and word type code delay array. Although five consecutive A/D conversion cycles will be performed, only the fifth response will be evaluated in the IMC.

Mode 5 testing of digital outputs, DO's or LO's, also involves repeating the test value for five consecutive word frames but differs from AO testing in that no A/D conversion is required. Instead, two test values per SIC word address are required. The first test value is an "all ones" test and the second test value is an "all zeros" test as previously explained. During Mode 1 testing of DO's/LO's, only one test value per SIC word address is generated since Mode 1 merely involves checking that the DO or LO attained the value transferred to the SIC during the normal message service to the SIC.

Repeat of the test value to a given SIC is achieved by inhibiting OMA next data word assembly operations and OMC next address word assembly operations for the desired number of repetitive word frames. These inhibit signals are generated by the TMC. When testing discrete devices (DO's, LO's, AWO's, AWI's or Di's), OMC next address word assembly operations are inhibited for a longer period than the OMA, since the OMA has to assemble the test discrete zeros word before starting assembly operations for the next SIC device word.

Mode 4 testing involves verifying that a 16 bit data word can be passed from the master controller to the serial to parallel shift register 554 on the SIC (shown on FIG. 31D and FIG. 45) and back to the master controller via parallel to serial register 556 on the SIC without data alteration. The technique implemented involves transferring six consecutive words through the SIC and evaluating the six responses for no errors for a successful test passed condition. The analog test value is used as the TCV and the same 6-word test is executed for all SIC's independent of the type and number of I/O devices on the SIC. A 16 bit equality compare is performed. The six word frame sequence is generated from a counter internal to the TMC. SIC word counts are ignored. FIG. 45 indicates a three frame delay occurs in reception of the first response word at the IMC necessitating activation of the word frame delay circuitry 680.

Mode 7 testing is similar to Mode 4 except the loop is closed at the master controller serial stream interface. It differs from Mode 4 in that fewer serial delays exist and in the format of the serial message word. The ODS is connected to the IDS and since the word formats are different (ODS is: header, parity, 16 data bits; IDS is: header, 16 data bits, parity), the test command value sent to the IMC has to be modified accordingly. The response received on the IDS will be Parity and the 15 MSB data bits. The serial TCV during Mode 7 operation is modified to be in accordance with this format via the Mode 7 ODS format translator 702 of FIG. 45. Mode 7 execution is based on the pointer data base; hence, Mode 7 will be run for as many SIC's as there are in the pointer data base. The Mode 7 test connections are accomplished via mux 704 in FIG. 45 and FIG. 31, and associated command code 694 delays are accomplished via channel A of mux 682, as shown in FIG. 45.

Mode 2 testing is the same as Mode 6. During Mode 2 and 6 testing, the DMA generates test command values for exclusive use by the IMC test evaluation comparator when digital word inputs (DI's or AWI's) are being tested. The OMA device type counts are used by the TMC control circuitry to generate the appropriate command codes (code 694) and to control mode flag A in the OMC which informs the subcontroller whether to generate a test ones signal or test zeros signal for test of digital inputs on the SIC (via circuits 690 and lines 510, 512 of FIG. 31B). The ATV is continuously output on the ODS during Mode 2 or 6 testing which is received by shift register 494 and held by register 538 (FIG. 31B).

Upon completion of testing digital inputs on the SIC, testing of analog inputs proceeds. If the SIC contains AI's, word address 7 is sent to the SIC which connects D/A 518 (FIG. 31B) on the subcontroller to analog input mux 590 on the SIC (FIG. 31D) and an A/D conversion cycle is initiated in the next word frame. If the SIC contained AI's as the only input device, the test value is sent to D/A 518 for four consecutive word frames to allow for D/A settling time. Consecutive subcontroller A/D conversion cycles will occur in successive word frames but the first three analog responses received to the IMC will not be evaluated. After the minimum settling time has elapsed (three word frames), the fourth A/D conversion cycle is complete (performed in fourth word frame) and the resultant response transferred to the IMC (end of fifth word frame). Command code 694, shown in FIG. 45, causes the TMEWP (system of FIG. 46) to evaluate the analog test passed signal line 708 shown in FIG. 45 and initiate a three word storage sequence to the test failure section of PDM if a test failure occurred. Testing of AI's is limited to verifying performance of AI mux channel 7 on each SIC.

The AI three frame settling time sequence starts with start of test to each SIC. If the SIC contains digital inputs as well as AI's and it requires three or more word frames to test the digital inputs, the AI settling time is bypassed. This bypass is possible since the subcontroller D/A received the analog test value upon reception of the first test command for test of the digital input devices. The D/A will have settled out within three consecutive word frames.

Mode 3 testing involves checking the performance of the subcontoller D/A and A/D. The test is only executed to the subcontroller if the subcontroller is associated with SIC's containing analog output or analog input devices. Mode 3 testing commences with a pointer data dump cycle, clearing the arithmetic word and discrete bit word counts and looking for a non-zero analog word count. If the SIC contains an AO or AI, test service to the subcontroller associated with that SIC is executed. The test sequence consists of outputting the ATV to the subcontroller D/A (518 of FIG. 31B), establishing a connection on switch 696 that connects D/A 518 to A/D 516 input and initiating A/D conversion cycles for the next four word frames. At the end of the four frame delay which accounts for D/A settling time and A/D conversion cycle time, the response sent back to the IMC where it is evaluated by comparator 698 (FIGS. 31E and 45). Command code 694 at that time will initiate operations in the TMEWP. Only one response per SIC is evaluated in Mode 3 testing. The subcontroller D/A and A/D will be retested for each SIC associated with that subcontroller that contains an analog device. Counters internal to the TMC control the three frame delay, one response evaluate sequence.

Referring now to FIG. 46, operation of the test message error word processor (TMEWP) is as follows:

The inputs to the TMEWP are (1) the three outputs from the system of FIG. 45 consisting of command code 694, frame strobe 700 which acts as a synchronizing clock and the discrete test pass and analog test pass status lines 706 and 708;

(2) parameters identifying start of test service to a SIC, PTR STRB 5 on line 710;

(3) parameters identifying the start of test message service consisting of the following in their order of occurrence: SERVICE INITIATE on line 712; TEST MODE PROCESS ENABLE on line 714;

(4) parameters identifying the end of test message service consisting of the following in their order of occurrence: FIN on line 716; DMA UPDATE SERVICE REQUEST on line 718; TDW 1 STORE REQUEST STRB on line 720;

(5) parameters synchronizing the TMEWP operation to reception of the response word: LOID on line 722; ADDRESS MATCH INPUT WRD ADVANCE STRB on line 724; and VALID INPUT WORD on line 726.

The subsystem of FIG. 45 is synchronized to the OAS and ODS timing. Reception of the response word can differ from this timing, typically from 0.5 ns to 3 ns, depending on transmission line length between the master controller and SIC (subcontroller). Consequently, the frame strobe synchronize and strobe delay 728 of FIG. 46 delays execution of commands 706, 708 and 694 received from the subsystem of FIG. 45 by test command decoder 730. LOID on line 722 is the response word synchronizing signal from the IMC and signifies reception of the response word in the IMC. A short delay period occurs after receipt of the LOID signal to allow settling time for the test evaluation comparator output. Then, the frame evaluate strobe is generated which causes the TMEWP to evaluate the test response and initiate a possible storage sequence. Pointer strobe 5 on line 710, occurring at the start of test message service to each SIC, initializes the synchronizer for reception of the expected signal sequence frame strobe on line 700, followed by LOID on line 722. Test Mode Process Enable shuts down the TMEWP by suppressing generation of the frame evaluate strobe if test service is not active.

Frame strobe synchronizer 728, in conjunction with invalid response word detector 732, detects serial message communication errors during each word frame of test message service. If the failure is of the type where no input information was transferred back to the IMC from the subcontroller (absence of ICS and IFS), LOID will not be generated. The OMC generates a replacement signal for LOID (occurring several microseconds after the worst case delay of LOID)—ADDRESS MATCH INPUT WORD ADVANCE STROBE on line 724—to allow the TMEWP to continue sequential processing of the test message. However, the valid input word signal on line 726 from the IMC will identify the communication failure to invalid response word detector 732 which, in turn, sets a failure code in the FW1 and FW2 bits of 642. The failure will cause generation of a test failure word storage cycle by virtue of bad response data being presented to the test evaluation comparator inputs of the system of FIG. 45, as the test service to the device word on the SIC proceeds. The communicated failure will be identified in TFW4 by the FW1/FW2 bit state.

If the communication failure is of the type where an IFS and ICS were received but the response data on the IDS had parity or timing failure, the communication error would be detected in detector 732 by the status of valid input word on line 726 from the IMC. This failure will also result in generation of a test failure word storage cycle as the test service to the device word on the SIC proceeds.

Test command decoder 730 identifies the processing sequence of the TMEWP. Decode of word type bits A and B will determine: (1) which test passed status line to select-discrete test or analog test; (2) whether the word storage cycle upon a test failure will be a three word or four word storage sequence; (3) the completion of the test cycle for each device word on the SIC (e.g., if SIC word passed all test states, activate reset logic); (4) whether to perform an evaluation of the test passed status lines for the particular word frame. Decode of word type bits A, B and C will determine that the last device word on the particular SIC has been tested. This is required by the system test finished logic, circuit 734, which will be explained later.

The Word 1 Pass/Skip Logic, circuit 736, determines whether the storage cycle of test failure 1 (TFW1) will be skipped. Test command decoder 730 identifies whether (1) logic 730 should evaluate the test passed status line and if a test passed status set up conditions for skipping the TFW1 storage sequence, or (2) skip evaluation of the test passed status line and set up conditions for advancing the test failure word address counter, circuit 640 of FIG. 44C, one word address which represents the storage address for TFW2. The latter condition occurs for SIC device word test involving only one test state and, consequently, only one test response.

The Word 1 Fail Logic, circuit 738, initiates the storage cycle of test failure word 1 (TFW1) if a device word on the SIC fails the test discrete ones test. Test command decoder 730 activates the logic 738 when testing involves two response words/SIC device word. The Word 1 Fail Active signal from logic 738 is sent to the test failure word store control circuit 740 causing an immediate storage request cycle to be initiated to the test error section of PDM.

Note that when testing SIC device words that involve two test states (discrete bit words or arithmetic words), the first response word (test ones) will only be stored if a failure occurs. Circuit 642 identifies whether to read TFW1 or not by setting an appropriate code in the FW1 or FW2 bits. If logic 738 initiated a storage sequence, the Word 1 Fail Active line will set the FW1 bit indicating that TFW1 contains valid failure information.

The Word 2 Pass Logic, circuit 742, and Word 2 Fail Logic, 744, determine whether the storage cycle of TFW2 will be skipped or initiated. Test command decoder 730 enables both circuits. The test passed status determines which Word 2 sequence is initiated. If the word 1 pass/skip logic flag is set, i.e., circuit 736 set up conditions for skipping storage of TFW1, and test word 2 pass logic 742 is active, i.e., test word 2 response passed the test, no storage cycle will be initiated and the test error word processor reset logic 746 generates a reset strobe for the TMEWP system where the system then waits for new commands for test of the next SIC word.

Figure 44C:
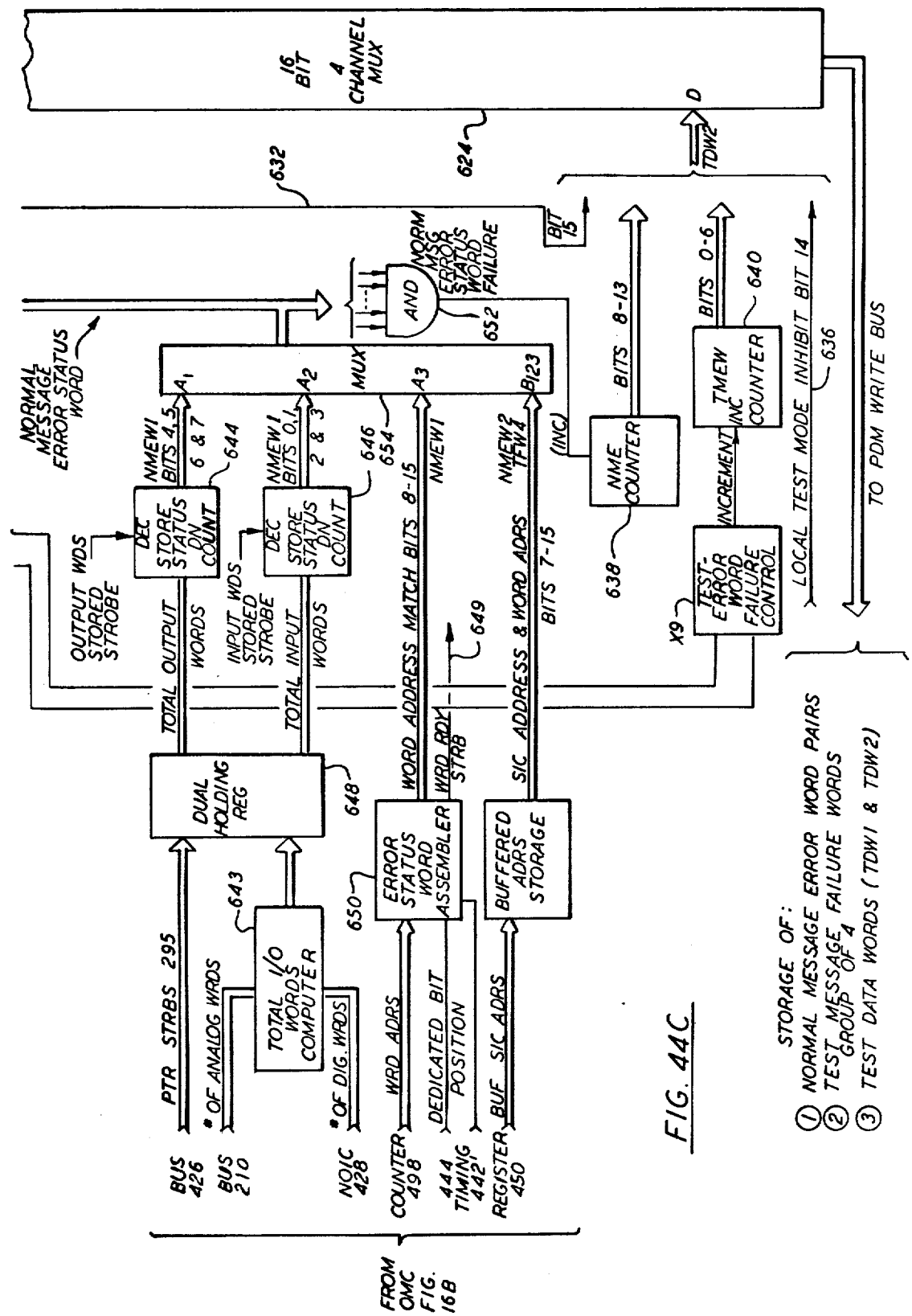

If the word 1 pass/skip logic is set, and test word 2 fail logic is active signifying a test failure, the test failure word store control logic 740 is activated and the following occurs: (1) The TMEW counter 640 of FIG. 44C is incremented one count advancing it to the storage address of TFW2; (2) a storage access is made to the test error section of PDM where the response word available at the output of register 670 is transferred via channel A of mux 260 (FIG. 31E) and channel B of mux 624; (3) counter 640 is incremented one count advancing it to the storage address of TFW3; (4) a storage access is made to the test error section of PDM where the test command value available at the output of 664 (FIG. 31E) is transferred via channel B of mux 260, and channel B of mux 624; (5) counter 640 is incremented one count advancing it to the storage address of TFW4; (6) a storage access is made to the test error section of PDM where the SIC address and SIC word address available at mux/latch 748 of FIG. 31A and TFW4 4LSB (WT1, WT2, FW1, FW2) available at 682 (FIG. 45) and 642 (FIG. 46) presented to the channel B input of mux 750 (FIG. 31E and FIG. 44B) are all transferred to PDM through channel A of mux 624; (7) the Word 4 store cycle complete strobe is generated activating test error word processor reset logic 748 which resets the TMEWP system where the system then waits for new commands for test of the next SIC word.

If the Word 1 Fail Logic 738 is set, and Test Word 2 Pass Logic 742 is active signifying a failure only of the first response word, the first response word was previously stored as discussed earlier. However, the Test Word 2 Pass Logic 742 will cause activation of the same store sequence that occurred if Word 2 had failed, i.e., storage of TFW2, TFW3 and TFW4 will be executed. However, the difference will be indicated in the state of the FW1, FW2 bits indicating no failure occurred with TFW2 (via word 2 fail active line).

The PDM storage address of TFW1 through TFW4 is determined by adding the contents of TMEW counter 640 of FIG. 44C to a fixed constant of 7700 (start of test failure word section of PDM). The TMEW counter indicates the number of test failure words for the current update frame by virtue that it is cleared at the beginning of the update frame and is incremented only when test failures occur.

The system test finished logic 734 of FIG. 46 provides control for terminating test service, and continuing test service to the next SIC. Test service can be terminated for several reasons:

(1) The last SIC has been tested before the end of the current update frame. This is identified by the FIN signal on line 716.

(2) Test service must be terminated to allow start of the next update frame. This is identified by DMA UPDATE SERVICE REQUEST on line 718. Before test service can be terminated, several functions must be performed:

a. Test service can only be interrupted at the end of a SIC device word test. If the device word tested is not the last word on the SIC, test service to that SIC must be re-executed at the beginning of test message service in the next update frame. The TMPA count decrement strobe informs the PDC to save that SIC address for re-running test service in the next update frame.

b. TDW1 and TDW2 must be stored in the appropriate section of PDM. These words inform the computer of the number of test failures and other pertinent data as previously explained. The storage sequence is initiated exactly 112 ns after occurrence of the DMA UPDATE SERVICE REQUEST signal on line 718. Part of the information stored for the computer is whether test service to the last SIC in the simulator was complete. This is conveyed via a bit in TDW1 which is set by the LAST CARD TEST COMPLETE signal of logic 734.

Logic 734 also must command dump of pointer data for starting test service to the next SIC. This is accomplished by decoding word type bits A, B and C and generating a dump command to the PDC.

As discussed heretofore, assembly of output data words for normal message service involves assembly of one output data word/SIC output word. The serial transfer from the OMC to the SIC is accomplished in one word frame. During test service the OMA assembles test data words which are sent to the SIC, if the device under test is an output type device, and sent to the IMC for comparison with the response word from the SIC after reception. The test data word assembled represents the expected response from the system if the I/O device is operating properly. The test data word is referred to as the Test Command Value (TCV). The TCV is transferred from the OMA to the IMC in bit serial format (see FIGS. 31A, C, E, Serial TCV Data).

The number of test data words generated/SIC device word depends on the I/O device type. If an analog device is being tested, the OMA assembles one test data word/SIC device word. If a discrete bit or arithmetic device is being tested, the OMA assemblies two test data words/SIC device word. These two words are the test discrete ones word (a 16-bit word containing all logic ones), and the test discrete zeros word which for arithmetic devices is a 16-bit word containing all logic zeros. The discrete bit test zeros word for fully-packed discrete bit words is a 16-bit word containing all logic zeros. The 16 bit test zeros word for a partially-packed discrete bit word contains logic zeros in the existent bit positions (starting from MSB end of SIC word) and logic ones in the non-existent bit positions (toward LSB end of SIC word).

The data source for test data word assembly depends on the test mode type. If Mode 1 (Monitor Output Devices), the source is IODM output data and the OMA operation is identical to normal message service (Mode N). The only difference between Mode N and Mode 1 is the output data word, although sent to the SIC, will not be stored in the output data holding register during Mode 1 testing. If Modes 2, 5 and 6, the data source is the ATV for analog device test and test ones/test zeros words for arithmetic and discrete bit devices. The ATV is transferred from the TMC to the OMA.

During Mode 5 testing, the test data word will be stored in the SIC output data word holding register associated with the device under test. Furthermore, the same value will be transferred and stored in that holding register for five consecutive word frames. The five frame repeat provides sufficient time for the output device to settle down before its output (response) is evaluated.

During Modes 2 and 6 testing, the test data word is transferred to the IMC via the TCV serial data stream. However, the ATV will be continuously sent out on the ODS during test of the input devices on this SIC. The subcontroller D/A will respond to this information. SIC's containing digital inputs will receive test command signals (all ones/all zeros) via subcontroller generated signals, $V_R/V_R'$.

Modes 3, 4 and 7 result in the ATV being continuously sent out on the ODS during active address frames.

There are two key factors to recognize in the control signal/test data word relationship between the OMA and the TMC during test service time.

1. The first test data word is assembled in the interval between the end of the pointer data dump cycle and the next output frame strobe. The assembled word will be sent out on the ODS (or to the IMC) upon occurrence of the output frame strobe.

2. If the device being tested involves generation of only one test data word, the OMA word counters will be decremented upon completion of word assembly. The result is TMC receives OMA word count data for assembly of the next test data word as the previous test data word is transferred to the ODS.

In brief, test data information on the ODS lags OMA word count status by one word frame.

It will be recalled that execution of serial messages during normal message service involves decrementing the OMC discrete word counters 430 and 434 and the analog word counters 432 and 436 at the beginning of the message word frame. A non-zero discrete output counter 430 prevents decrement of the analog output counter 432 and, similarly, a non-zero discrete input counter 434 prevents decrement of the analog input counter 436. The output word counters and input word counters are decremented simultaneously except that the first decrement of counter 436 is inhibited for one word frame (to account for A/D conversion frame of first AI). Active message frames exist when any of the four word counters are non-zero.

In general, during normal message service, each word frame results in the decrement of one of the output word counters and one of the input word counters.

During test service time, the decrement signal is inhibited for one or more word frames depending on device type and test mode. This results in an expansion of the number of active message frames. In Modes 3, 4 and 7, the word counters are not even accessed where control of the number of active word frames is accomplished by an inhibit signal from the TMC.

In some test modes involving analog output devices, the analog output counter 432 and the analog input counter 436 are cleared (AO Monitor Skip Signal) when testing of that device must be rejected due to incompatibility with the test mode (Mode 1) or the sign of the ATV and the assigned sign of the AO. Furthermore, depending on test mode, either the output word counters only or input word counters only are accessed.

The TMC modifies OMC control during test service time via control signals to OMC logic circuit 442.

Subcontroller

Referred again to FIG. 3, it will be recalled that subcontroller 84 performs control and pass along functions between master controller 74 and system interface circuitry (SIC) of the various systems. Referring now to FIG. 18, the subcontroller receives the output address stream (OAS), the output data stream (ODS), the output shift clock stream (OCS) and the output frame strobe (OFS) at differential receiver 482. The OAS, ODS and OCS are received by logic circuits 484 of the subcontroller for various control and strobe generation functions and are simultaneously passed along to the appropriate SIC 86 via differential transmitter 486. The OFS is used by the subcontroller as a synchronization command.

Read and store commands and enable signals are also generated by the subcontroller for use by the SIC's.

As shown in FIG. 19, the subcontroller 84 transmits an input data stream (IDS), input shift clock stream (ICS) and an input frame strobe (IFS) to master controller 74 after appropriate signal conditioning.

Analog to digital input conversion (ADC) is provided by subcontroller 84, as is digital to analog conversion (DAC). The DAC is used to generate analog test command values during test of the ADC and the analog input multiplexers on the SIC. The subcontroller also generates the necessary bias voltages for the discrete and arithmetic word inputs on SIC's. During test, these bias voltages are manipulated to force the inputs to a '1' state and a '0' state.

Figure 20A:
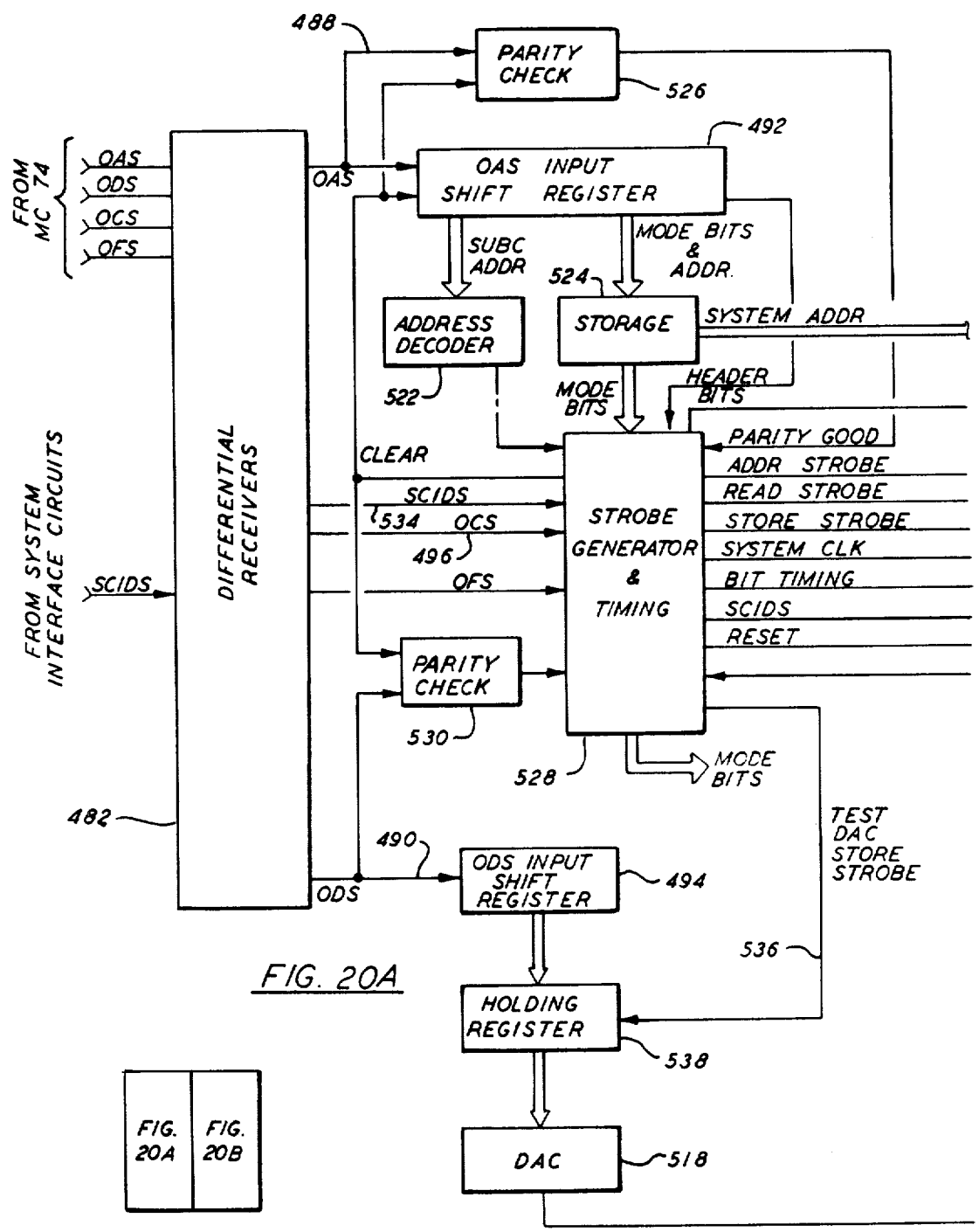
FIGS. 20A and 20B are electrical block diagrams of a portion of the circuitry which operates as an interface between the master controller and the peripheral units.
Figure 20:
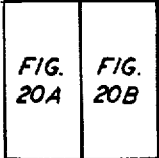
Figure 20B:
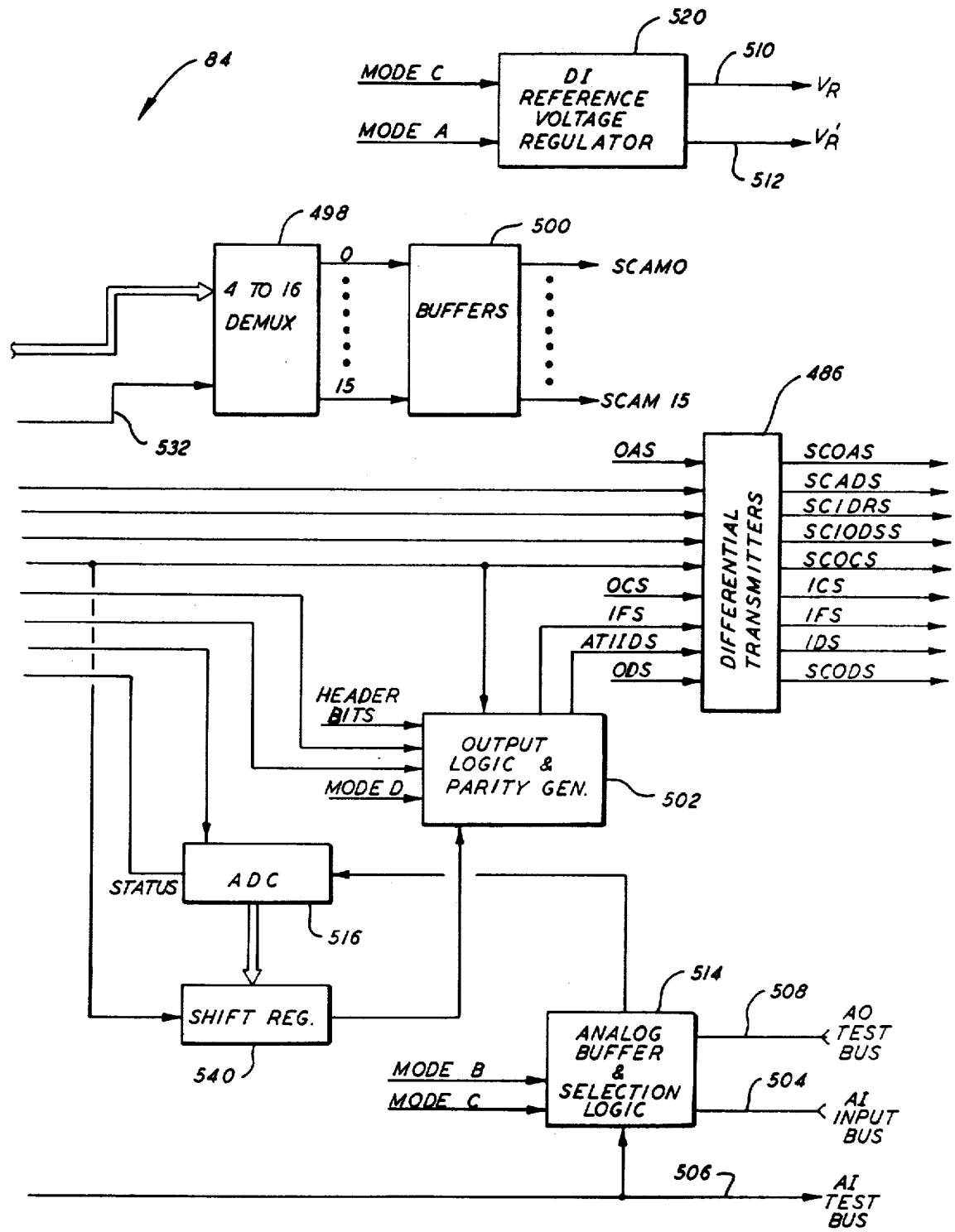
Figure 21:
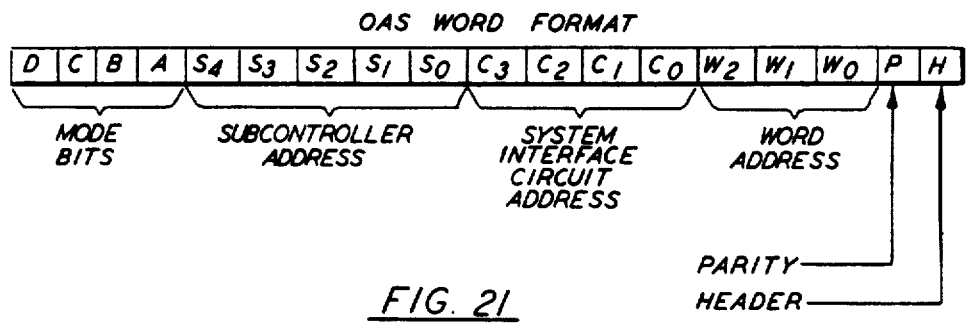
FIGS. 21, 22 and 23 illustrate the digital word format for various information streams.
Figure 22:
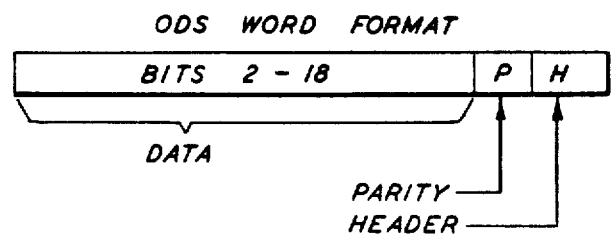

Referring now to FIG. 20, the operation of the subcontroller is as follows: The OAS on line 488 and ODS on line 490 are clocked into their respective shift registers 492 and 494 via differential receivers 482, with the leading edge of the OCS received on line 496 which occurs 500 nanoseconds before master controller 74 puts the next bit on the line. However, the ODS is used by the subcontroller only during test modes. The OAS word format, as shown in FIG. 21, starting from the MSB is a header bit (always asserted), a parity bit, three (3) word address bits, nine (9) SIC address bits (includes subcontroller address) and four (4) mode flags. The ODS word format, as shown in FIG. 22, starting from the MSB is a header bit (always asserted), a parity bit and sixteen (16) data bits.

The OAS header bit initiates the storage of the mode bits and parity check results and interrogates the SIC. System response, subcontroller address match, and the mode bits determine the generation of the READ and STORE strobes. These strobes are used by the system to read input data for transfer to the master controller and to store output data, respectively. The mode bits not only control the generation of the READ and STORE strobes, but also indicates various test modes and initiate analog to digital conversion.

Figure 23:
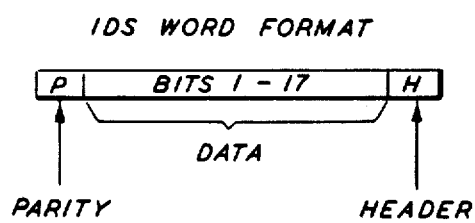

The IDS's format shown in FIG. 23 is a header bit (asserted if a STORE strobe is generated, negated otherwise), sixteen (16) data bits and a parity bit. The data can be discrete inputs, arithmetic word inputs or converted analog inputs. The ICS is essentially the OCS transmitted back to the master controller. This is done to compensate for transmission line delay. The IFS is used by IMC 234 in master controller 74 as a synchronization command.

Overall system timing is maintained by the OCS and the OFS. The OFS occurs at the end of a dead address frame. A dead address frame is a frame time when a non-valid address field is sent from the master controller to all subcontrollers. It should also be noted that the IDS from the previous word frame is transferred back to the memory controller during the dead address transfer time. This frame is generated when service is transferred from one SIC to the next. At this time, all the subcontroller's input streams' differential line drivers 486 are disabled.

Subcontroller 84 is connected to the SIC via backplane wiring. Differential line drivers 486 pass along the OAS, ODA and OCS to appropriate SIC's. The OAS, ODS and OCS are re-identified as a result of transmission to the SIC as System Interface Output Address Stream (SCOAS), System Interface Output Data Stream (SCODS) and System Interface Output Clock Stream (SCODS), respectively.

A demultiplexer 498 is used to decode the address of the selected interface circuit (4 LSB of 9 bit SIC address field). The outputs of the demultiplexer are buffered by buffers 500 for output to the SIC's. Assertion of an output line enables the appropriate SIC. Input data enters the subcontroller via differential receivers 482 as System Interface Circuit Input Data Stream (SCIDS) and becomes IDS when the header and parity bits are attached to the data stream by generator 502.

The READ and STORE strobes, SCIDRS and SCODSS, are also sent to the SIC's via the backplane.

Analog signals are carried on the backplane via bus lines. These bus lines are the AI input bus 504, the AI test bus 506, the AO test bus 508, and two DI reference voltage busses, 510 and 512. AI input bus 504 is selected for monitoring during the normal mode of system operation via analog buffer and selection logic 514. The AI and AO test busses are selected for monitoring when the analog input multiplexers and the DAC's on the SIC's are to be tested, respectively. ADC 516 on the subcontroller is used for system AI's and during analog test modes. DAC 518 on the subcontroller is used only during AI test modes to generated computer commanded analog values. The DI reference voltages are developed by a voltage regulator 520. These outputs are labeled VR' and VR. During DI test modes, VR' is manipulated above and below VR, forcing the DI to a '1' and a '0', respectively, independent of the state of the external discrete input.

More specifically, address decoder 522 decodes the subcontroller address by comparing the five (5) bit code in the OAS to a preset code on the subcontroller. The presetting is accomplished with a five-stage SPST switch assembly.

The SIC address is decoded by demultiplexer 498 and provides, via buffers 500, an enable signal SCAM 0-SCAN 15 to a corresponding SIC 0-15.

Figure 24:
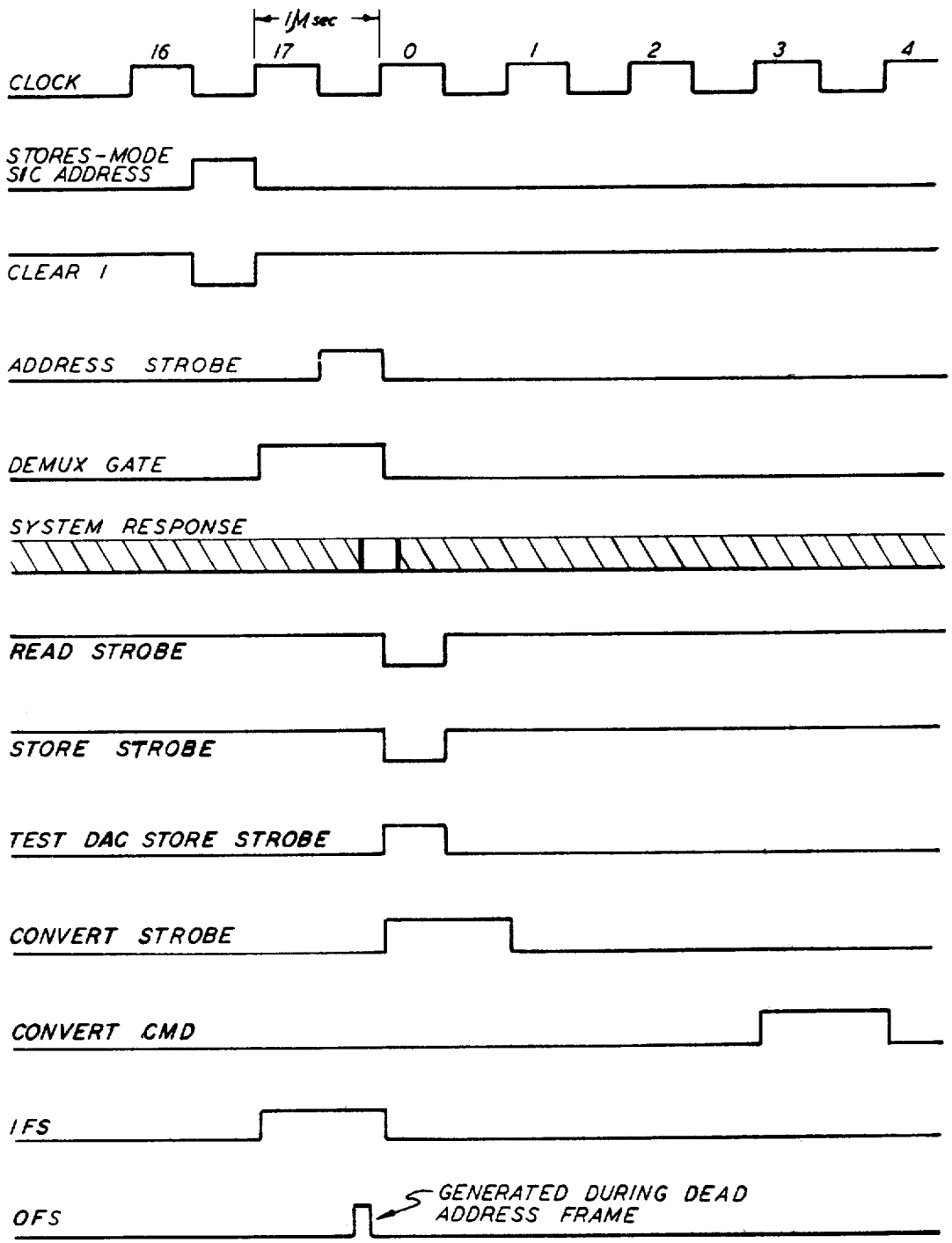
FIG. 24 is a timing diagram showing the operation of the circuitry of FIGS. 20A and 20B.

As was mentioned earlier, storage of the mode bits and SIC address by storage register 524 and parity check by parity checker 526 is initiated by the OAS header bit. Referring to FIG. 20 and FIG. 24, the specific operation of this subcontroller is as follows: when the OAS header bit is clocked into strobe generator and timer 528, a subcontroller address decoded signal from decoder 522, the mode bits and the SIC address from storage register 524, the output from OAS parity checker circuit 526 and the output of the ODS parity checker circuit 530 are then received by strobe generator and timer 528. Simultaneously, a CLEAR signal is generated and used to clear the last sixteen bits of the OAS shift register 492 and the address and data stream parity checkers 526 and 530. A four line to sixteen line demultiplexer 498 is used to decode the SIC address. Demultiplexer 498 is gated by a signal on line 532, and the outputs are buffered by buffers 500 for output to the system. Assertion of an output line enables the appropriate system.

This enable strobe SCAM is used in conjunction with address strobe 550 to set a latch on the appropriate SIC for the duration of the word frame. Address strobe 550 occurs every word frame. Absence of an enable strobe (SCAM 0 through SCAM 15) during address strobe 550 occurrence will cause reset of the latch on each SIC (Message On Flag) and shutdown (inactivation) of that SIC. Consequently, only one SIC of many will be activated for each word frame.

Turn on of a SIC by signals 550 and SCAM 0 through SCAM 15 will cause an acknowledge signal to be sent back to the subcontroller via the SCIDS. The SIC input data stream (SCIDS) on line 534 via differential receivers 482 is monitored by the subcontroller during assertion at the first clock pulse of the next frame. If the SIC was turned on (SIC Message On Latch Set). address strobe 550 is connected to the SIC to the SCIDS bus serving as an acknowledge signal back to the subcontroller. This causes a latch (Subcontroller On) in 528 to set and thus activating the subcontroller for the duration of the word frame.

The READ STROBE and STORE STROBE are used by the various SIC's to read input data into the appropriate input data shift registers for transmission to the master controller and to store output data from the master controller in the appropriate conversion device, respectively. The TEST DAC STORE STROBE on line 536 causes the contents of the output data shift register on the subcontroller to be stored in the DAC holding register 538.

The IDS, ICS and IFS input information is sent back to the master controller every word frame from the addressed subcontroller.

The first and second clock pulse of each 18-bit word frame to the system is inhibited (i.e., the system receives sixteen clock pulses). During this time, the output logic and parity generator 502 generates an IDS header bit. If a STORE STROBE is generated, the IDS header bit is a "logic 1"; otherwise, it is a "logic 0".

Bit and timing control is the function of a binary up-counter contained in strobe generator and timer 528. The count sequence is zero through 17. At count 0 time, the header bit is clocked onto the IDS. Count 1 through count 16 enables data bits to be clocked onto the IDS from shift register 540 and clears parity generator 502 for the next word frame.

The input data bits are discrete inputs, arithmetic word inputs or converted analog inputs. The discrete inputs and arithmetic word inputs are from the various SIC's. The analog input conversion is done on the subcontroller by ADC 516. The type of data going to master controller 74 determines whether the SCIDS or the digital output from ADC 516 (via shift register 540) is to be gated onto the IDS. If Mode D flag is high, the ADC conversion is selected for output. At the end of conversion (EOC), the EOC signal will remain present until the converter is reset. The parallel data is valid for the entire time the EOC signal is present. A clock signal loads the parallel data into the sixteen bit shift register 540.

The parity of the IDS is odd, i.e., the number of logic "1"3 s in the IDS is always an odd number. Therefore, the parity bit is generated by output logic and parity generator 502 and added to the SCIDS such that this is always the case.

The OAS header bit is used to generate the IFS. An IFS is output at the end of each word frame during active address and at the end of the first active address frame following a dead address frame. A dead address frame is a frame time when a non-valid address field is sent from the master controller to all subcontrollers. At this time, all the subcontrollers input streams tri-state drivers are disabled. This frame is generated when service is transferred from one SIC to the next.

During the last 250 nanoseconds of a dead address frame, the OFS is generated with a pulse width of 125 nanoseconds by the master controller. The OFS is used by the subcontroller as a synchronizing pulse to reset the timing circuitry (528) in the subcontroller.

As was mentioned hereto fore, there are five analog busses connected to the subcontroller. These bus lines are the AI input bus 504, the AI test bus 506, the AO test bus 508 and the two DI reference voltage busses 510 and 512. AI input bus 504 is monitored during the normal mode of system operation. AI and AO test busses 506 and 508 are monitored when the analog input multiplexers and the DAC's of the various SIC's are to be tested, respectively. ADC 516 on the subcontroller is used for SIC AI's and during analog test modes. DAC 518 on the subcontroller is used only during test modes to generate computer commanded analog values.

The analog bus is controlled by the mode selected. DAC 518 is permanently connected to AI test bus 506. When an AI test is commanded, a test value is stored in DAC holding registers 538. The SIC picks up the test value from the AI test bus, routes it through the test channel of the AI multiplexer and sends the value back to the subcontroller via AI input bus 504.

AO test bus 508, AI input bus 504 and the output of the tes DAC 518 are input to a dual SPDT junction switch. Mode Flags B and C control which analog bus is gated through the switch.

System Interface Circuitry

Figure 25:
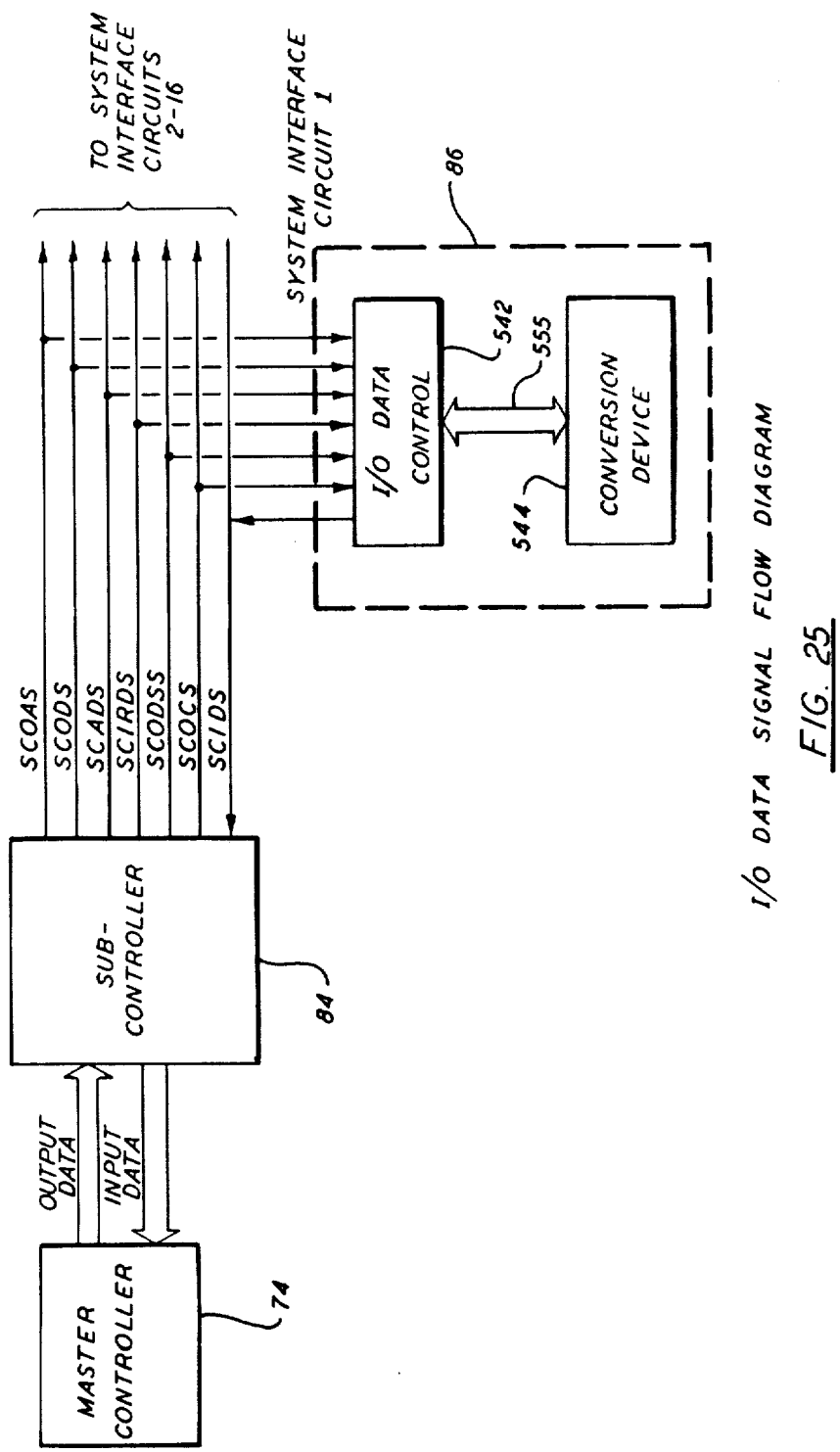
FIG. 25 is an electrical block diagram showing the interconnections between the circuitry of FIGS. 20A and 20B and the various circuits connected to the peripheral units.

Referring now to FIG. 25, the purpose of the system interface circuitry (SIC) 86 is to provide the analog and digital interconnection functions required by the system being serviced. Except for analog input conversion, all other storage and conversion functions are performed on the system interface circuitry itself. Analog inputs are multiplexed on a common bus and converted to digital form on the subcontroller.

Four dedicated types of SIC's are available which provide discrete logic level outputs (DO's), discrete lamp driver outputs (LO's), discrete inputs (DI's) and analog input/analog outputs (AI/AO's).

Every system interface circuit 86 requires a subcontroller 84 to communicate with the master controller and up to 16 SIC's may be serviced by a single subcontroller. The subcontroller generates the necessary timing and control signals to connect the system circuitry being serviced to the master controller. All data transfers between subcontroller and system interface circuitry is in serial form.

The basic dedicated out put SIC consists of an I/O control section 542 which is the same for all of the different types of SIC's and storage and conversion circuitry 544 for output data. A dedicated input SIC will have the same I/O control section as an output SIC but different conversion circuitry for input data. SIC's which are not dedicated to a single interface signal type will contain the same basic I/O section along with both input and output storage and conversion circuitry.

Figure 26:
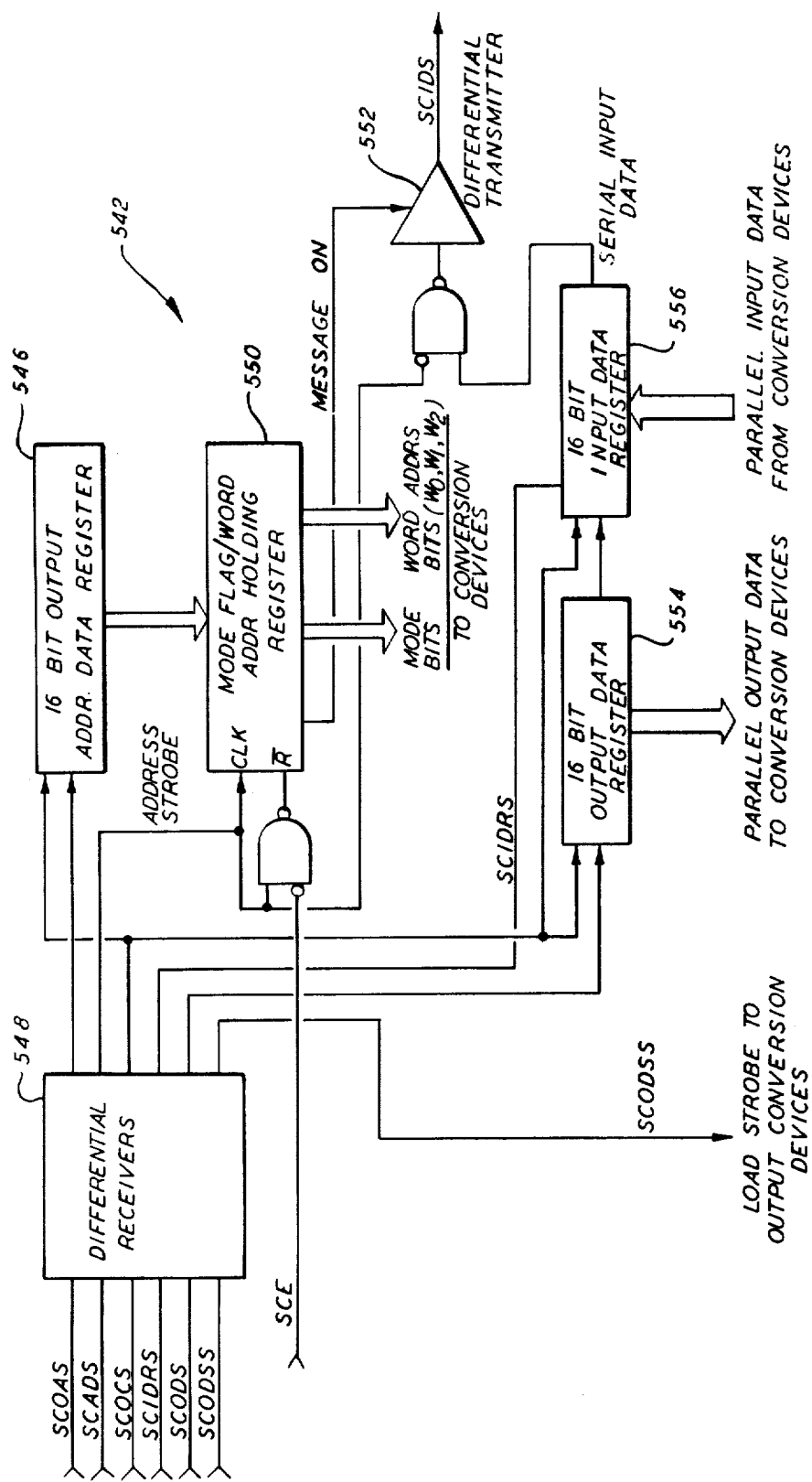
FIG. 26 is an electrical block diagram of a circuit included in each of the circuits which connect to the peripheral units.

The four dedicated systems interface circuits as well as configurations made up of various combinations of interface signals all contain an identical I/O control section 542 to communicate with the master controller via the subcontroller 84 and the I/O data bus shown in FIG. 26 with reference number 555. All data transfer to and from the subcontroller occurs in serial form whereas all data between the I/O control section 542 and the SIC interface circuit signal conversion and storage circuits 544 is in parallel form.

In operation, a 16-bit serial address word OAS containing mode flags (4 bits), subcontroller address (5 bits), SIC address (4 bits) and word address (3 bits), is transmitted from master controller 74 to subcontroller 84 where the 5 bits of subcontroller address are decoded. This serial address stream SCOAS is also received by the address data register 546 of the SIC connected to the subcontroller such that it may be transferred out in parallel form. If the 5-bit subcontroller address is decoded and matches a specific subcontroller, an address strobe SCADS is generated by the subcontroller and transmitted to the SIC via differential receivers 548. The 4-bit SIC address is also decoded on the subcontroller and a signal is output from the subcontroller on one of 16 separate lines (SCAM 0 through SCAM 15), one for each SIC. This signal, in conjunction with the address strobe, determines which SIC is being serviced.

The address strobe SCADS sets a "MESSAGE ON" flag on the SIC selected and loads the mode bits and word address in storage register 550. It will be recalled that this information was made available in parallel form by address data register 546 prior to loading. The input data differential transmitter 552 is enabled by the MESSAGE ON flag and a logic zero is transmitted back to the subcontroller for the duration of the address strobe, telling the subcontroller that the SIC was turned on.

The logic zero transmission back to the subcontroller allows turn-on of the subcontroller, thus enabling the subcontroller and the SIC to transfer data for the duration of the word frame. Turn-on evaluation is performed at the beginning of every word frame by all subcontrollers and SIC's in the system. Only one subcontroller and one SIC will be activated for any word frame.

Output data SCODS is transmitted to the subcontroller/SIC in the same time frame as the address stream. The serial output data SCODS is converted to parallel space form with a 16-bit output data register 554 in the same manner as the address stream. Immediately after the MESSAGE ON flag is set, data is loaded into a holding register with an output data strobe SCODSS which is generated by the subcontroller. The word address bits W0, W1 and W2 from address holding register 550 are decoded to determine which holding register receives the data (i.e., the information may be DBO, AWO or AO).

Input data is loaded into data register 556 which provides parallel to serial conversion with an input data read strobe SCIDRS which occurs simultaneously with the output data store strobe whenever input data is available. The word address bits W0, W1 and W2 from holding register 550 select which input word is loaded into the input register. Immediately after loading, the input data is transmitted to the computer via the subcontroller. This input data may be from an external source through DI's or output data which has been selected to be monitored for testing.

The operation of the I/O control is basically the same for all SIC's. The storage, conversion and testing of the different types of SIC's will be covered separately.

Figure 27:
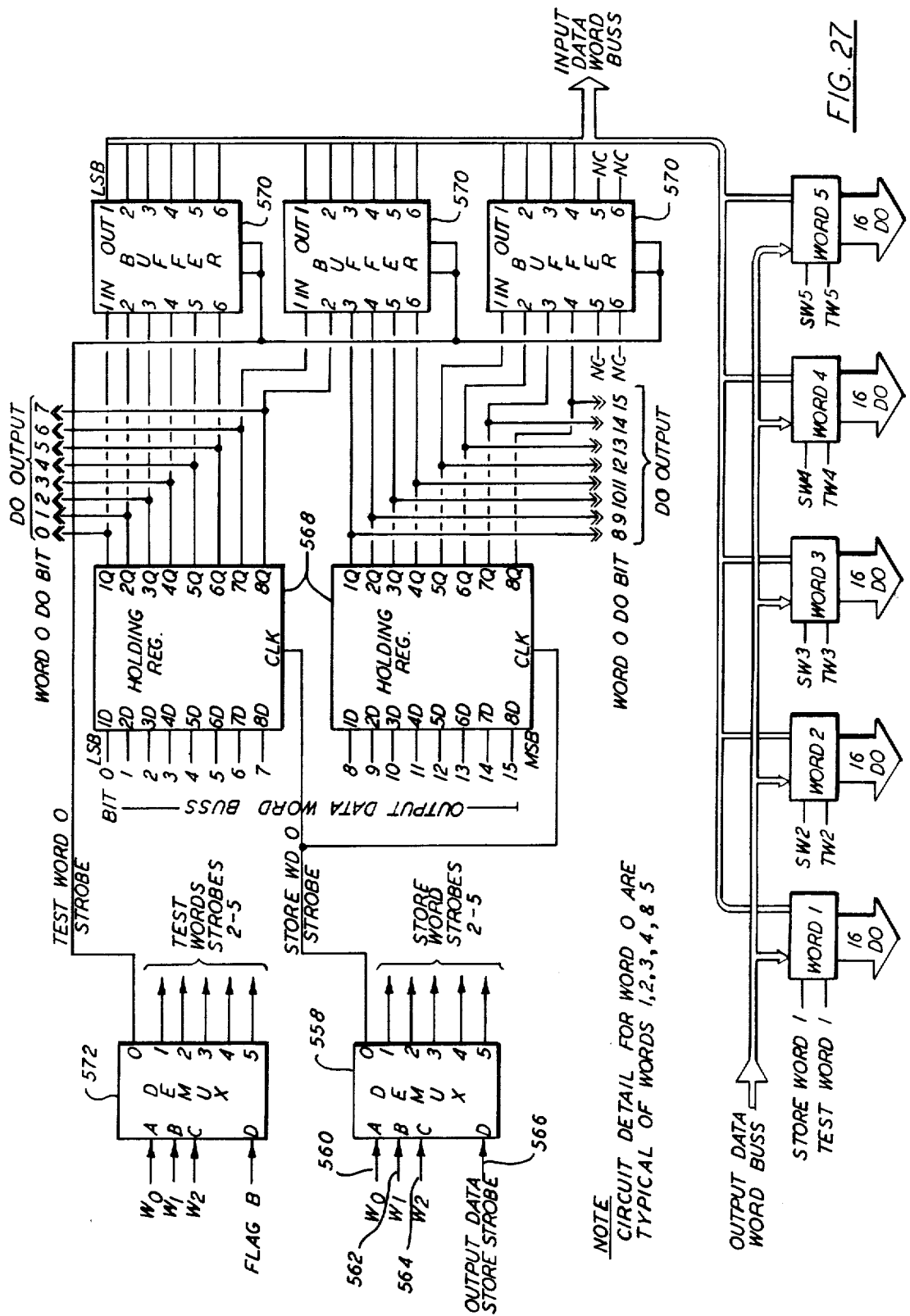
FIGS. 27 through 30 are electrical block diagrams of the circuits which connect directly to the peripheral units.

As shown in FIG. 27, the discrete logic level output circuitry (DO) receives data from the I/O data control circuit 542 and stores it in registers where it remains available to the external users during update cycles. The word address bits W0, W1 and W2 are decoded to determine which register is to receive the data and it is transferred to the selected register with the output data strobe (SCODSS) from the subcontroller.

The outputs of the holding registers are connected to the input data bus on a SIC via multiplexers so that the DO's may be monitored for testing. A decoder similar to the one used for storage strobes decodes the word address bits to determine which register is to be examined and connects it to the input data bus. The data is loaded into the parallel to serial input register by the input data strobe from the subcontroller and transmitted back to the computer by the subcontroller.

More specifically, a dedicated DO circuit can store up to six words of 16-bit data for a maximum number of 96 DO's on a SIC. Store word 0 through store word 5 strobes are generated by digital multiplexer 558. SCODSS on line 566 is the data input and W0 through W2 on lines 560, 562 and 564 is the address input to the demultiplexer. The store strobes are used to clock the data from the output data bus of the I/O data control circuit 542 into holding registers 568. The output of the holding registers is the DO output.

Mode flag B enables the testing of DO devices. The DO outputs are connected to buffers 570. The outputs of buffers 570 are bussed together and connected to the input data bus shift register 556 of I/O data control circuit 542. Demultiplexer 572 operates the same as demultiplexer 558 and decodes the word address to determine which group of DO's is to be examined and connects it to the input data bus by enabling the proper buffers 570. The data is then transmitted back to the master controller by subcontroller 84.

Figure 28:
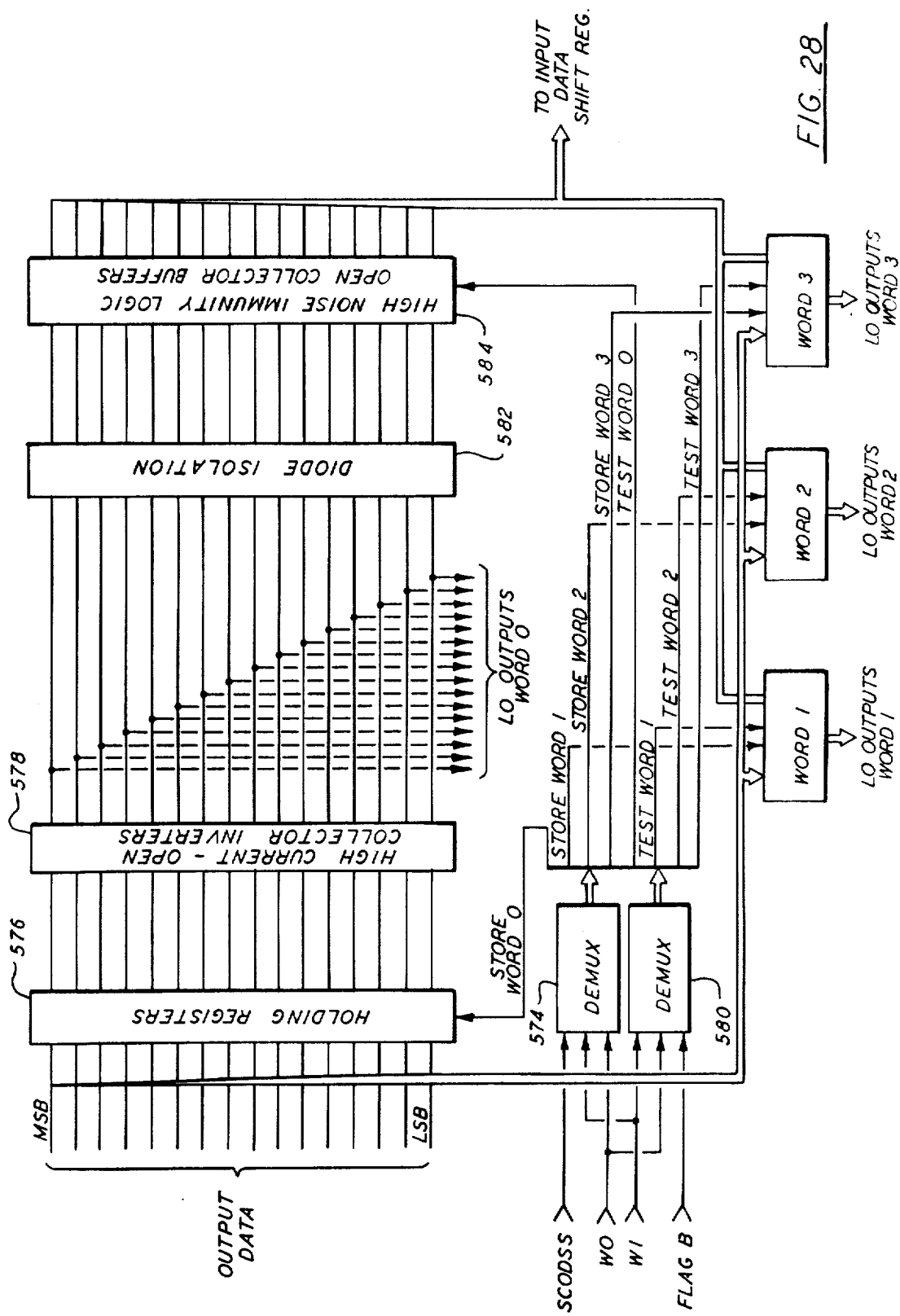

Referring now to FIG. 28, the discrete lamp driver output (LO), as the name implies, is used for driving lamps, relays or other loads which require higher drive levels can be obtained with a DO output. The data storage section is identical to that on the DO SIC; however, the register outputs are connected to drivers rather than the external user. The driver outputs are then fed to the external users.

For test purposes, the outputs of the driver stages are monitored to verify that the holding register and the driver are operating properly. They are multiplexed to the input data bus by logic which concerts the lamp drive output to TTL signal levels. The converted signals are loaded into the parallel to serial input register by the input data read strobe from the subcontroller and transmitted to the master controller the same as the DO test data.

More specifically, a dedicated LO circuit can store up to four words of 16-bit data for a maximum number of 64 LO's on a SIC. Store word 0 through store word 3 strobes are generated by demultiplexer 574. W0 and W1 are the address inputs and SCODSS is the data input to the demultiplexer. The strobe commands are used to clock the data from the output data bus of the I/O data control circuit 5·2 into holding registers 576. The outputs of holding registers 576 are connected to high current, high voltage, open collector inverter/buffers 578. These are the LO outputs.

Mode flag B enables the testing of the LO devices by generating test word strobes via demultiplexer 580. The LO load connected to the LO outputs is isolated from the test circuitry by diodes 582. The outputs from diodes 582 are input to high noise immunity inverter/buffers 584. The voltage output level of these buffers is reduced and connected to the input data word bus. Demultiplexer 580 is used to select the proper LO word for test via common strobe lines (one per word). The data is loaded into data register 556 of the I/O data control circuit 542 and is then transmitted back to the master controller by the subcontroller.

Figure 29:
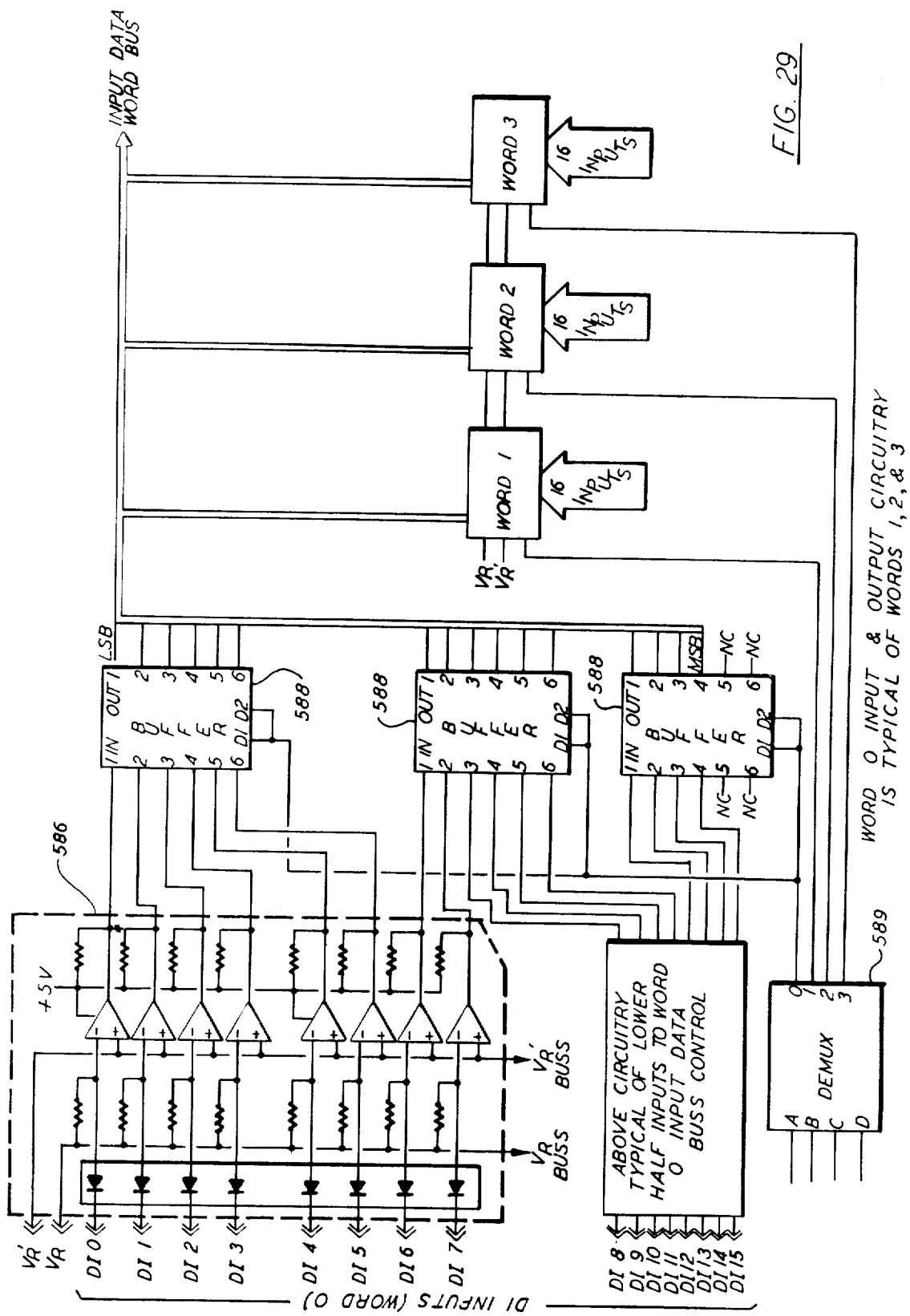

Referring now to FIG. 29, the discrete input (DI) circuitry is used to input logic levels or switch closures from external systems.

The circuit operates by translating the input V's to a level which varies between 20.6 v and $V_R$, hereinafter identified as $V_{RS}$, and then comparing with a fixed reference voltage $V'_R$. If the input $V_{RS}$ is less than $V'_R$, a logic "1" is input to the master controller. An open input or voltage will cause a logic "0" to be input to the master controller. The outputs of the input signal converters are multiplexed to the input data bus. They are selected by the word address bits and loaded into parallel to serial input register with the input data read strobe from the subcontroller.

In the test mode, a reference voltage $V'_R$ is switched so that is is forced above and below $V_R$ regardless of the input voltage produced by the DI input signal. This causes the converter to generate a logic "1" or logic "0", respectively. The commanded logic levels are then input to the master controller in the same manner as the normal input data.

More specifically, a dedicated DI SIC can input four words of 16-bit data for a total of 64 DI inputs. The input device is voltage comparator 586 which compares the dc signal on the DI line to the reference voltage $V'_R$.

The DI's are multiplexed onto the input data bus of the I/O data control circuit 542 with tri-state buffers 588. The four word enable strobes are generated by demultiplexer 589. Mode flag B enables the MUX while word address W0 through W2 select the enable strobes. The SCIDRS signal loads selected input words into the input data shift registers.

During DI test, the DI's are forced to logic "1" and logic "0" by manipulation of $V'_R$. $V'_R$ has three values: lower, middle and upper. The middle value is used during normal DI reading and is midway between the level translated DI signal ($V_{RS}$). During test, $V'_R$ is changed to a higher value (higher than $V_{RS}$) to force a logic "0" out of comparator 586 and then to the lower value (lower than $V_{RS}$) to force a logic "1" out of comparator 586 (comparator 586 inverts the input signal). The test results are multiplexed onto the input data bus by the same circuitry used for normal service.

Figure 30:
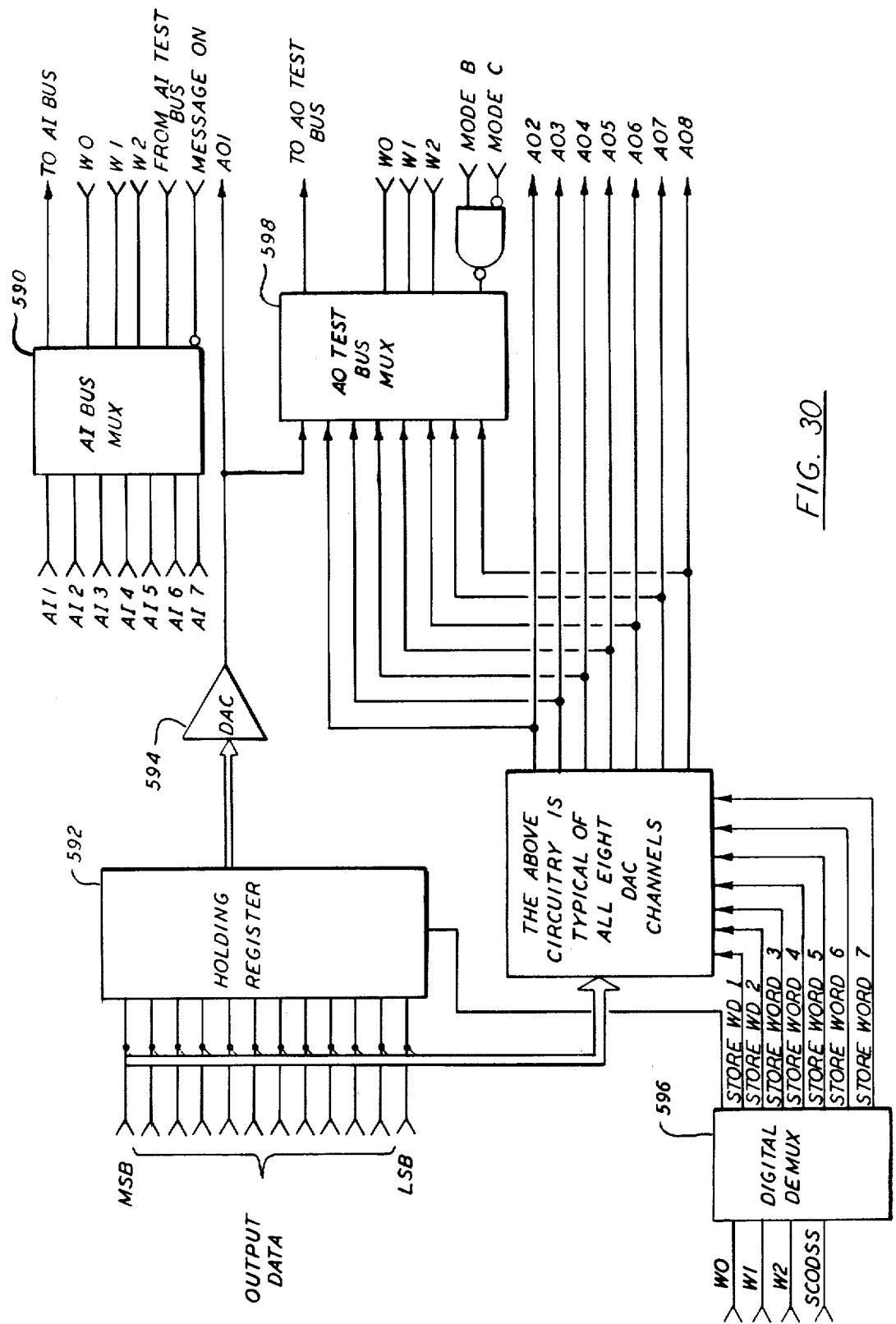

Referring now to FIG. 30, the analog input/analog output (AI/AO) circuitry provides multiplexing for analog input signals (AI's) and digital storage and conversion for analog output signals (AO's). Analog inputs are multiplexed through an analog selector switch which connects the input signal selected to an A/D converter on the subcontroller. The word address bits W0, W1 and W2 select the input signal on the SIC being serviced.

Analog inputs cannot be tested because there is no way of knowing what the commanded value is. Therefore, only the multiplexer, A/D converter at the subcontroller and interconnecting signal paths are tested for proper operation. In AI test mode, a test D/A converter on the subcontroller is commanded to some known value. This test D/A output is fed to all the AI multiplexers as a test AI. The AI test channel of the analog MUX is then selected, converted by the same A/D used for AI's and input to the master controller. If the returned value compares with the output value within the programmable analog test tolerance value, then the AI conversion circuitry is considered functioning properly.

Analog outputs (AO's) are converted on the SIC by a dedicated D/A converter for each AO channel. Digital information is received and stored in the same manner as DO's and LO's receive data; however, only the 12 most significant bits of the 16-bit word are stored and fed to the D/A converter.

AO's are tested by multiplexing the D/A outputs on a test bus. The test bus is connected to the same A/D converter on the subcontroller that converts AI inputs to digital form. The converted AO signals are then transmitted back to the master controller for comparison with the output data that was sent to the A/D as digital data.

More specifically, the AI/AO circuitry provides multiplexing for analog input signals and digital storage and conversion for analog output signals. Analog inputs are connected to the AI bus through multiplexer 590. The AI bus, it will be recalled, connects to the analog to digital converter (ADC) on the subcontroller. The AI's are selected by the word address, W0 through W2, and the multiplexer is enabled with the MESSAGE ON signal.

Twelve bit holding registers 592 store the output data for the DAC 594 between SIC services. The load strobes for these registers are generated by demultiplexer 596. SCODSS is used as the data input to demultiplexer 596, and W0 through W2 are used as the address input. There is a dedicated DAC 594 per AO channel.

During the AI test mode, the commanded test value is generated by a DAC on the subcontroller and sent to the AI multiplexer 590 via the AI test bus.

During AO test modes, the analog outputs of the DAC's 594 are connected to the ADC on the subcontroller via multiplexer 598 by the AO test bus. The word address selects the proper DAC output. Multiplexer 598 is enabled by mode flags B and C.

Some of the SIC's are hybrid and contain various combinations of interface signals. This type of SIC requires an I/O control section and quantities of storage and conversion circuitry necessary to generate or input the interface signals desired. The number of input or output words is restricted by space available and further constraints are placed on combination and addressing order by software.

While there have been described what are at present considered to be preferred embodiments of this invention, it will be obvious to those skilled in the art that various changes and modifications may be made therein without departure from the invention, and it is, therefore, intended to cover all such changes and modifications as fall within the true spirit and scope of the invention.

What we claim is:

1. A computer controlled data transmission system for use with a simulator complex which serially transmits digital information originally occuring in one of many forms, including discrete form, digital form and analog form, between data transmission circuitry and a multiplicity of widely spaced peripheral units, said system comprising:

controlling computer for monitoring input information in the form of digital data indicative of the operation of widely spaced peripheral units and for providing output information to control said operation, said output information including digital data for controlling the operation of said peripheral units, addressing digital data for identifying the peripheral unit to be controlled, and synchonizing digital data, said output information being determined in response to said input data and in accordance with an operational program contained in said computer;

reformating means connected between said controlling computer and said data transmission circuitry for transmitting parallel digital data in both directions between said controlling computer and data transmission circuitry, for reformating as necessary data transmitted from said controlling computer to said data transmission circuitry to a form acceptable to said data transmission circuitry, and for reformating as necessary data transmitted from said data transmission circuitry to said controlling computer to a form acceptable to said controlling computer; and data transmission circuitry comprising;

master control circuitry connected between said reformating means and peripheral control circuitry, said master control circuitry comprising, a buffer memory for temporary storage of information transmitted in either direction between said computer and said peripheral control circuitry, a storage memory for storing information relative to the format of information transmitted to and received from said peripheral controlled circuitry, means for converting parallel digital data from said computer means to serial digital data suitable for transmission to said peripheral control circuitry, means for converting serial digital data received from said peripheral control circuitry to parallel digital data for transmission to said controlling computer, and means for controlling the retrieval of information from and storage of information by said buffer and storage memories, peripheral control circuitry connected between said master control circuitry and said peripheral units, said peripheral control circuitry comprising means for determining which serial information transmitted from said master control circuitry is to be received by one of said widely spaced peripheral units, means for converting and conditioning serial information received from said master control circuitry to an electrical command signal in the form necessary for use by said peripheral units and means for converting and conditioning electrical information signals of various format received from said peripheral units to serial digital form for transmission to said master control circuitry, said electrical information signals containing information about the operation of said peripheral units, and primary communication path connecting said master control circuitry to said peripheral control circuitry and for carrying information in serial digital format.

2. The system of claim 1 wherein said primary communication path comprises a multiconductor cable containing no more than one each distinct transmission path for operational data from said peripheral control circuitry to said master control circuitry, for control data from said master control circuitry to said peripheral control circuitry, for addressing data from said master control circuitry to said peripheral control circuitry, and containing no more than one each distinct transmission path for each type of synchronizing data.

3. The system of claim 2 wherein said multiconductor cable is a single cable containing no more than seven distinct transmission paths.

4. The system of claim 1 wherein said peripheral control circuitry comprises a multiplicity of units, one each located adjacent to each of said peripheral units.

5. The system of claim 1 wherein said controlling computer operates said master control circuitry on a cyclic basis, said cyclic operation being such that said controlling computer first exchanges said input data and said output data with said master control circuitry and then directs said master control circuitry to exchange data with said peripheral control circuitry, during which exchange of data between said master control circuitry and said peripheral control circuitry said computer means generates new output data for a subsequent cycle.

6. The system of claim 5 wherein said data transmission circuitry further includes testing means for continually monitoring the accuracy of transmitted data and for providing diagnostic tests with respect to selected components in said data transmission circuitry for identifying improper operation of said components, and wherein a portion of said cycle is reserved for automatically testing said data transmission circuitry.

7. The system of claim 1 wherein said simulator complex is an aircraft simulator complex and said operational program contained in said computer means is the operational profile of an aircraft.

8. The system of claim 1 wherein said simulator complex is an aircraft simulator complex, said operational program contained in said computer means is the operational profile of an aircraft and at least one of the peripheral units is an instructor station.

9. The system of claim 8 wherein the remaining peripheral units includes at least one motion system and one trainee cockpit representative of the simulated aircraft.

10. The system of claim 8 wherein said remaining peripheral units includes a multiplicity of motion systems and corresponding trainee cockpits representative of the simulated aircraft, and further including means for selectively operating each of said peripheral units.

11. A computer controlled data transmission method for use with a simulator complex which serially transmits digital information originally occurring in one of many forms, including discrete forms, digital form and analog form, between data tranmission circuitry and a multiplicity of widely spaced peripheral units comprising the steps of:

providing output information to said data transmission circuitry from a controlling computer, said step of providing comprising the steps of generating synchronizing signals for controlling the time of data transmission, computing output data for controlling the operation of widely spaced peripheral units in response to an operational profile of one of said peripheral units stored in said controlling computer and input signals indicative of the current operation of said peripheral units, and generating addressing data for identifying the peripheral unit to be controlled;

processing in master control circuitry connected to said controlling computer data for transmission to peripheral control circuitry associated with each of said peripheral units and data received from said peripheral control circuitry for transmission to said controlling computer, said processing comprising the steps of storing information relative to the format of information transmitted to and received from peripheral control circuitry, converting parallel digital data received from said controlling computer to serial digital data suitable for transmission to said peripheral control circuitry, converting serial digital data received from said peripheral control circuitry to parallel digital data for transmission to said controlling computer, and temporarily storing in a buffer memory information transmitted between said computer and said peripheral control circuitry;

generating electrical information signals representative of the operation of said peripheral units;

processing in peripheral control circuitry connected between said master control circuitry and said peripheral units electrical information signals received from said peripheral units for transmission to said master control circuitry and data received from said master control circuitry for transmission to said peripheral units, said processing comprising the steps of converting and conditioning serial data received from said master control circuitry to electrical command signals in the form necessary for use by said peripheral units, and converting and conditioning electrical information signals of various format received from said peripheral units to serial digital form for transmission to said master control circuitry;

transmitting input data and output data in parallel form between said controlling computer and said master control circuitry when commanded by said controlling computer; and transmitting input data and output data in serial form between said master control circuitry and said peripheral control circuitry when commanded by said controlling computer.

12. The method of claim 11 wherein the step of transmitting data between master control circuitry and the peripheral control circuitry comprise the steps of transmitting operational data from said peripheral control circuitry to said master control circuitry, transmitting operational data from said master control circuitry to said peripheral control circuitry, transmitting addressing data from said master control circuitry to said peripheral control circuitry, and transmitting synchronizing signals between said master control circuitry and said peripheral control units, each of said transmission being on a distinct transmission path from the other.

13. The method of claim 11 wherein said steps of transmitting parallel data between said controlling computer system and said master control circuitry and transmitting serial data between said master control circuitry and said peripheral control circuitry occurs on a cyclic basis.

14. The method of claim 13 and further comprising the steps of continually monitoring the accuracy of transmitted data, providing diagnostic tests for selected components in said data transmission circuitry for identifying improper operation of said components, and reserving a portion of said cycle for automatically testing the accuracy of said data transmissions and the performance of said peripheral control circuitry.

15. The method of claim 11 wherein said step of computing is in response to the operational profile of an aircraft.

16. The method of claim 11 wherein said step of computing is in response to the operational profile of an aircraft and further comprising the step of providing an instructor station as one of said widespread peripheral units.

17. A computer controlled data transmission method for use with an aircraft simulator complex which serially transmitts digital information originally occuring in one of many forms, including discrete form, digital form and analog form, between data transmission circuitry and the widely spaced components of an aircraft simulation complex comprising the steps of:

providing output informaton to said data transmission circuitry from a controlling computer, said step of providing comprising the steps of generating synchronizing signals for controlling the time of data transmission, computing output data for controlling the operation of the widely spaced components of an aircraft simulator in response to an operational profile of said simulated aircraft stored in said controlling computer system and in response to input signals indicative of the current operation of said aircraft simulator, and generating addressing data for identifying the simulator component to be controlled;

processing in master control circuitry connected to said controlling computer data for transmission to peripheral control circuitry associated with each of said simulator components and data received from said peripheral control circuitry for transmission to said controlling computer, said processing comprising the steps of storing information relative to the format of information transmitted to and received from peripheral control circuitry, converting parallel digital data received from said controlling computer to serial digital data suitable for transmission to said peripheral control units, converting serial digital data received from said peripheral control circuitry to parallel digital data for transmission to said controlling computer, and temporarily storing in a buffer memory information transmitted between said computer and said peripheral control circuitry;

processing in peripheral control circuitry connected between said master control circuitry and said simulator components electrical information signals received from said simulator components for transmission to said master control circuitry and data received from said master control circuitry for transmission to said simulator components, said processing comprising the steps of converting and conditioning serial data received from said master control circuitry to electrical command signals in the form necessary for use by said simulator components, and converting and conditioning said electrical information signals of various format received from said simulator components to serial digital form for transmission to said master control circuitry;

transmitting input data and output data in parallel form between said controlling computer and said master control circuitry when commanded by said controlling computer;

transmitting input data and output data in serial form between said master control circuitry and said simulator components when commanded by said controlling computer, said transmission occurring one each on distinct transmission paths for operational data from said peripheral control circuitry to said master control circuitry, for operational data from said master control circuitry to said peripheral control circuitry for addressing data from said master control circuitry to said peripheral control circuitry, and for each type of synchronizing signal; and providing an instructor station as one of said simulator peripheral units for varying the operational profile and performance of said simulated aircraft.

18. A computer controlled data transmission system for use with an aircraft simulator complex which serially transmits digital information originally occuring in one of many forms, including discrete form, digital form and analog form, between data transmission circuitry and the widespread components making up a multiple aircraft simulation complex comprising:

controlling computer for monitoring input information in the form of digital data indicative of the operation of said aircraft simulator components and for providing output information to control said operation, said output information including digital data for controlling the operation of said simulator components, addressing digital data for identifying the simulator components to be controlled, and synchronizing digital data, said output information being determined in response to said input data and in accordance with an operational profile of said simulated aircraft contained in said computer;

reformating means connected between said controlling computer and data transmission circuitry for transmitting parallel digital data in both directions between said controlling computer and said data transmission circuitry, for reformating as necessary data transmitted from said controlling computer to said data transmission circuitry to a form acceptable to said data transmission circuitry, and for reformating as necessary data transmitted from said transmission circuitry to said controlling computer to a form acceptable to said controlling computer; and data transmission circuitry comprising:

master control circuitry connected between said controlling computer and peripheral control circuitry, said master control circuitry comprising a buffer memory for temporary storage of information transmitted between said computer and said peripheral control circuitry, a storage memory for storing information relative to the format of information transmitted to and received from said peripheral control circuitry, means for converting parallel digital data from said controlling computer to serial digital data suitable for tranmission to said peripheral control circuitry, means for converting serial digital data received from said peripheral control circuitry to parallel digital data for transmission to said controlling computer, and means for controlling the retrieval of information from and storage of information by said buffer and storage memories, said master control circuitry operating on a cyclic basis as directed by said controlling computer such that input data and output data are exchanged between said master control circuitry and said controlling computer after which data is exchanged between said master control circuitry and said peripheral control circuitry, during which exchange of data between said master control circuitry and said peripheral control circuitry said computer means generates new output data for a subsequent cycle, peripheral control circuitry connected between said master control circuitry and said simulator components, said peripheral control circuitry comprising means for converting and conditioning serial data received from said master control circuitry to an electrical command signal in the form necessary for use by said aircraft simulator components and means for converting and conditioning electrical information signals of various format received from said aircraft simulator components to serial digital form for transmission to said master control circuitry, said electrical informational signals containing information about the operation of said simulator components, and a primary communication path connecting said master control circuitry to each of said peripheral circuits, said primary communication path comprising a single multiconductor cable containing no more than one each distinct transmission path for operational data from said peripheral control circuitry to said master control circuitry, for control data from said master control circuitry to said peripheral control circuitry, for addressing data from said master control circuitry to said peripheral control circuitry, and containing no more than one each distinct transmission path for each type of sychronizing data.

* * * * *